(12) United States Patent
Kunori

(10) Patent No.: US 7,949,823 B2
(45) Date of Patent: *May 24, 2011

(54) MULTILEVEL STORAGE NONVOLATILE SEMICONDUCTOR MEMORY DEVICE ENABLING HIGH-SPEED DATA READING AND HIGH-SPEED DATA WRITING

(75) Inventor: Yuichi Kunori, Hyogo (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/697,852

(22) Filed: Feb. 1, 2010

(65) Prior Publication Data

US 2010/0135079 A1    Jun. 3, 2010

Related U.S. Application Data

(63) Continuation of application No. 12/243,309, filed on Oct. 1, 2008, now Pat. No. 7,685,357, which is a continuation of application No. 11/702,133, filed on Feb. 5, 2007, now Pat. No. 7,441,072, which is a continuation of application No. 11/414,363, filed on May 1, 2006, now Pat. No. 7,296,111, which is a continuation of application No. 09/469,497, filed on Dec. 22, 1999, now Pat. No. 7,117,295.

(30) Foreign Application Priority Data

Jun. 22, 1999    (JP) ..................... 11-176027

(51) Int. Cl.
*G06F 12/00*    (2006.01)

(52) U.S. Cl. ............... 711/103; 711/170; 365/189.08; 365/189.11; 365/189.12; 365/230.06; 365/230.08; 365/189.15; 365/189.16

(58) Field of Classification Search .............. 711/103, 711/170; 365/189.08, 189.11, 189.12, 230.06, 365/230.08, 189.15, 189.16

See application file for complete search history.

(56) References Cited

U.S. PATENT DOCUMENTS

| | | |
|---|---|---|
| 5,450,363 A | 9/1995 | Christopherson et al. |
| 5,627,784 A | 5/1997 | Roohparvar |
| 5,708,618 A | 1/1998 | Toda et al. |
| 5,737,276 A | 4/1998 | Shin et al. |
| 5,890,192 A | 3/1999 | Lee et al. |
| 5,892,724 A | 4/1999 | Hasegawa et al. |
| 5,903,495 A | 5/1999 | Takeuchi et al. |

(Continued)

FOREIGN PATENT DOCUMENTS

JP    3-184265    8/1991

(Continued)

OTHER PUBLICATIONS

Japanese Office Action issued in corresponding Japanese Patent Application No. JP 11-176027, dated Oct. 23, 2006.

(Continued)

*Primary Examiner* — Jasmine Song
(74) *Attorney, Agent, or Firm* — McDermott Will & Emery LLP

(57) ABSTRACT

A nonvolatile semiconductor memory device transmits/receives data to/from a data input/output terminal every j bits (e.g., eight bits). Each of memory cells in a memory cell array can hold data of n bits in correspondence to $2^n$ threshold levels. A write data conversion circuit generates write data from bit data input from the same data input/output terminal in a set of a plurality of data of j bits input at different timings.

2 Claims, 107 Drawing Sheets

U.S. PATENT DOCUMENTS

| | | |
|---|---|---|
| 5,978,311 A | 11/1999 | Wilford et al. |
| 6,055,188 A | 4/2000 | Takeuchi et al. |
| 6,073,208 A | 6/2000 | Norman |
| 6,154,393 A | 11/2000 | Otsuka et al. |
| 6,157,983 A | 12/2000 | Lee et al. |
| 6,160,739 A | 12/2000 | Wong |
| 6,166,950 A | 12/2000 | Yamada et al. |
| 6,256,702 B1 | 7/2001 | Yoneyama |
| 6,272,052 B1 | 8/2001 | Miyauchi |
| 6,272,586 B1 | 8/2001 | Roohparvar |
| 6,289,481 B1 | 9/2001 | Egawa |
| 6,366,156 B1 | 4/2002 | Narendra et al. |
| 6,493,273 B2 | 12/2002 | Katayama et al. |
| 6,556,068 B2 | 4/2003 | Forbes et al. |
| 6,571,311 B2 | 5/2003 | Kuwano |

FOREIGN PATENT DOCUMENTS

| | | |
|---|---|---|
| JP | 8-297982 A | 11/1996 |
| JP | 09-198873 | 7/1997 |
| JP | 9-198882 A | 7/1997 |
| JP | 9-251787 A | 9/1997 |
| JP | 9-297996 A | 11/1997 |
| JP | 10-3792 A | 1/1998 |
| JP | 10-11982 A | 1/1998 |
| JP | 10-027486 A | 1/1998 |
| JP | 10-092186 | 4/1998 |
| JP | 10-233096 A | 9/1998 |
| JP | 2844393 | 10/1998 |
| JP | 11-154394 | 6/1999 |
| JP | 11-176185 | 7/1999 |
| JP | 11-283386 A | 10/1999 |
| JP | 11-317086 A | 11/1999 |
| JP | 3105512 | 9/2000 |
| JP | 2000-339975 A | 12/2000 |
| JP | 2001-006375 | 1/2001 |
| JP | 2001-325796 A | 11/2001 |

OTHER PUBLICATIONS

Japanese Office Action, w/ English translation thereof, issued in Japanese Patent Application No. JP 2006-344665 dated Mar. 10, 2009.

Japanese Office Action, with English Translation, issued in Japanese Patent Application No. JP 2005-363281 dated Dec. 16, 2008.

Japanese Notice of Grounds of Rejection, w/ English translation thereof, issued in Japanese Patent Application No. JP 2007-147168 dated Nov. 4, 2009.

Japanese Notice of Grounds of Rejection, w/ English translation thereof, issued in Japanese Patent Application No. JP 2007-147169 dated Nov. 4, 2009.

Notice of grounds of Rejection with mail dated of Apr. 3, 2007.

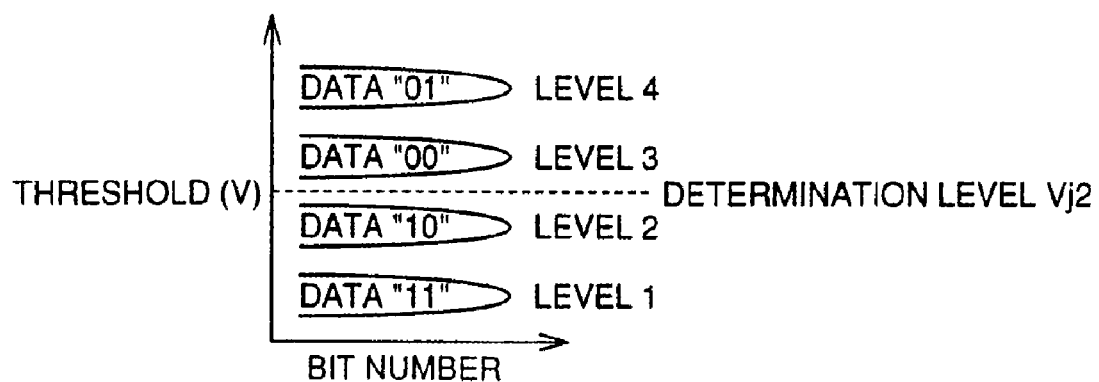

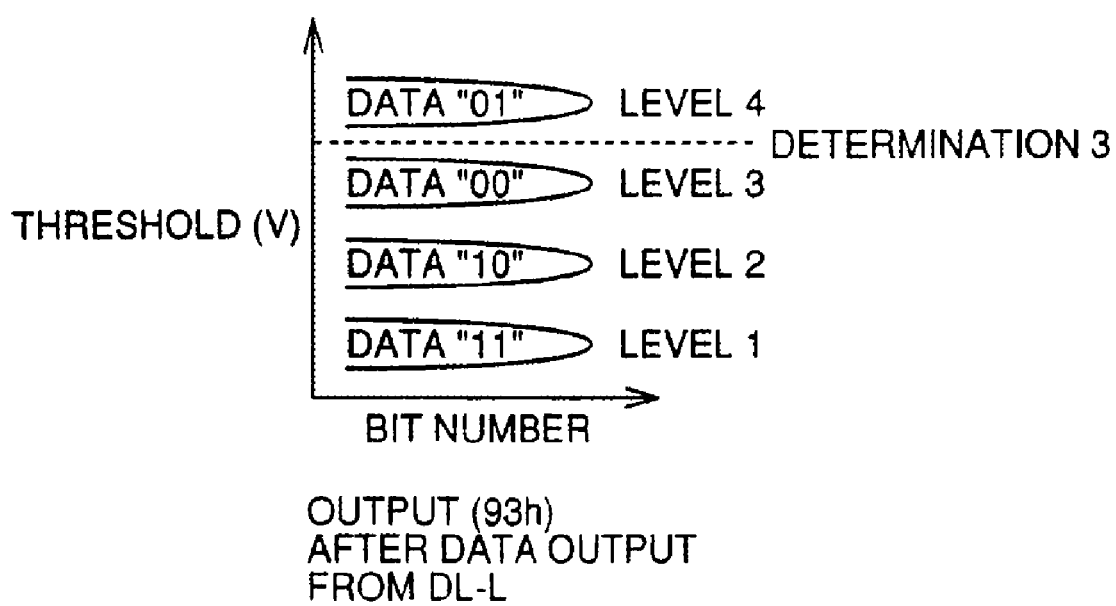

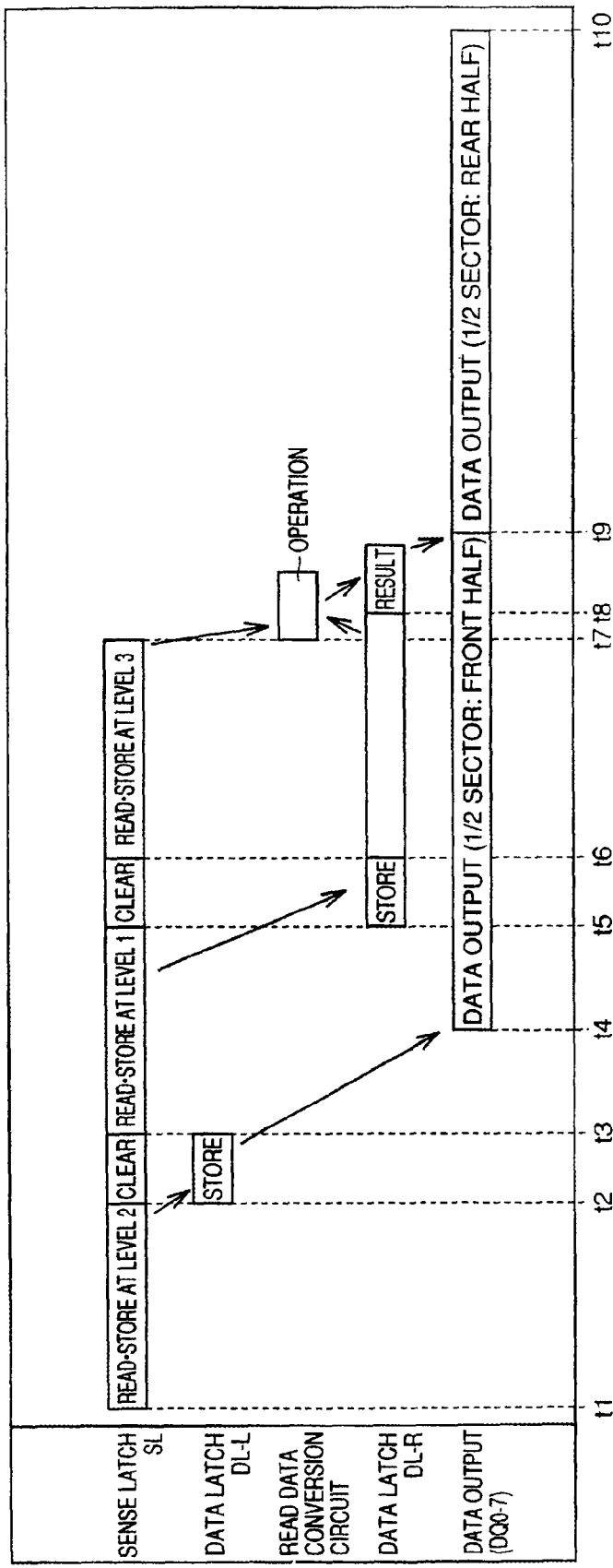

| DATA | | I/O DATA | | I/O DATA | |
|---|---|---|---|---|---|
| 1 | | 0 | 1 | 0 | 1 |
| 0 | → | 1 | 0 | 1 | 0 |
| 0 | | 2 | 0 | 2 | 0 |
| 1 | | 3 | 1 | 3 | 1 |
| 0 | | 4 | 0 | 4 | 0 |
| 0 | | 5 | 0 | 5 | 0 |
| 1 | | 6 | 1 | 6 | 1 |
| 1 | | 7 | 1 | 7 | 1 |
| SL | | DL-L | | DL-R | |

OUTPUT (C9h)

```
I/O DATA   I/O DATA          DATA
0 │ 1 │    0 │ 1 │           │ 1 │
1 │ 0 │    1 │ 1 │           │ 0 │
2 │ 0 │    2 │ 0 │ OPERATION │ 1 │
3 │ 1 │    3 │ 0 │    →      │ 1 │
4 │ 0 │    4 │ 1 │           │ 0 │
5 │ 0 │    5 │ 0 │           │ 1 │
6 │ 1 │    6 │ 0 │           │ 1 │
7 │ 1 │    7 │ 1 │           │ 1 │
  DL-L       DL-R             SL
           INPUT (93h)
```

I/O DATA
0: 1
1: 1
2: 0
3: 0
4: 1
5: 0
6: 0
7: 1

DL-L
INPUT (93h)

↔ OPERATION

DATA
1
0
0
1
0
0
1
1

SL
READ AT DETERMINATION 2

FIG.44

| | IN-CELL DATA | | I/O DATA | | I/O DATA | I/O DATA | I/O DATA |
|---|---|---|---|---|---|---|---|
| MC0 | "0111" | 0 | 0 | 0 | 0 | 0 | 0 |
| MC1 | "0110" | 0 | 1 | 0 | 1 | 1 | 1 |
| MC2 | "0100" | 0 | 2 | 0 | 2 | 2 | 2 |
| MC3 | "0101" | 0 | 3 | 0 | 3 | 3 | 3 |
| MC4 | "0001" | 0 | 4 | 0 | 4 | 4 | 4 |
| MC5 | "0000" | 0 | 5 | 0 | 5 | 5 | 5 |
| MC6 | "0010" | 0 | 6 | 0 | 6 | 6 | 6 |
| MC7 | "0011" | 0 | 7 | 0 | 7 | 7 | 7 |
| MC8 | "1011" | 1 | 0 | 1 | 0 | 0 | 0 |
| MC9 | "1010" | 1 | 1 | 1 | 1 | 1 | 1 |
| MC10 | "1000" | 1 | 2 | 1 | 2 | 2 | 2 |
| MC11 | "1001" | 1 | 3 | 1 | 3 | 3 | 3 |
| MC12 | "1101" | 1 | 4 | 1 | 4 | 4 | 4 |
| MC13 | "1100" | 1 | 5 | 1 | 5 | 5 | 5 |
| MC14 | "1110" | 1 | 6 | 1 | 6 | 6 | 6 |
| MC15 | "1111" | 1 | 7 | 1 | 7 | 7 | 7 |
| | | SL | | DL-1 | DL-2 | DL-3 | DL-4 |

OUTPUT
(00h-FFh)

FIG.46

| DATA | I/O DATA | | I/O DATA | | I/O DATA | | I/O DATA | |
|---|---|---|---|---|---|---|---|---|
| 0 |   | 0 | 0 | 0 | 0 | 0 |   | 0 |
| 0 | → | 1 | 0 | 1 | 0 | 1 |   | 1 |
| 0 | TO DL-2 | 2 | 0 | 2 | 0 | 2 |   | 2 |
| 0 |   | 3 | 0 | 3 | 0 | 3 |   | 3 |
| 0 |   | 4 | 0 | 4 | 0 | 4 |   | 4 |
| 0 |   | 5 | 0 | 5 | 0 | 5 |   | 5 |
| 0 |   | 6 | 0 | 6 | 0 | 6 |   | 6 |
| 0 |   | 7 | 0 | 7 | 0 | 7 |   | 7 |
| 0 |   | 0 | 1 | 0 | 0 | 0 |   | 0 |
| 0 |   | 1 | 1 | 1 | 0 | 1 |   | 1 |
| 0 |   | 2 | 1 | 2 | 0 | 2 |   | 2 |
| 0 |   | 3 | 1 | 3 | 0 | 3 |   | 3 |
| 1 |   | 4 | 1 | 4 | 1 | 4 |   | 4 |
| 1 |   | 5 | 1 | 5 | 1 | 5 |   | 5 |
| 1 |   | 6 | 1 | 6 | 1 | 6 |   | 6 |
| 1 |   | 7 | 1 | 7 | 1 | 7 |   | 7 |
| SL |   | DL-1 | | DL-2 | | DL-3 | | DL-4 |

OUTPUT
(00h-FFh)

FIG.48

| DATA | I/O DATA | | I/O DATA | | I/O DATA | I/O DATA |
|---|---|---|---|---|---|---|
| 0 | 0 | 0 | 0 | 0 | 0 | 0 |
| 0 | 1 | 0 | 1 | 0 | 1 | 1 |
| 0 | 2 | 0 | 2 | 0 | 2 | 2 |
| 0 | 3 | 0 | 3 | 0 | 3 | 3 |
| 1 | 4 | 0 | 4 | 1 | 4 | 4 |
| 1 | 5 | 0 | 5 | 1 | 5 | 5 |
| 1 | 6 | 0 | 6 | 1 | 6 | 6 |
| 1 | 7 | 0 | 7 | 1 | 7 | 7 |
| 1 | 0 | 1 | 0 | 1 | 0 | 0 |
| 1 | 1 | 1 | 1 | 1 | 1 | 1 |
| 1 | 2 | 1 | 2 | 1 | 2 | 2 |
| 1 | 3 | 1 | 3 | 1 | 3 | 3 |
| 1 | 4 | 1 | 4 | 0 | 4 | 4 |
| 1 | 5 | 1 | 5 | 0 | 5 | 5 |
| 1 | 6 | 1 | 6 | 0 | 6 | 6 |
| 1 | 7 | 1 | 7 | 0 | 7 | 7 |
| SL | DL-1 | | DL-2 | | DL-3 | DL-4 |

NOR WITH INVERTED DATA OF SL TO DL-2

DL-1 OUTPUT (00h-FFh)

DL-2 OUTPUT AFTER OUTPUT FROM DL-1 (0Fh-F0h)

FIG.50

| DATA | I/O DATA | | I/O DATA | | I/O DATA | | I/O DATA |
|---|---|---|---|---|---|---|---|
| 0 | 0 | 0 | 0 | 0 | 0 | 0 | 0 |
| 0 | 1 | 0 | 1 | 0 | 1 | 0 | 1 |
| 0 → TO DL-3 | 2 | 0 | 2 | 0 | 2 | 0 | 2 |
| 0 | 3 | 0 | 3 | 0 | 3 | 0 | 3 |
| 0 | 4 | 0 | 4 | 1 | 4 | 0 | 4 |
| 0 | 5 | 0 | 5 | 1 | 5 | 0 | 5 |
| 0 | 6 | 0 | 6 | 1 | 6 | 0 | 6 |
| 0 | 7 | 0 | 7 | 1 | 7 | 0 | 7 |
| 0 | 0 | 1 | 0 | 1 | 0 | 0 | 0 |
| 0 | 1 | 1 | 1 | 1 | 1 | 0 | 1 |
| 0 | 2 | 1 | 2 | 1 | 2 | 0 | 2 |
| 0 | 3 | 1 | 3 | 1 | 3 | 0 | 3 |
| 0 | 4 | 1 | 4 | 0 | 4 | 0 | 4 |
| 0 | 5 | 1 | 5 | 0 | 5 | 0 | 5 |
| 1 | 6 | 1 | 6 | 0 | 6 | 1 | 6 |
| 1 | 7 | 1 | 7 | 0 | 7 | 1 | 7 |
| SL | DL-1 | | DL-2 | | DL-3 | | DL-4 |
| | OUTPUT (00h-FFh) | | OUTPUT AFTER OUTPUT FROM DL-1 (0Fh-F0h) | | | | |

FIG.52

| DATA | I/O DATA | I/O DATA | I/O DATA | I/O DATA |
|---|---|---|---|---|
| 0 | 0 \| 0 | 0 \| 0 | 0 \| 0 | 0 |
| 0 | 1 \| 0 | 1 \| 0 | 1 \| 0 | 1 |
| 0 | 2 \| 0 | 2 \| 0 | 2 \| 0 | 2 |
| 0 | 3 \| 0 | 3 \| 0 | 3 \| 0 | 3 |
| 0 | 4 \| 0 | 4 \| 1 | 4 \| 0 | 4 |
| 0 | 5 \| 0 | 5 \| 1 | 5 \| 0 | 5 |
| 0 | 6 \| 0 | 6 \| 1 | 6 \| 0 | 6 |
| 0 | 7 \| 0 | 7 \| 1 | 7 \| 0 | 7 |
| 0 | 0 \| 1 | 0 \| 1 | 0 \| 0 | 0 |
| 0 | 1 \| 1 | 1 \| 1 | 1 \| 0 | 1 |
| 1 | 2 \| 1 | 2 \| 1 | 2 \| 1 | 2 |
| 1 | 3 \| 1 | 3 \| 1 | 3 \| 1 | 3 |
| 1 | 4 \| 1 | 4 \| 0 | 4 \| 1 | 4 |
| 1 | 5 \| 1 | 5 \| 0 | 5 \| 1 | 5 |
| 1 | 6 \| 1 | 6 \| 0 | 6 \| 0 | 6 |
| 1 | 7 \| 1 | 7 \| 0 | 7 \| 0 | 7 |
| SL | DL-1 | DL-2 | DL-3 | DL-4 |

NOR WITH INVERTED DATA OF SL TO DL-3

DL-1 OUTPUT (00h-FFh)

DL-2 OUTPUT AFTER OUTPUT FROM DL-1 (0Fh-F0h)

FIG.54

| DATA | I/O DATA | I/O DATA | I/O DATA | I/O DATA |
|---|---|---|---|---|
| 0 | 0 \| 0 | 0 \| 0 | 0 \| 0 | 0 \| 0 |
| 0 | 1 \| 0 | 1 \| 0 | 1 \| 0 | 1 \| 0 |
| 0 → TO DL 4 | 2 \| 0 | 2 \| 0 | 2 \| 0 | 2 \| 0 |
| 0 | 3 \| 0 | 3 \| 0 | 3 \| 0 | 3 \| 0 |
| 0 | 4 \| 0 | 4 \| 1 | 4 \| 0 | 4 \| 0 |
| 0 | 5 \| 0 | 5 \| 1 | 5 \| 0 | 5 \| 0 |
| 0 | 6 \| 0 | 6 \| 1 | 6 \| 0 | 6 \| 1 |
| 1 | 7 \| 0 | 7 \| 1 | 7 \| 0 | 7 \| 1 |
| 1 | 0 \| 1 | 0 \| 1 | 0 \| 0 | 0 \| 1 |
| 1 | 1 \| 1 | 1 \| 1 | 1 \| 0 | 1 \| 1 |
| 1 | 2 \| 1 | 2 \| 1 | 2 \| 1 | 2 \| 1 |
| 1 | 3 \| 1 | 3 \| 1 | 3 \| 1 | 3 \| 1 |
| 1 | 4 \| 1 | 4 \| 0 | 4 \| 1 | 4 \| 1 |
| 1 | 5 \| 1 | 5 \| 0 | 5 \| 1 | 5 \| 1 |
| 1 | 6 \| 1 | 6 \| 0 | 6 \| 0 | 6 \| 1 |
| 1 | 7 \| 1 | 7 \| 0 | 7 \| 0 | 7 \| 1 |

SL     DL-1    DL-2    DL-3    DL-4

OUTPUT (00h-FFh)

OUTPUT AFTER OUTPUT FROM DL-1 (0Fh-F0h)

FIG.56

| DATA | | I/O DATA | | I/O DATA | | I/O DATA | | I/O DATA | |
|---|---|---|---|---|---|---|---|---|---|
| 0 | | 0 | 0 | 0 | 0 | 0 | 0 | 0 | 0 |
| 0 | | 1 | 0 | 1 | 0 | 1 | 0 | 1 | 0 |
| 1 | NOR | 2 | 0 | 2 | 0 | 2 | 0 | 2 | 1 |
| 1 | INVERTED | 3 | 0 | 3 | 0 | 3 | 0 | 3 | 1 |
| 1 | DATA OF SL | 4 | 0 | 4 | 1 | 4 | 0 | 4 | 1 |
| 1 | AND DATA | 5 | 0 | 5 | 1 | 5 | 0 | 5 | 1 |
| 1 | OF DL-4 | 6 | 0 | 6 | 1 | 6 | 0 | 6 | 0 |
| 1 | TO DL-4 | 7 | 0 | 7 | 1 | 7 | 0 | 7 | 0 |
| 1 | | 0 | 1 | 0 | 1 | 0 | 0 | 0 | 0 |
| 1 | | 1 | 1 | 1 | 1 | 1 | 0 | 1 | 0 |
| 1 | | 2 | 1 | 2 | 1 | 2 | 1 | 2 | 0 |
| 1 | | 3 | 1 | 3 | 1 | 3 | 1 | 3 | 0 |
| 1 | | 4 | 1 | 4 | 0 | 4 | 1 | 4 | 0 |
| 1 | | 5 | 1 | 5 | 0 | 5 | 1 | 5 | 0 |
| 1 | | 6 | 1 | 6 | 0 | 6 | 0 | 6 | 0 |
| 1 | | 7 | 1 | 7 | 0 | 7 | 0 | 7 | 0 |
| SL | | DL-1 | | DL-2 | | DL-3 | | DL-4 | |

OUTPUT (00h-FFh)

OUTPUT AFTER OUTPUT FROM DL-1 (0Fh-F0h)

FIG.58

| DATA | I/O DATA | I/O DATA | I/O DATA | I/O DATA |
|---|---|---|---|---|
| | 0 \| 0 | 0 \| 0 | 0 \| 0 | 0 |
| | 1 \| 0 | 1 \| 0 | 1 \| 0 | 1 |
| | 2 \| 0 | 2 \| 0 | 2 \| 1 | 2 |
| | 3 \| 0 | 3 \| 0 | 3 \| 1 | 3 |
| | 4 \| 0 | 4 \| 1 | 4 \| 1 | 4 |
| | 5 \| 0 | 5 \| 1 | 5 \| 1 | 5 |
| | 6 \| 0 | 6 \| 1 | 6 \| 0 | 6 |
| | 7 \| 0 | 7 \| 1 | 7 \| 0 | 7 |
| | 0 \| 1 | 0 \| 1 | 0 \| 0 | 0 |
| | 1 \| 1 | 1 \| 1 | 1 \| 0 | 1 |
| | 2 \| 1 | 2 \| 1 | 2 \| 1 | 2 |
| | 3 \| 1 | 3 \| 1 | 3 \| 1 | 3 |
| | 4 \| 1 | 4 \| 0 | 4 \| 1 | 4 |
| | 5 \| 1 | 5 \| 0 | 5 \| 1 | 5 |
| | 6 \| 1 | 6 \| 0 | 6 \| 0 | 6 |
| | 7 \| 1 | 7 \| 0 | 7 \| 0 | 7 |
| SL | DL-1 | DL-2 | DL-3 | DL-4 |

OUTPUT (00h-FFh)

OUTPUT AFTER OUTPUT FROM DL-1 (0Fh-F0h)

OR DATA OF DL-3 AND DL-4 AND STORE RESULT IN DL-3

FIG.60

| DATA | I/O DATA | I/O DATA | I/O DATA | I/O DATA |
|------|----------|----------|----------|----------|
| 0 | 0 | 0   0 | 0   0 | 0   0 |
| 0 | 1 | 1   0 | 1   0 | 1   0 |
| 0 → TO DL-4 | 2 | 2   0 | 2   1 | 2   0 |
| 0 | 3 | 3   0 | 3   1 | 3   0 |
| 0 | 4 | 4   1 | 4   1 | 4   0 |
| 0 | 5 | 5   1 | 5   1 | 5   0 |
| 0 | 6 | 6   1 | 6   0 | 6   0 |
| 0 | 7 | 7   1 | 7   0 | 7   0 |
| 0 | 0 | 0   1 | 0   0 | 0   0 |
| 0 | 1 | 1   1 | 1   0 | 1   0 |
| 0 | 2 | 2   1 | 2   1 | 2   0 |
| 0 | 3 | 3   1 | 3   1 | 3   0 |
| 0 | 4 | 4   0 | 4   1 | 4   0 |
| 0 | 5 | 5   0 | 5   1 | 5   0 |
| 0 | 6 | 6   0 | 6   0 | 6   0 |
| 1 | 7 | 7   0 | 7   0 | 7   1 |
| SL | DL-1 | DL-2 | DL-3 | DL-4 |

OUTPUT (0Fh-F0h)

OUTPUT INVERTED DATA AFTER OUTPUT FROM DL-2 (3Ch-3Ch)

FIG.62

| DATA | I/O DATA | I/O DATA | I/O DATA | I/O DATA |
|---|---|---|---|---|
| 0 | 0 | 0 [ ] | 0 [0] | 0 [0] | 0 [0] |

Table representation:

| SL | DL-1 | DL-2 | DL-3 | DL-4 |
|---|---|---|---|---|
| 0 | 0: | 0: 0 | 0: 0 | 0: 0 |
| 0 | 1: | 1: 0 | 1: 0 | 1: 0 |
| 0 | 2: | 2: 0 | 2: 1 | 2: 0 |
| 0 | 3: | 3: 0 | 3: 1 | 3: 0 |
| 0 | 4: | 4: 1 | 4: 1 | 4: 0 |
| 0 | 5: | 5: 1 | 5: 1 | 5: 0 |
| 0 | 6: | 6: 1 | 6: 0 | 6: 0 |
| 0 | 7: | 7: 1 | 7: 0 | 7: 0 |
| 0 | 0: | 0: 1 | 0: 0 | 0: 0 |
| 0 | 1: | 1: 1 | 1: 0 | 1: 0 |
| 0 | 2: | 2: 1 | 2: 1 | 2: 0 |
| 0 | 3: | 3: 1 | 3: 1 | 3: 0 |
| 0 | 4: | 4: 0 | 4: 1 | 4: 0 |
| 1 | 5: | 5: 0 | 5: 1 | 5: 1 |
| 1 | 6: | 6: 0 | 6: 0 | 6: 1 |
| 1 | 7: | 7: 0 | 7: 0 | 7: 0 |

NOR INVERTED DATA OF SL AND DATA OF DL-4 TO DL-4

DL-2 OUTPUT (00h-FFh)

DL-3 OUTPUT INVERTED DATA AFTER OUTPUT FROM DL-2 (00h-FFh)

FIG.64

| DATA | I/O DATA | I/O DATA | I/O DATA | I/O DATA |
|---|---|---|---|---|
| 0 | 0 [0] | 0 [0] | 0 [0] | 0 [0] |
| 0 | 1 [0] | 1 [0] | 1 [0] | 1 [0] |
| 0 → TO DL-1 | 2 [0] | 2 [0] | 2 [1] | 2 [0] |
| 0 | 3 [0] | 3 [0] | 3 [1] | 3 [0] |
| 0 | 4 [0] | 4 [1] | 4 [1] | 4 [0] |
| 0 | 5 [0] | 5 [1] | 5 [1] | 5 [0] |
| 0 | 6 [0] | 6 [1] | 6 [0] | 6 [0] |
| 0 | 7 [0] | 7 [1] | 7 [0] | 7 [0] |
| 0 | 0 [0] | 0 [1] | 0 [0] | 0 [0] |
| 0 | 1 [0] | 1 [1] | 1 [0] | 1 [0] |
| 0 | 2 [0] | 2 [1] | 2 [1] | 2 [0] |
| 1 | 3 [1] | 3 [1] | 3 [1] | 3 [0] |
| 1 | 4 [1] | 4 [0] | 4 [1] | 4 [0] |
| 1 | 5 [1] | 5 [0] | 5 [1] | 5 [1] |
| 1 | 6 [1] | 6 [0] | 6 [0] | 6 [1] |
| 1 | 7 [1] | 7 [0] | 7 [0] | 7 [0] |
| SL | DL-1 | DL-2 | DL-3 | DL-4 |

OUTPUT (0Fh-F0h)

OUTPUT INVERTED DATA AFTER OUTPUT FROM DL-2 (3Ch-3Ch)

FIG.66

| DATA | I/O DATA | I/O DATA | I/O DATA | I/O DATA |
|---|---|---|---|---|
| 0 | 0 : 0 | 0 : 0 | 0 : 0 | 0 : 0 |
| 0 | 1 : 0 | 1 : 0 | 1 : 0 | 1 : 0 |
| 0 → NOR | 2 : 0 | 2 : 0 | 2 : 1 | 2 : 0 |
| 0  INVERTED | 3 : 0 | 3 : 0 | 3 : 1 | 3 : 0 |
| 0  DATA OF SL | 4 : 0 | 4 : 1 | 4 : 1 | 4 : 0 |
| 0  AND DATA | 5 : 0 | 5 : 1 | 5 : 1 | 5 : 0 |
| 0  OF DL-1 | 6 : 0 | 6 : 1 | 6 : 0 | 6 : 0 |
| 0  TO DL-1 | 7 : 0 | 7 : 1 | 7 : 0 | 7 : 0 |
| 0 | 0 : 0 | 0 : 1 | 0 : 0 | 0 : 0 |
| 1 | 1 : 1 | 1 : 1 | 1 : 0 | 1 : 0 |
| 1 | 2 : 1 | 2 : 1 | 2 : 1 | 2 : 0 |
| 1 | 3 : 0 | 3 : 1 | 3 : 1 | 3 : 0 |
| 1 | 4 : 0 | 4 : 0 | 4 : 1 | 4 : 0 |
| 1 | 5 : 0 | 5 : 0 | 5 : 1 | 5 : 1 |
| 1 | 6 : 0 | 6 : 0 | 6 : 0 | 6 : 1 |
| 1 | 7 : 0 | 7 : 0 | 7 : 0 | 7 : 0 |
| SL | DL-1 | DL-2 | DL-3 | DL-4 |

DL-2 OUTPUT (00h-FFh)

DL-3 OUTPUT INVERTED DATA AFTER OUTPUT FROM DL-2 (00h-FFh)

FIG.68

| DATA | I/O DATA | I/O DATA | I/O DATA | I/O DATA OR DATA OF DL-1 AND DL-4 TO DL-4 |
|---|---|---|---|---|
| | 0 \| 0 | 0 \| 0 | 0 \| 0 | 0 \| 0 |
| | 1 \| 0 | 1 \| 0 | 1 \| 0 | 1 \| 0 |
| | 2 \| 0 | 2 \| 0 | 2 \| 1 | 2 \| 0 |
| | 3 \| 0 | 3 \| 0 | 3 \| 1 | 3 \| 0 |
| | 4 \| 0 | 4 \| 1 | 4 \| 1 | 4 \| 0 |
| | 5 \| 0 | 5 \| 1 | 5 \| 1 | 5 \| 0 |
| | 6 \| 0 | 6 \| 1 | 6 \| 0 | 6 \| 0 |
| | 7 \| 0 | 7 \| 1 | 7 \| 0 | 7 \| 0 |
| | 0 \| 0 | 0 \| 1 | 0 \| 0 | 0 \| 0 |
| | 1 \| 1 | 1 \| 1 | 1 \| 0 | 1 \| 1 |
| | 2 \| 1 | 2 \| 1 | 2 \| 1 | 2 \| 1 |
| | 3 \| 0 | 3 \| 1 | 3 \| 1 | 3 \| 0 |
| | 4 \| 0 | 4 \| 0 | 4 \| 1 | 4 \| 0 |
| | 5 \| 0 | 5 \| 0 | 5 \| 1 | 5 \| 1 |
| | 6 \| 0 | 6 \| 0 | 6 \| 0 | 6 \| 1 |
| | 7 \| 0 | 7 \| 0 | 7 \| 0 | 7 \| 0 |
| SL | DL-1 | DL-2 OUTPUT (0Fh-F0h) | DL-3 OUTPUT INVERTED DATA AFTER OUTPUT FROM DL-2 (3Ch-3Ch) | DL-4 |

FIG.70

| DATA | I/O DATA | I/O DATA | I/O DATA | I/O DATA |
|---|---|---|---|---|
| 0 | 0: 0 | 0: 0 | 0: 0 | 0: 0 |
| 0 | 1: 0 | 1: 0 | 1: 0 | 1: 0 |
| 0 | 2: 0 | 2: 0 | 2: 1 | 2: 0 |
| 0 | 3: 0 | 3: 0 | 3: 1 | 3: 0 |
| 0 | 4: 0 | 4: 1 | 4: 1 | 4: 0 |
| 0 | 5: 0 | 5: 1 | 5: 1 | 5: 0 |
| 0 | 6: 0 | 6: 1 | 6: 0 | 6: 0 |
| 1 | 7: 1 | 7: 1 | 7: 0 | 7: 0 |
| 1 | 0: 1 | 0: 1 | 0: 0 | 0: 0 |
| 1 | 1: 1 | 1: 1 | 1: 0 | 1: 1 |
| 1 | 2: 1 | 2: 1 | 2: 1 | 2: 1 |
| 1 | 3: 1 | 3: 1 | 3: 1 | 3: 0 |
| 1 | 4: 1 | 4: 0 | 4: 1 | 4: 0 |
| 1 | 5: 1 | 5: 0 | 5: 1 | 5: 1 |
| 1 | 6: 1 | 6: 0 | 6: 0 | 6: 1 |
| 1 | 7: 1 | 7: 0 | 7: 0 | 7: 0 |
| SL | DL-1 | DL-2 | DL-3 | DL-4 |

TO DL-1

OUTPUT (00h-FFh)

OUTPUT INVERTED DATA AFTER OUTPUT FROM DL-2 (00h-FFh)

FIG.72

| DATA | | I/O DATA | I/O DATA | I/O DATA | I/O DATA |
|---|---|---|---|---|---|
| 0 | | 0 \| 0 | 0 \| 0 | 0 \| 0 | 0 \| 0 |
| 0 | | 1 \| 0 | 1 \| 0 | 1 \| 0 | 1 \| 0 |
| 0 | NOR | 2 \| 0 | 2 \| 0 | 2 \| 1 | 2 \| 0 |
| 0 | INVERTED | 3 \| 0 | 3 \| 0 | 3 \| 1 | 3 \| 0 |
| 0 | DATA OF SL | 4 \| 0 | 4 \| 1 | 4 \| 1 | 4 \| 0 |
| 0 | AND DATA | 5 \| 1 | 5 \| 1 | 5 \| 1 | 5 \| 0 |
| 1 | OF DL-1 | 6 \| 1 | 6 \| 1 | 6 \| 0 | 6 \| 0 |
| 1 | TO DL-1 | 7 \| 0 | 7 \| 1 | 7 \| 0 | 7 \| 0 |
| 1 | | 0 \| 0 | 0 \| 1 | 0 \| 0 | 0 \| 0 |
| 1 | | 1 \| 0 | 1 \| 1 | 1 \| 0 | 1 \| 1 |
| 1 | | 2 \| 0 | 2 \| 1 | 2 \| 1 | 2 \| 1 |
| 1 | | 3 \| 0 | 3 \| 1 | 3 \| 1 | 3 \| 0 |
| 1 | | 4 \| 0 | 4 \| 0 | 4 \| 1 | 4 \| 0 |
| 1 | | 5 \| 0 | 5 \| 0 | 5 \| 1 | 5 \| 1 |
| 1 | | 6 \| 0 | 6 \| 0 | 6 \| 0 | 6 \| 1 |
| 1 | | 7 \| 0 | 7 \| 0 | 7 \| 0 | 7 \| 0 |
| SL | | DL-1 | DL-2 | DL-3 | DL-4 |

DL-2: OUTPUT (00h-FFh)

DL-3: OUTPUT INVERTED DATA AFTER OUTPUT FROM DL-2 (00h-FFh)

FIG.74

OR DATA OF DL-1 AND DL-4
TO DL-4

| DATA | I/O DATA | | I/O DATA | | I/O DATA | | I/O DATA | |
|---|---|---|---|---|---|---|---|---|
| | 0 | 0 | 0 | 0 | 0 | 0 | 0 | 0 |
| | 1 | 0 | 1 | 0 | 1 | 0 | 1 | 0 |
| | 2 | 0 | 2 | 0 | 2 | 1 | 2 | 0 |
| | 3 | 0 | 3 | 0 | 3 | 1 | 3 | 0 |
| | 4 | 0 | 4 | 1 | 4 | 1 | 4 | 0 |
| | 5 | 1 | 5 | 1 | 5 | 1 | 5 | 1 |
| | 6 | 1 | 6 | 1 | 6 | 0 | 6 | 1 |
| | 7 | 0 | 7 | 1 | 7 | 0 | 7 | 0 |
| | 0 | 0 | 0 | 1 | 0 | 0 | 0 | 0 |
| | 1 | 0 | 1 | 1 | 1 | 0 | 1 | 1 |
| | 2 | 0 | 2 | 1 | 2 | 1 | 2 | 1 |
| | 3 | 0 | 3 | 1 | 3 | 1 | 3 | 0 |
| | 4 | 0 | 4 | 0 | 4 | 1 | 4 | 0 |
| | 5 | 0 | 5 | 0 | 5 | 1 | 5 | 1 |
| | 6 | 0 | 6 | 0 | 6 | 0 | 6 | 1 |
| | 7 | 0 | 7 | 0 | 7 | 0 | 7 | 0 |
| SL | DL-1 | | DL-2 | | DL-3 | | DL-4 | |

DL-2 OUTPUT (0Fh-F0h)

DL-3 OUTPUT INVERTED DATA AFTER OUTPUT FROM DL-2 (3Ch-3Ch)

FIG.76

| DATA | I/O DATA DL-1 | I/O DATA DL-2 | I/O DATA DL-3 | I/O DATA DL-4 |
|---|---|---|---|---|
| 0 | 0: 0 | 0: 0 | 0: 0 | 0: 0 |
| 0 | 1: 0 | 1: 0 | 1: 0 | 1: 0 |
| 0 →TO DL-1 | 2: 0 | 2: 0 | 2: 1 | 2: 0 |
| 1 | 3: 1 | 3: 0 | 3: 1 | 3: 0 |
| 1 | 4: 1 | 4: 1 | 4: 1 | 4: 0 |
| 1 | 5: 1 | 5: 1 | 5: 1 | 5: 1 |
| 1 | 6: 1 | 6: 1 | 6: 0 | 6: 1 |
| 1 | 7: 1 | 7: 1 | 7: 0 | 7: 0 |
| 1 | 0: 1 | 0: 1 | 0: 0 | 0: 0 |
| 1 | 1: 1 | 1: 1 | 1: 0 | 1: 1 |
| 1 | 2: 1 | 2: 1 | 2: 1 | 2: 1 |
| 1 | 3: 1 | 3: 1 | 3: 1 | 3: 0 |
| 1 | 4: 1 | 4: 0 | 4: 1 | 4: 0 |
| 1 | 5: 1 | 5: 0 | 5: 1 | 5: 1 |
| 1 | 6: 1 | 6: 0 | 6: 0 | 6: 1 |
| 1 | 7: 1 | 7: 0 | 7: 0 | 7: 0 |
| SL | DL-1 | DL-2 OUTPUT (00h-FFh) | DL-3 OUTPUT INVERTED DATA AFTER OUTPUT FROM DL-2 (00h-FFh) | DL-4 |

FIG.78

| DATA | | OR DATA OF DL-1 AND DL-4 TO DL-4 | | | |
|---|---|---|---|---|---|
| | | I/O DATA | I/O DATA | I/O DATA | I/O DATA |
| 0 | → NOR INVERTED DATA OF SL AND DATA OF DL-1 TO DL-1 | 0  0 | 0  0 | 0  0 | 0  0 |
| 1 | | 1  1 | 1  0 | 1  0 | 1  0 |
| 1 | | 2  1 | 2  0 | 2  1 | 2  0 |
| 1 | | 3  0 | 3  0 | 3  1 | 3  0 |
| 1 | | 4  0 | 4  1 | 4  1 | 4  0 |
| 1 | | 5  0 | 5  1 | 5  1 | 5  1 |
| 1 | | 6  0 | 6  1 | 6  0 | 6  1 |
| 1 | | 7  0 | 7  1 | 7  0 | 7  0 |
| 1 | | 0  0 | 0  1 | 0  0 | 0  0 |
| 1 | | 1  0 | 1  1 | 1  0 | 1  1 |
| 1 | | 2  0 | 2  1 | 2  1 | 2  1 |
| 1 | | 3  0 | 3  1 | 3  1 | 3  0 |
| 1 | | 4  0 | 4  0 | 4  1 | 4  0 |
| 1 | | 5  0 | 5  0 | 5  1 | 5  1 |
| 1 | | 6  0 | 6  0 | 6  0 | 6  1 |
| 1 | | 7  0 | 7  0 | 7  0 | 7  0 |
| SL | | DL-1 | DL-2 | DL-3 | DL-4 |

OUTPUT (0Fh-F0h)

OUTPUT INVERTED DATA AFTER OUTPUT FROM DL-2 (3Ch-3Ch)

FIG.80

OR DATA OF DL-1 AND DL-4 TO DL-4

| DATA | I/O DATA | I/O DATA | I/O DATA | I/O DATA |
|---|---|---|---|---|
| | 0 \| 0 | 0 \| 0 | 0 \| 0 | 0 \| 0 |
| | 1 \| 1 | 1 \| 0 | 1 \| 0 | 1 \| 1 |
| | 2 \| 1 | 2 \| 0 | 2 \| 1 | 2 \| 1 |
| | 3 \| 0 | 3 \| 0 | 3 \| 1 | 3 \| 0 |
| | 4 \| 0 | 4 \| 1 | 4 \| 1 | 4 \| 0 |
| | 5 \| 0 | 5 \| 1 | 5 \| 1 | 5 \| 1 |
| | 6 \| 0 | 6 \| 1 | 6 \| 0 | 6 \| 1 |
| | 7 \| 0 | 7 \| 1 | 7 \| 0 | 7 \| 0 |
| | 0 \| 0 | 0 \| 1 | 0 \| 0 | 0 \| 0 |
| | 1 \| 0 | 1 \| 1 | 1 \| 0 | 1 \| 1 |
| | 2 \| 0 | 2 \| 1 | 2 \| 1 | 2 \| 1 |
| | 3 \| 0 | 3 \| 1 | 3 \| 1 | 3 \| 0 |
| | 4 \| 0 | 4 \| 0 | 4 \| 1 | 4 \| 0 |
| | 5 \| 0 | 5 \| 0 | 5 \| 1 | 5 \| 1 |
| | 6 \| 0 | 6 \| 0 | 6 \| 0 | 6 \| 1 |
| | 7 \| 0 | 7 \| 0 | 7 \| 0 | 7 \| 0 |
| SL | DL-1 | DL-2 | DL-3 | DL-4 |

→ OR DATA OF DL-1 AND DL-4 TO DL-4

OUTPUT (0Fh-F0h)

OUTPUT INVERTED DATA AFTER OUTPUT FROM DL-2 (3Ch-3Ch)

FIG.90

| | I/O DATA | | I/O DATA | | I/O DATA | | | DATA | |
|---|---|---|---|---|---|---|---|---|---|
| 0 | | 0 | 1 | 0 | 1 | | | 1 | 0 |
| 1 | | 1 | 1 | 1 | 1 | → | | 1 | 0 |
| 2 | | 2 | 1 | 2 | 0 | OPERATE DATA | | 1 | 0 |
| 3 | | 3 | 1 | 3 | 0 | OF SL AND DL-2 | | 1 | 0 |
| 4 | | 4 | 0 | 4 | 0 | | | 1 | 1 |
| 5 | | 5 | 0 | 5 | 0 | | | 1 | 1 |
| 6 | | 6 | 0 | 6 | 1 | | | 1 | 1 |
| 7 | | 7 | 0 | 7 | 1 | | | 1 | 1 |
| 0 | | 0 | 0 | 0 | 1 | | | 0 | 1 |
| 1 | | 1 | 0 | 1 | 1 | | | 0 | 1 |
| 2 | | 2 | 0 | 2 | 0 | | | 0 | 1 |
| 3 | | 3 | 0 | 3 | 0 | | | 0 | 1 |
| 4 | | 4 | 1 | 4 | 0 | | | 1 | 1 |
| 5 | | 5 | 1 | 5 | 0 | | | 1 | 1 |
| 6 | | 6 | 1 | 6 | 1 | | | 1 | 1 |
| 7 | | 7 | 1 | 7 | 1 | | | 1 | 1 |
| | DL-1 | | DL-2 | | DL-3 INPUT | | | SL LEVEL 5 | LEVEL 13 |

FIG.92

| I/O DATA | I/O DATA | I/O DATA | | DATA |
|---|---|---|---|---|
| 0 1 | 0 1 | 0 1 | | 0 |
| 1 1 | 1 0 | 1 1 | | 0 |
| 2 1 | 2 0 | 2 0 | INVERTED DATA | 0 |
| 3 1 | 3 1 | 3 0 | OF SL TO DL-1 | 0 |
| 4 1 | 4 1 | 4 0 | | 0 |
| 5 1 | 5 0 | 5 0 | | 0 |
| 6 1 | 6 0 | 6 1 | | 0 |
| 7 1 | 7 1 | 7 1 | | 0 |
| 0 0 | 0 1 | 0 1 | | 1 |
| 1 0 | 1 0 | 1 1 | | 1 |
| 2 0 | 2 0 | 2 0 | | 1 |
| 3 0 | 3 1 | 3 0 | | 1 |
| 4 0 | 4 1 | 4 0 | | 1 |
| 5 0 | 5 0 | 5 0 | | 1 |
| 6 0 | 6 0 | 6 1 | | 1 |
| 7 0 | 7 1 | 7 1 | | 1 |
| DL-1 | DL-2 | DL-3 | | SL |
| | INPUT | | | READ AT DETERMINATION 8 |

FIG.94

| I/O DATA | I/O DATA | I/O DATA | | DATA |
|---|---|---|---|---|
| 0 [1] | 0 [1] | 0 [1] | | 0 [0] |
| 1 [1] | 1 [0] | 1 [1] | ↔ | 1 [0] |
| 2 [1] | 2 [0] | 2 [0] | OR DATA OF SL | 2 [0] |
| 3 [1] | 3 [1] | 3 [0] | AND DL-1 AND | 3 [0] |
| 4 [1] | 4 [1] | 4 [0] | STORE RESULT | 4 [0] |
| 5 [1] | 5 [0] | 5 [0] | IN DL-1 | 5 [0] |
| 6 [1] | 6 [0] | 6 [1] | | 6 [0] |
| 7 [1] | 7 [1] | 7 [1] | | 7 [0] |
| 0 [0] | 0 [1] | 0 [1] | | 0 [0] |
| 1 [0] | 1 [0] | 1 [1] | | 1 [0] |
| 2 [0] | 2 [0] | 2 [0] | | 2 [0] |
| 3 [0] | 3 [1] | 3 [0] | | 3 [0] |
| 4 [1] | 4 [1] | 4 [0] | | 4 [1] |
| 5 [1] | 5 [0] | 5 [0] | | 5 [1] |
| 6 [1] | 6 [0] | 6 [1] | | 6 [1] |
| 7 [1] | 7 [1] | 7 [1] | | 7 [1] |
| DL-1 | DL-2 | DL-3 | | SL |
| | INPUT | | | READ AT DETERMINATION 4 |

FIG.96

| | I/O DATA | | I/O DATA | | I/O DATA | | | DATA |
|---|---|---|---|---|---|---|---|---|
| 0 | 1 | 0 | 1 | 0 | 1 | | | 1 |
| 1 | 1 | 1 | 0 | 1 | 1 | | | 1 |
| 2 | 1 | 2 | 0 | 2 | 0 | ↔ OPERATE DATA | | 1 |
| 3 | 1 | 3 | 1 | 3 | 0 | OF SL AND DL-3 | | 1 |
| 4 | 1 | 4 | 1 | 4 | 0 | | | 1 |
| 5 | 1 | 5 | 0 | 5 | 0 | | | 1 |
| 6 | 1 | 6 | 0 | 6 | 1 | | | 1 |
| 7 | 1 | 7 | 1 | 7 | 1 | | | 1 |
| 0 | 0 | 0 | 1 | 0 | 1 | | | 1 |
| 1 | 0 | 1 | 0 | 1 | 1 | | | 1 |
| 2 | 0 | 2 | 0 | 2 | 0 | | | 1 |
| 3 | 0 | 3 | 1 | 3 | 0 | | | 1 |
| 4 | 1 | 4 | 1 | 4 | 0 | | | 0 |
| 5 | 1 | 5 | 0 | 5 | 0 | | | 0 |
| 6 | 1 | 6 | 0 | 6 | 1 | | | 1 |
| 7 | 1 | 7 | 1 | 7 | 1 | | | 1 |
| | DL-1 | | DL-2 | | DL-3 | | | SL |
| | | | INPUT | | | | | WRITE LEVEL 3 |

FIG.98

| I/O | DATA<br>DL-1 | I/O | DATA<br>DL-2 | I/O | DATA<br>DL-3 | | DATA<br>SL |
|---|---|---|---|---|---|---|---|
| 0 | 1 | 0 | 1 | 0 | 1 | | 1 |
| 1 | 1 | 1 | 0 | 1 | 1 | ↔ | 1 |
| 2 | 1 | 2 | 0 | 2 | 0 | OPERATE DATA | 1 |
| 3 | 1 | 3 | 1 | 3 | 0 | OF DL-1 AND | 1 |
| 4 | 1 | 4 | 1 | 4 | 0 | DL-3 | 1 |
| 5 | 1 | 5 | 0 | 5 | 0 | TO SL | 1 |
| 6 | 1 | 6 | 0 | 6 | 1 | | 1 |
| 7 | 1 | 7 | 1 | 7 | 1 | | 1 |
| 0 | 0 | 0 | 1 | 0 | 1 | | 0 |
| 1 | 0 | 1 | 0 | 1 | 1 | | 0 |
| 2 | 0 | 2 | 0 | 2 | 0 | | 1 |
| 3 | 0 | 3 | 1 | 3 | 0 | | 1 |
| 4 | 1 | 4 | 1 | 4 | 0 | | 1 |
| 5 | 1 | 5 | 0 | 5 | 0 | | 1 |
| 6 | 1 | 6 | 0 | 6 | 1 | | 1 |
| 7 | 1 | 7 | 1 | 7 | 1 | | 1 |

DL-1   DL-2   DL-3         SL
       INPUT            WRITE LEVEL 7

FIG.100

| I/O DATA | I/O DATA | I/O DATA | | DATA |
|---|---|---|---|---|
| 0: 0 | 0: 1 | 0: 1 | | 0 |
| 1: 0 | 1: 0 | 1: 1 | | 0 |
| 2: 0 | 2: 0 | 2: 0 | TRANSFER | 0 |
| 3: 0 | 3: 1 | 3: 0 | FROM SL | 0 |
| 4: 0 | 4: 1 | 4: 0 | TO DL-1 | 0 |
| 5: 0 | 5: 0 | 5: 0 | | 0 |
| 6: 0 | 6: 0 | 6: 1 | | 0 |
| 7: 0 | 7: 1 | 7: 1 | | 0 |
| 0: 1 | 0: 1 | 0: 1 | | 1 |
| 1: 1 | 1: 0 | 1: 1 | | 1 |
| 2: 1 | 2: 0 | 2: 0 | | 1 |
| 3: 1 | 3: 1 | 3: 0 | | 1 |
| 4: 1 | 4: 1 | 4: 0 | | 1 |
| 5: 1 | 5: 0 | 5: 0 | | 1 |
| 6: 1 | 6: 0 | 6: 1 | | 1 |
| 7: 1 | 7: 1 | 7: 1 | | 1 |
| DL-1 | DL-2 | DL-3 | | SL |
| | INPUT | | | READ AT DETERMINATION 8 |

FIG.102

| | I/O DATA | | I/O DATA | | I/O DATA | | | DATA |
|---|---|---|---|---|---|---|---|---|
| 0 | 1 | 0 | 1 | 0 | 1 | | | 0 |
| 1 | 1 | 1 | 0 | 1 | 1 | | | 0 |
| 2 | 1 | 2 | 0 | 2 | 0 | ↔ OR INVERTED | | 0 |
| 3 | 1 | 3 | 1 | 3 | 0 | DATA OF SL | | 0 |
| 4 | 0 | 4 | 1 | 4 | 0 | AND DATA OF | | 1 |
| 5 | 0 | 5 | 0 | 5 | 0 | DL-1 AND | | 1 |
| 6 | 0 | 6 | 0 | 6 | 1 | STORE RESULT | | 1 |
| 7 | 0 | 7 | 1 | 7 | 1 | IN DL-1 | | 1 |
| 0 | 1 | 0 | 1 | 0 | 1 | | | 1 |
| 1 | 1 | 1 | 0 | 1 | 1 | | | 1 |
| 2 | 1 | 2 | 0 | 2 | 0 | | | 1 |
| 3 | 1 | 3 | 1 | 3 | 0 | | | 1 |
| 4 | 1 | 4 | 1 | 4 | 0 | | | 1 |
| 5 | 1 | 5 | 0 | 5 | 0 | | | 1 |
| 6 | 1 | 6 | 0 | 6 | 1 | | | 1 |
| 7 | 1 | 7 | 1 | 7 | 1 | | | 1 |

DL-1    DL-2    DL-3                                SL
        INPUT                              READ AT
                                           DETERMINATION 12

FIG.104

| | I/O DATA | | I/O DATA | | I/O DATA | | | DATA |
|---|---|---|---|---|---|---|---|---|
| 0 | 1 | 0 | 1 | 0 | 1 | | | 1 |
| 1 | 1 | 1 | 0 | 1 | 1 | ↔ | | 1 |
| 2 | 1 | 2 | 0 | 2 | 0 | OPERATE DATA | | 1 |
| 3 | 1 | 3 | 1 | 3 | 0 | OF DL-1 AND | | 1 |
| 4 | 0 | 4 | 1 | 4 | 0 | DL-3 | | 0 |
| 5 | 0 | 5 | 0 | 5 | 0 | TO SL | | 0 |
| 6 | 0 | 6 | 0 | 6 | 1 | | | 1 |
| 7 | 0 | 7 | 1 | 7 | 1 | | | 1 |
| 0 | 1 | 0 | 1 | 0 | 1 | | | 1 |
| 1 | 1 | 1 | 0 | 1 | 1 | | | 1 |
| 2 | 1 | 2 | 0 | 2 | 0 | | | 1 |
| 3 | 1 | 3 | 1 | 3 | 0 | | | 1 |
| 4 | 1 | 4 | 1 | 4 | 0 | | | 1 |
| 5 | 1 | 5 | 0 | 5 | 0 | | | 1 |
| 6 | 1 | 6 | 0 | 6 | 1 | | | 1 |
| 7 | 1 | 7 | 1 | 7 | 1 | | | 1 |

DL-1     DL-2     DL-3                                    SL
         INPUT                                  WRITE LEVEL 11

FIG.106

| | DL-1 | | DL-2 | | DL-3 | | SL |
|---|---|---|---|---|---|---|---|
| I/O DATA | | I/O DATA | | I/O DATA | | | DATA |
| 0 | 1 | 0 | 1 | 0 | 1 | | 0 |
| 1 | 1 | 1 | 0 | 1 | 1 | | 0 |
| 2 | 1 | 2 | 0 | 2 | 0 | OPERATE DATA | 0 |
| 3 | 1 | 3 | 1 | 3 | 0 | OF DL-1 AND | 0 |
| 4 | 0 | 4 | 1 | 4 | 0 | DL-3 | 1 |
| 5 | 0 | 5 | 0 | 5 | 0 | TO SL | 1 |
| 6 | 0 | 6 | 0 | 6 | 1 | | 1 |
| 7 | 0 | 7 | 1 | 7 | 1 | | 1 |
| 0 | 0 | 0 | 1 | 0 | 1 | | 1 |
| 1 | 0 | 1 | 0 | 1 | 1 | | 1 |
| 2 | 0 | 2 | 0 | 2 | 0 | | 1 |
| 3 | 0 | 3 | 1 | 3 | 0 | | 1 |
| 4 | 1 | 4 | 1 | 4 | 0 | | 1 |
| 5 | 1 | 5 | 0 | 5 | 0 | | 1 |
| 6 | 1 | 6 | 0 | 6 | 1 | | 1 |
| 7 | 1 | 7 | 1 | 7 | 1 | | 1 |

INPUT

READ AT DETERMINATION 12

FIG. 108

| I/O DATA | I/O DATA | I/O DATA | | DATA |
|---|---|---|---|---|
| 0 | 0 1 | 0 1 | | 0 |
| 1 | 1 0 | 1 1 | | 0 |
| 2 | 2 0 | 2 0 | | 1 |
| 3 | 3 1 | 3 0 | | 1 |
| 4 | 4 1 | 4 0 | | 1 |
| 5 | 5 0 | 5 0 | | 1 |
| 6 | 6 0 | 6 1 | | 1 |
| 7 | 7 1 | 7 1 | | 1 |
| 0 | 0 1 | 0 1 | | 1 |
| 1 | 1 0 | 1 1 | | 1 |
| 2 | 2 0 | 2 0 | | 1 |
| 3 | 3 1 | 3 0 | | 1 |
| 4 | 4 1 | 4 0 | | 1 |
| 5 | 5 0 | 5 0 | | 1 |
| 6 | 6 0 | 6 1 | | 1 |
| 7 | 7 1 | 7 1 | | 1 |
| DL-1 | DL-2 | DL-3 | | SL |
| | INPUT | | | WRITE LEVEL 15 |

FIG.110

| I/O DATA | I/O DATA | I/O DATA | | DATA |
|---|---|---|---|---|
| 0: 0 | 0: 1 | 0: | | 0 |
| 1: 0 | 1: 0 | 1: | | 0 |
| 2: 0 | 2: 0 | 2: | ⟷ | 0 |
| 3: 0 | 3: 1 | 3: | TRANSFER | 0 |
| 4: 0 | 4: 1 | 4: | FROM SL | 0 |
| 5: 0 | 5: 0 | 5: | TO DL-1 | 0 |
| 6: 0 | 6: 0 | 6: | OPERATE | 0 |
| 7: 0 | 7: 1 | 7: | DATA OF SL | 0 |
| 0: 0 | 0: 1 | 0: | AND DL-2 | 0 |
| 1: 0 | 1: 0 | 1: | TO SL | 0 |
| 2: 0 | 2: 0 | 2: | | 0 |
| 3: 0 | 3: 1 | 3: | | 0 |
| 4: 0 | 4: 1 | 4: | | 0 |
| 5: 0 | 5: 0 | 5: | | 0 |
| 6: 1 | 6: 0 | 6: | | 1 |
| 7: 1 | 7: 1 | 7: | | 1 |
| DL-1 | DL-2 | DL-3 | | SL |

READ AT DETERMINATION 2

FIG.112

| | I/O DATA | | I/O DATA | | I/O DATA | | DATA |
|---|---|---|---|---|---|---|---|
| 0 | 0 | 0 | 1 | 0 | | | 1 |
| 1 | 0 | 1 | 0 | 1 | | | 1 |
| 2 | 0 | 2 | 0 | 2 | | | 1 |
| 3 | 0 | 3 | 1 | 3 | | | 1 |
| 4 | 0 | 4 | 1 | 4 | | | 1 |
| 5 | 0 | 5 | 0 | 5 | | | 1 |
| 6 | 0 | 6 | 0 | 6 | | | 1 |
| 7 | 0 | 7 | 1 | 7 | | | 1 |
| 0 | 0 | 0 | 1 | 0 | | | 1 |
| 1 | 0 | 1 | 0 | 1 | | | 1 |
| 2 | 0 | 2 | 0 | 2 | | | 1 |
| 3 | 0 | 3 | 1 | 3 | | | 1 |
| 4 | 0 | 4 | 1 | 4 | | | 1 |
| 5 | 0 | 5 | 0 | 5 | | | 1 |
| 6 | 1 | 6 | 0 | 6 | | | 0 |
| 7 | 1 | 7 | 1 | 7 | | | 1 |
| | DL-1 | | DL-2 | | DL-3 | | SL |

WRITE LEVEL 2

FIG.114

| I/O DATA | I/O DATA | I/O DATA | | DATA |
|---|---|---|---|---|
| 0 [1] | 0 [1] | 0 [ ] | | [0] |
| 1 [1] | 1 [0] | 1 [ ] | | [0] |
| 2 [1] | 2 [0] | 2 [ ] | ↔ OR INVERTED | [0] |
| 3 [1] | 3 [1] | 3 [ ] | DATA OF SL | [0] |
| 4 [1] | 4 [1] | 4 [ ] | AND DATA OF | [0] |
| 5 [1] | 5 [0] | 5 [ ] | DL-1 AND | [0] |
| 6 [1] | 6 [0] | 6 [ ] | STORE RESULT | [0] |
| 7 [1] | 7 [1] | 7 [ ] | IN DL-1 | [0] |
| 0 [1] | 0 [1] | 0 [ ] | | [0] |
| 1 [1] | 1 [0] | 1 [ ] | | [0] |
| 2 [1] | 2 [0] | 2 [ ] | | [0] |
| 3 [1] | 3 [1] | 3 [ ] | | [0] |
| 4 [0] | 4 [1] | 4 [ ] | | [1] |
| 5 [0] | 5 [0] | 5 [ ] | | [1] |
| 6 [1] | 6 [0] | 6 [ ] | | [1] |
| 7 [1] | 7 [1] | 7 [ ] | | [1] |
| DL-1 | DL-2 | DL-3 | | SL |

READ AT DETERMINATION 4

__US 7,949,823 B2__

MULTILEVEL STORAGE NONVOLATILE SEMICONDUCTOR MEMORY DEVICE ENABLING HIGH-SPEED DATA READING AND HIGH-SPEED DATA WRITING

RELATED APPLICATIONS

This application is a Continuation of U.S. application Ser. No. 12/243,309, filed on Oct. 1, 2008 now U.S. Pat. No. 7,685,357, which is a Continuation of U.S. application Ser. No. 11/702,133, filed on Feb. 5, 2007, now U.S. Pat. No. 7,441,072, which is a Continuation of U.S. application Ser. No. 11/414,363, filed on May 1, 2006, now U.S. Pat. No. 7,296,111, which is a Continuation of U.S. application Ser. No. 09/469,497, filed on Dec. 22, 1999, now U.S. Pat. No. 7,117,295, claiming priority of Japanese Application No. 11-176027, filed on Jun. 22, 1999, the entire contents of each of which are hereby incorporated by reference.

BACKGROUND OF THE INVENTION

1. Field of the Invention

The present invention relates to a nonvolatile semiconductor memory device, and more particularly, it relates to the structure of a nonvolatile semiconductor memory device capable of storing information of at least four values (information of at least two bits) in a single memory cell. More specifically, the present invention relates to the structure of an electrically reloadable nonvolatile semiconductor memory device such as a flash memory, for example.

2. Description of the Prior Art

In order to meet increase of the storage capacity of a nonvolatile semiconductor memory device such as a flash memory, a structure capable of storing multivalued data exceeding binary data in a single memory cell has been developed.

FIG. 118 is a schematic block diagram showing the overall structure of a conventional AND flash memory 8000.

A memory cell array 100 includes a number of memory cells having floating gates and control gates. Referring to FIG. 118, the memory cell array 100 is divided into two memory cell blocks 100R and 100L.

The control gates, drains and sources of the memory cells are connected to word lines WL, bit lines BL and source lines SCL (not shown) respectively.

FIG. 118 representatively shows a single word line WL and a single bit line BL. Row decoders 110 selectively drive the word lines WL on the basis of externally supplied address signals. A sense latch circuit 120 is provided on single ends of the bit lines BL. The bit lines BL are selected on the basis of selection signals output from column decoders 130, for transferring read data and write data.

The sense latch circuit 120 includes a column switching circuit (not shown in FIG. 118) for selecting the bit lines BL on the basis of the selection signals from the column decoders 130.

An address buffer 140 supplies the address signals to the column decoders 130 and the row decoders 110.

A chip control part 200 externally receives an access control signal (not shown) and a clock signal (not shown) and entirely controls the internal circuits of the flash memory 8000 for write control and read control of the memory cells. The chip control part 200 controls a power supply generation part 150 thereby switching operating voltages of word drivers (not shown) driving the potentials of the word lines WL in response to operation modes for erasing, writing, reading and the like.

Data latch circuits DL-L and DL-R are data buffers temporarily holding data transferred in data write and read operations.

The operation modes of the flash memory 8000 are not particularly restricted but instructed by an access control signal externally supplied to the chip control part 200 or command data supplied through a data bus or the like, and include data rewrite (erase and write) and data read modes.

In the conventional AND four-valued flash memory 8000 shown in FIG. 118, each memory cell is in an information storage state selected from an erased state, a first write state, a second write state and a third write state. The four information storage states in total correspond to states decided by 2-bit data. In other words, each memory cell can store 2-bit data.

Therefore, the flash memory 8000 sets three different types of write verify voltages applied to the word lines WL in the write operation and sequentially switches the voltages for performing write operations three times.

In each write operation, the chip control part 200 controls an operation of writing two-valued (1-bit) write data "0" or "1" ("L" or "H") held in a sense latch SL (included in the sense latch circuit 120) connected with a memory cell subjected to writing while setting the corresponding write verify voltage every write operation. Information of four values (two bits) can be written in a single memory cell due to this structure, as described later in detail.

The flash memory 8000 sets three types of voltages as word line selection levels applied by the word line WL in the read operations and captures data of two values (one bit) read from the memory cell in the three read operations through the sense latch circuit 120, and the chip control part 200 converts the data to information of four values (two bits) after termination of the three read operations.

The outlines of write and read operations are now described.

In the write operation, a data string of two values (one bit) to be written and address signals are captured in the address buffer/data input/output buffer 140 from a data input/output terminal group 10 and an address signal input terminal group 12 respectively.

The chip control circuit 200 separates the data string of two values (one bit) to be written into data strings of upper and lower bit data (or data strings of odd and even bit data) and transfers the data strings to the data latches (hereinafter referred to as non-selected selection latches) DL-L and DL-R connected with non-selected memory cells in the memory cell array 100 through signal lines 20 respectively for temporarily latching the data strings.

The chip control part 200 captures the data held in the data latches DL-L and DL-R through the signal lines 20 when performing each of "write 1 (write operation for obtaining the first write state)", "write 2 (write operation for obtaining the second write state)" and "write 3 (write operation for obtaining the third write state)" and converts the data to data "0" or "1" of two values (one bit) corresponding to the data of four values (two bits) to be written in the selected memory cell in response to "write 1", "write 2" and "write 3". Further, the chip control part 200 transfers the converted data to the sense latch SL in the sense latch circuit 120 connected with the selected memory cell through a signal line 18 so that the aforementioned write operations "write 1", "write 2" and "write 3" are performed in accordance with the binary data latched in the selected sense latch SL.

Thus, information of four values (two bits) can be written in a single memory cell by temporarily holding binary data separated into an upper bit string and a lower bit string in the data latches DL-L and DL-R, forming write data of two values (one bit) for each of three write operations ("write 1" to "write 3") having different verify voltages and performing the three write operations having different verify voltages.

In the read operation, three different types of voltages are sequentially applied to the selected word line WL so that information "0" or "1" of two values (one bit) read from the memory cell of the memory cell array 100 to the selected sense latch SL by three read operations is transferred to and temporarily held in the data latches DL-L and DL-R. Three types of data "0" or "1" of two values (one bit) in the data strings read through the three read operations, held in the data latches DL-L and DL-R and latched in the selected sense latch SL are transferred to the chip control circuit 200 through the signal lines 18 and 20.

The chip control circuit 200 composites upper and lower bits of data of four values (two bits) on the basis of the data transferred in the aforementioned manner. The chip control circuit 200 outputs the composited upper and lower bits from the data input/output terminal group 10 through the data input/output buffer 140.

The aforementioned write and read operations are now described in further detail.

[Conventional Write Operation of Four-Valued Data]

FIG. 119 illustrates the relation between write data and thresholds of memory cell transistors in a conventional two-valued AND flash memory. In the write and read operations, data are written and read with reference to a determination level Vj01.

FIG. 120 illustrates the relation between write data and thresholds of memory cell transistors in the conventional four-valued AND flash memory 8000. In the write and read operations, data are written and read with reference to three determination levels Vj1, Vj2 and Vj3.

As hereinabove described, the conventional four-valued AND flash memory 8000 divides the threshold into four types after writing as shown in FIG. 120, while the conventional two-valued AND flash memory divides the threshold (Vth) of the memory cell transistor into two types "0" and "1" after writing.

Therefore, the flash memory 8000 requires three types of determination levels Vj1, Vj2 and Vj3 for determining the respective levels.

FIGS. 121 to 126 are conceptual diagrams showing data held in the data latches DL-L and DL-R and the sense latch SL and thresholds of memory cells after writing in first to third processing steps of the write operation.

FIG. 121 shows data held in the latches DL-L, DL-R and SL in the first processing step of the write operation, and FIG. 122 shows thresholds of the memory cells in the first processing step of the write operation.

FIG. 123 shows data held in the latches DL-L, DL-R and SL in the second processing step of the write operation, and FIG. 124 shows thresholds of the memory cells in the second processing step of the write operation.

FIG. 125 shows data held in the latches DL-L, DL-R and SL in the third processing step of the write operation, and FIG. 126 shows thresholds of the memory cells in the third processing step of the write operation.

Before starting the write operation, the thresholds of the memory cells are set below the determination level Vj1.

Referring to FIGS. 121 and 122, data DQ0 to DQ3 and DQ4 to DQ7 are stored in the data latches DL-R and DL-L respectively among data DQ0 to DQ7 for one byte input from terminals I/O0 to I/O7 included in the data input/output terminal group 10 in the first step of the write operation. Referring to FIG. 121, it is assumed that C9h represents the input 1-byte data in hexadecimal notation.

The data latch DL-R latches the input data DQ0 to DQ3 from the terminals I/O0 to I/O3 and the data latch DL-L latches the input data DQ4 to DQ7 from the terminals I/O4 to I/O7 as for the entire sector (data corresponding to one word line WL).

In the following description, consider each 2-bit data (DQ4, DQ0), (DQ5, DQ1), (DQ6, DQ2) and (DQ7, DQ3), having one of the data DQ4 to DQ7 held in the data latch DL-L as the upper bit and one of the data DQ0 to DQ3 held in the data latch DL-R as the lower bit, as a set of data.

The chip control part 200 operates the aforementioned sets of data included in the data latches DL-R and DL-L and zeros only bit data of the sense latch SL corresponding to such data that the upper bit held in the data latch DL-L is "0" and the lower bit held in the data latch DL-R is "1".

As shown in FIG. 121, the sense latch SL holds "0111" from the high-order position. On the basis of the data thus held in the sense latch SL, data are written in memory cells MC1 to MC4 corresponding to the bits of the sense latch SL respectively. The memory cells MC1 to MC4 are connected with the same word line WL. The third determination level Vj3 is employed as the determination value for a verify operation.

At this time, data is written in the memory cell corresponding to the data "0" in the sense latch SL. Thus, the data (corresponding to data "01") of level 4 is written in the memory cell MC4 corresponding to the most significant bit of the sense latch SL.

In practice, a high voltage is applied to the word line WL thereby writing the data through an FN (Fowler-Nordheim) tunnel current.

A voltage below the word line voltage is applied to bit lines BL corresponding to the bit data "1" of the sense latch SL, in order to relax the voltage applied from the word line WL. Consequently, data is written in only the memory cell connected with the bit line BL corresponding to the bit data "0" held in the sense latch SL.

Referring to FIGS. 123 and 124, the data held in the data latches DL-R and DL-L are operated in the second step of the write operation for writing "0" in the bit of the sense latch SL corresponding to such a set of data that the upper bit held in the data latch DL-L is "0" and the lower bit held in the data latch DL-R is "0". The determination value in the verify operation is changed to Vj2, and data are written only in the memory cells connected with bit lines BL corresponding to the data DQ5 and DQ1 in data writing.

Referring to FIGS. 125 and 126, the data held in the data latches DL-R and DL-L are operated in the third step of the write operation for writing "0" in the bit of the sense latch SL corresponding to such a set of data that the upper bit held in the data latch DL-L is "1" and the lower bit held in the data latch DL-R is "0". The determination value in the verify operation is changed to Vj1, and data are written only in the memory cells connected with bit lines BL corresponding to the data DQ6 and DQ2 in data writing.

After inputting all data to be written, the write operation is terminated through three operations and write processing as described above.

[Conventional Read Operation of Four-Valued Data]

The read operation is now described.

FIGS. 127 to 132 are conceptual diagrams showing data held in the data latches DL-L and DL-R and the sense latch SL, thresholds of memory cells and determination levels in first to third processing steps of the read operation.

FIG. 127 shows data held in the latches DL-L, DL-R and SL in the first processing step of the read operation, and FIG. 128 shows thresholds of the memory cells and determination levels in the first processing step of the read operation.

FIG. 128 shows data held in the latches DL-L, DL-R and SL in the second processing step of the read operation, and FIG. 129 shows threshold of the memory cells and determination levels in the second processing step of the read operation.

FIG. 129 shows data held in the latches DL-L, DL-R and SL in the second processing step of the read operation, and FIG. 130 shows thresholds of the memory cells and determination levels in the second processing step of the read operation.

FIG. 131 shows data held in the latches DL-L, DL-R and SL in the third processing step of the read operation, and FIG. 132 shows thresholds of the memory cells and determination levels in the third processing step of the read operation.

Referring to FIGS. 127 and 128, data are read at the first determination level Vj1 and the results are stored in the sense latch SL in the first processing step of the read operation. The data are transferred to the data latch DL-R, and the sense latch SL is cleared.

Referring to FIGS. 129 and 130, data are read at the second determination level Vj2 and the results are stored in the sense latch SL in the second processing step of the read operation. The data are transferred to the data latch DL-L and the sense latch SL is cleared again.

Referring to FIGS. 131 and 132, data are finally read at the third determination level Vj3 and the results are stored in the sense latch SL in the third processing step of the read operation. The chip control circuit 200 sets the data of the data latch DL-R to "1" only on such a bit position that both of the data stored in the sense latch SL and the data in the data latch DL-R are "0".

The data latches DL-L and DL-R sequentially output the data DQ4 to DQ7 and DQ0 to DQ3 respectively.

Also in the read operation, the data are output after all three read operations are defined.

For example, Japanese Patent Laying-Open No. 9-297996 (1997) discloses a more detailed structure of such a multivalued memory. This memory also requires a plurality of processing steps in each of read and write operations, similarly to the aforementioned multivalued memory.

In the conventional AND four-valued flash memory 8000, as hereinabove described, the speed of the chip for read and write operations is deteriorated by a delay following a plurality of processing steps, as compared with the general two-valued flash memory. This problem of deterioration of the speed gets serious as the number of values is increased.

SUMMARY OF THE INVENTION

An object of the present invention is to provide a nonvolatile semiconductor memory device capable of suppressing deterioration of speed also when holding multivalued data in a single memory cell.

Briefly stated, the present invention is directed to a nonvolatile semiconductor memory device comprising a memory cell array, a cell selection circuit, a data read/write circuit and a data input/output circuit.

A plurality of memory cells are arranged in the memory cell array. Each memory cell includes a storage element holding binary data of n bits in response to $2^n$ (n: natural number) threshold levels.

The threshold levels correspond to levels obtained by rearranging a set of the binary data of n bits in a procedure corresponding to a procedure of:

i) associating n bit pointer variables BP(i) (i: natural number, $1 \leq i \leq n$) with n integers from zero to (n−1) arranged in arbitrary order respectively, ii) rearranging the set of the binary data of n bits in two data groups in response to whether data of a BP(1)-th bit is "0" or "1" in a first step, and iii) rearranging each group of the set of the binary data of n bits divided into $2^{j-1}$ groups in the process up to a (j−1)th step further in two data groups in response to whether data of a BP(j)-th bit is "0" or "1" in a j-th step (j: natural number, $2 \leq j \leq n$).

The cell selection circuit collectively selects a plurality of memory cells from the memory cell array in response to an address signal.

The data read/write circuit performs a read/write operation of stored data on the selected plurality of memory cells on the basis of ($2^n$−1) determination levels corresponding to boundaries between groups of the threshold levels corresponding to the data groups.

The data input/output circuit transfers the stored data between an external device for the nonvolatile semiconductor memory device and the memory cells as binary data through k input/output nodes every k bit (k: natural number).

The stored data held in each memory cell is generated from n bit data transferred through the same input/output node at different timings.

Accordingly, a principal advantage of the present invention resides in that multivalued data stored in a single memory cell is generated from data transferred at different timings and hence data can be output every time each bit data is defined in a read operation, for reducing the data output time.

Another advantage of the present invention resides in that multivalued data stored in a single memory cell is generated from data transferred at different timings and hence data can be written every time each bit data is defined in a write operation, for reducing the data input time.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 2 illustrates data held in respective latches in a first processing step of a read operation;

FIG. 3 illustrates thresholds of memory cells and determination levels in the first processing step of the read operation;

FIG. 6 illustrates data held in the respective latches in a third processing step of the read operation;

FIG. 7 illustrates thresholds of the memory cells and determination levels in the third processing step of the read operation;

FIG. 8 is a timing chart for illustrating the read operation of the flash memory 1000 according to the first embodiment;

FIG. 44 illustrates data held in respective latches in a first processing step of a read operation in a flash memory according to a fifth embodiment of the present invention;

FIG. 46 illustrates data held in the respective latches in a second processing step of the read operation in the fifth embodiment of the present invention;

FIG. 48 illustrates data held in the respective latches in a third processing step of the read operation in the fifth embodiment of the present invention;

FIG. 50 illustrates data held in the respective latches in a fourth processing step of the read operation in the fifth embodiment of the present invention;

FIG. 52 illustrates data held in the respective latches in a fifth processing step of the read operation in the fifth embodiment of the present invention;

FIG. 54 illustrates data held in the respective latches in a sixth processing step of the read operation in the fifth embodiment of the present invention;

FIG. 56 illustrates data held in the respective latches in a seventh processing step of the read operation in the fifth embodiment of the present invention;

FIG. 58 illustrates data held in the respective latches in an eighth processing step of the read operation in the fifth embodiment of the present invention;

FIG. 60 illustrates data held in the respective latches in a ninth processing step of the read operation in the fifth embodiment of the present invention;

FIG. 62 illustrates data held in the respective latches in a tenth processing step of the read operation in the fifth embodiment of the present invention;

FIG. 64 illustrates data held in the respective latches in an eleventh processing step of the read operation in the fifth embodiment of the present invention;

FIG. 66 illustrates data held in the respective latches in a twelfth processing step of the read operation in the fifth embodiment of the present invention;

FIG. 68 illustrates data held in the respective latches in a thirteenth processing step of the read operation in the fifth embodiment of the present invention;

FIG. 70 illustrates data held in the respective latches in a fourteenth processing step of the read operation in the fifth embodiment of the present invention;

FIG. 72 illustrates data held in the respective latches in a fifteenth processing step of the read operation in the fifth embodiment of the present invention;

FIG. 74 illustrates data held in the respective latches in a sixteenth processing step of the read operation in the fifth embodiment of the present invention;

FIG. 76 illustrates data held in the respective latches in a seventeenth processing step of the read operation in the fifth embodiment of the present invention;

FIG. 78 illustrates data held in the respective latches in an eighteenth processing step of the read operation in the fifth embodiment of the present invention;

FIG. 80 illustrates data held in the respective latches in a nineteenth processing step of the read operation in the fifth embodiment of the present invention;

FIG. 90 illustrates data held in the respective latches in a second processing step of the write operation in the sixth embodiment of the present invention;

FIG. 92 illustrates data held in the respective latches in a third processing step of the write operation in the sixth embodiment of the present invention;

FIG. 94 illustrates data held in the respective latches in a fourth processing step of the write operation in the sixth embodiment of the present invention;

FIG. 96 illustrates data held in the respective latches in a fifth processing step of the write operation in the sixth embodiment of the present invention;

FIG. 98 illustrates data held in the respective latches in a sixth processing step of the write operation in the sixth embodiment of the present invention;

FIG. 100 illustrates data held in the respective latches in a seventh processing step of the write operation in the sixth embodiment of the present invention;

FIG. 102 illustrates data held in the respective latches in an eighth processing step of the write operation in the sixth embodiment of the present invention;

FIG. 104 illustrates data held in the respective latches in a ninth processing step of the write operation in the sixth embodiment of the present invention;

FIG. 106 illustrates data held in the respective latches in a tenth processing step of the write operation in the sixth embodiment of the present invention;

FIG. 108 illustrates data held in the respective latches in an eleventh processing step of the write operation in the sixth embodiment of the present invention;

FIG. 110 illustrates data held in the respective latches in a twelfth processing step of the write operation in the sixth embodiment of the present invention;

FIG. 112 illustrates data held in the respective latches in a thirteenth processing step of the write operation in the sixth embodiment of the present invention;

FIG. 114 illustrates data held in the respective latches in a fourteenth processing step of the write operation in the sixth embodiment of the present invention;

FIG. 123 illustrates data held in the respective latches in a second processing step of the conventional write operation;

FIG. 124 illustrates thresholds of the memory cells in the second processing step of the conventional write operation;

FIG. 125 illustrates data held in the respective latches in a third processing step of the conventional write operation;

FIG. 126 illustrates thresholds of the memory cells in the third processing step of the conventional write operation;

FIG. 127 illustrates data held in the respective latches in a first processing step of a conventional read operation;

FIG. 128 illustrates thresholds of memory cells in the first processing step of the conventional read operation;

FIG. 129 illustrates data held in the respective latches in a second processing step of the conventional read operation;

FIG. 130 illustrates thresholds of the memory cells in the second processing step of the conventional read operation;

FIG. 131 illustrates data held in the respective latches in a third processing step of the conventional read operation; and FIG. 132 illustrates thresholds of the memory cells in the third processing step of the conventional read operation;

DESCRIPTION OF THE PREFERRED EMBODIMENTS

First Embodiment

Figure 1:
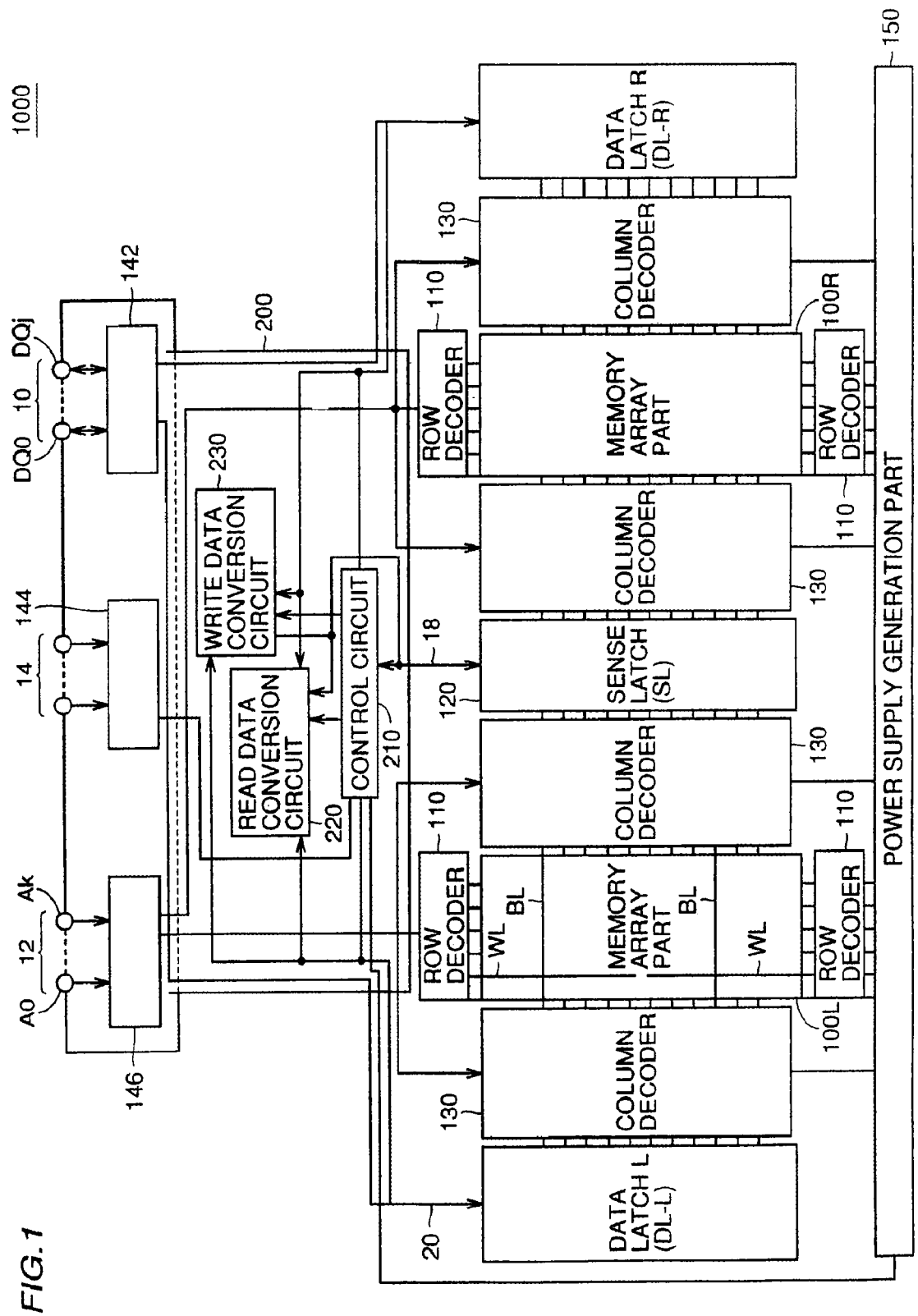
FIG. 1 is a schematic block diagram showing the structure of a flash memory 1000 forming a nonvolatile semiconductor memory device according to a first embodiment of the present invention.

FIG. 1 is a schematic block diagram showing the structure of a flash memory 1000 forming a nonvolatile semiconductor memory device according to a first embodiment of the present invention.

A memory cell array 100 has a number of memory cells including floating gates and control gates. Also in FIG. 1, the memory cell array 100 is divided into two memory cell blocks 100R and 100L.

The control gates, drains and sources of the memory cells are connected to word lines WL, bit lines BL and source lines SCL (not shown) respectively.

FIG. 1 representatively shows two word lines WL and two bit lines BL respectively.

Row decoders 110 selectively drive the word lines WL on the basis of address signals A0 to Ak externally supplied through an address signal input terminal group 12 and an address buffer 146. A sense latch circuit 120 is provided on single ends of the bit lines BL. The bit lines BL are selected on the basis of selection signals output from column decoders 130 in response to the address signals A0 to Ak, so that read data and write data are transmitted to/received in the selected bit lines BL.

The sense latch circuit 120 includes a column switching circuit (not shown) for selecting the bit lines BL on the basis of the selection signals from the column decoders 130.

A chip control circuit 200 includes a control circuit 210 receiving an access control signal and a clock signal externally supplied from a control signal input terminal group 14 through a command buffer circuit 144 and totally controlling the internal circuits of the flash memory 1000 for write control and read control of the memory cells. The control circuit 210 controls a power supply generation part 150 thereby switching operating voltages of word drivers (not shown) driving the potentials of the word lines WL in response to operation modes for erasing, writing, reading and the like.

Data latch circuits DL-L and DL-R are data buffers temporarily holding data transferred in data write and read operations.

The chip control part 200 further includes a read data conversion circuit 220 controlled by the control circuit 210 for operating data held in the data latch circuits DL-L and DL-R and the sense latch circuit 120 and generating read data in a read operation and a write data conversion circuit 230 controlled by the control circuit 210 for operating data held in the data latch circuits DL-L and DL-R and the sense latch circuit 120 and generating write data in a write operation.

The operation modes of the flash memory 1000 are not particularly restricted but instructed by the access control signal externally supplied to the chip control part 200 or command data supplied through a data bus or the like, and include data rewrite (erase and write) and data read modes.

Also in the AND four-valued flash memory 1000 shown in FIG. 1, each memory cell is in an information storage state selected from an erased state, a first write state, a second write state and a third write state.

Therefore, the flash memory 1000 also sets three different types of write verify voltages applied to the word lines WL in the write operation and performs the write operation three times while sequentially switching the write verify voltages. The flash memory 1000 enables reduction of write and read times by devising arrangement of 2-bit data corresponding to the aforementioned four information storage states and the order of the write processing performed three times.

In each write operation, the control circuit 210 controls the write data conversion circuit 230 to operate two-valued (1-bit) write data "0" or "1" ("L" or "H") to be held in a sense latch SL (included in the sense latch circuit 120) in each write operation on the basis of write data held in the data latches DL-L and DL-R. The control circuit 210 sets the write verify voltage corresponding to each of the three write operations for controlling the write operation.

In the structure of the conventional flash memory 8000, the data latch circuits DL-L and DL-R hold two data strings obtained by dividing the data string supplied to the data input/output terminal group 10 at the same timing respectively.

In the flash memory 1000 according to this embodiment, the data latch circuits DL-L and DL-R hold two data strings supplied to the data input/output terminal group 10 at different timings and supplied to the same memory cell group coupled to the same word line WL or two data strings supplied to memory cell groups coupled to the same word line WL and different bit lines BL respectively dissimilarly to the conventional flash memory 8000, as described later. Information of four values (two bits) can be written in a single memory cell due to this structure.

The flash memory 1000 also sets three types of voltages as word line selection levels applied by the word lines WL in the read operation and captures two-valued (1-bit) data read from the memory cells in three read operations in the data latch circuits DL-L and DL-R through the sense latch circuit 120. During the three read operations, the read data conversion circuit 220 sequentially converts the data held in the latch circuits DL-L and DL-R to information of four values (two bits) and the control circuit 210 outputs the information from the data input/output terminal group 10.

The aforementioned write and read operations are now described in further detail.

[Read Operation of Four-Valued Data]

In the flash memory 1000 according to the first embodiment, the method of storing input/output data in the data latches DL-L and DL-R is different from that in the conventional flash memory 8000, as hereinabove described.

In the conventional multivalued flash memory 8000, a single memory cell stores data formed by those in the same byte such as the data DQ0 and DQ4 or DQ1 and DQ5 in 1-byte data input from the data input/output terminal group 10 at the same timing. In the four-valued flash memory 1000 according to the present invention, a single memory cell stores data having the same Y addresses of different word lines and corresponding to bits of the same I/O data or data corresponding to the same I/O data (data corresponding to the same I/O data on different Y addresses in the same sector) having somewhat different Y addresses in the same sector (the same word line WL).

FIGS. 2 to 7, illustrating operations of the flash memory 1000 according to the first embodiment, are conceptual diagrams showing data held in the data latches DL-L and DL-R and the sense latch SL and thresholds of memory cells and determination levels in reading in first to third processing steps of the read operation.

FIG. 2 shows data held in the respective latches DL-L, DL-R and SL in the first processing step of the read operation, and FIG. 3 shows thresholds of the memory cells and determination levels in the first processing step of the read operation.

Figure 4:
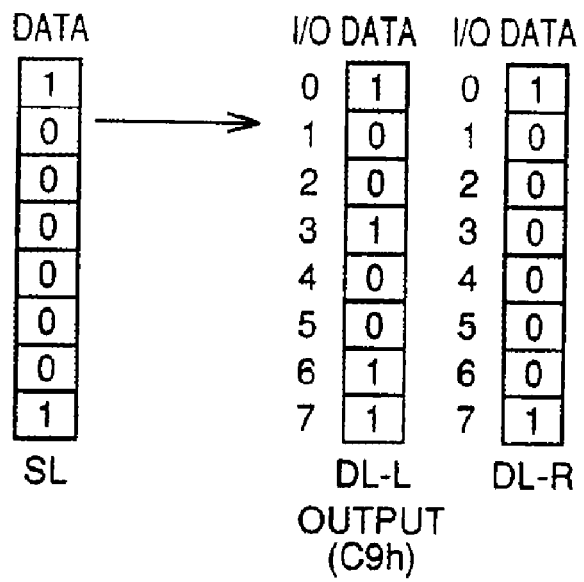
FIG. 4 illustrates data held in the respective latches in a second processing step of the read operation.
Figure 5:
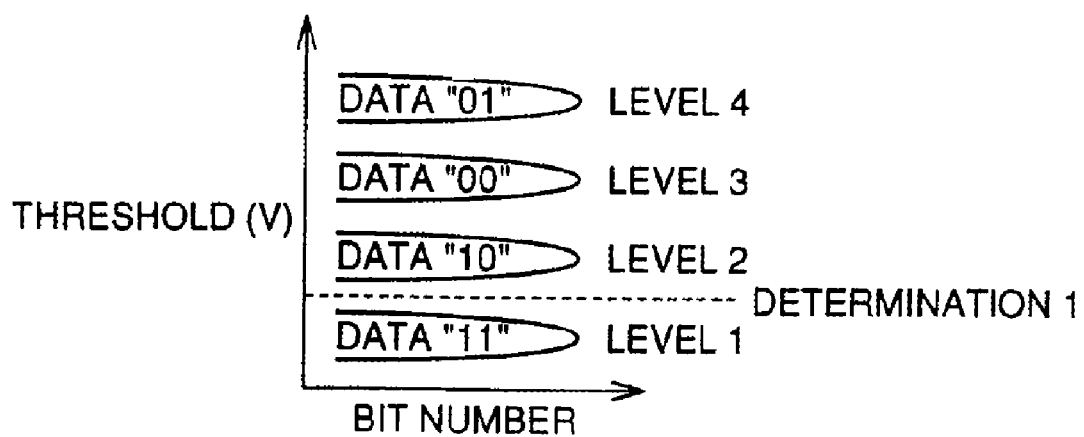
FIG. 5 illustrates thresholds of the memory cells and determination levels in the second processing step of the read operation.
Figure 9:
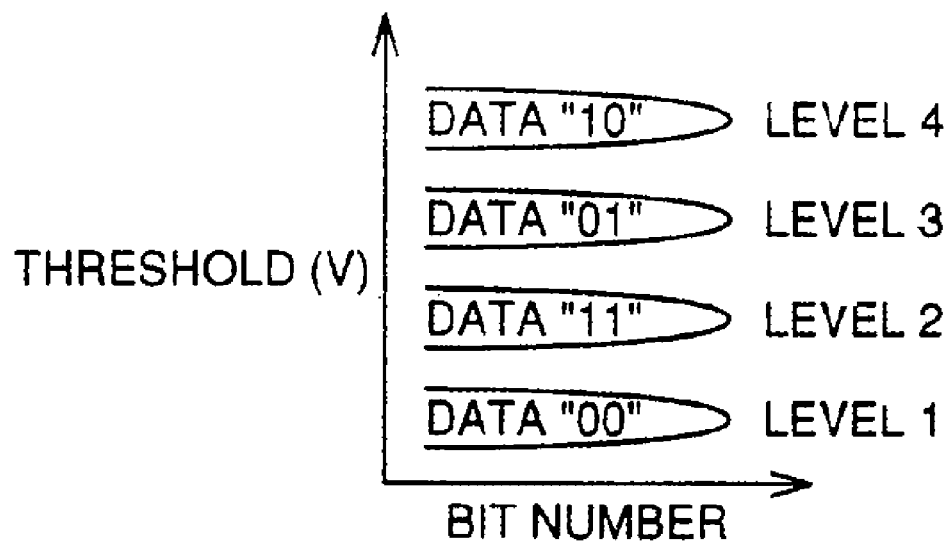
FIGS. 9 to 12 show first to fourth examples of association between write levels and write data having upper and lower bits indefinable in single read processing.
Figure 10:
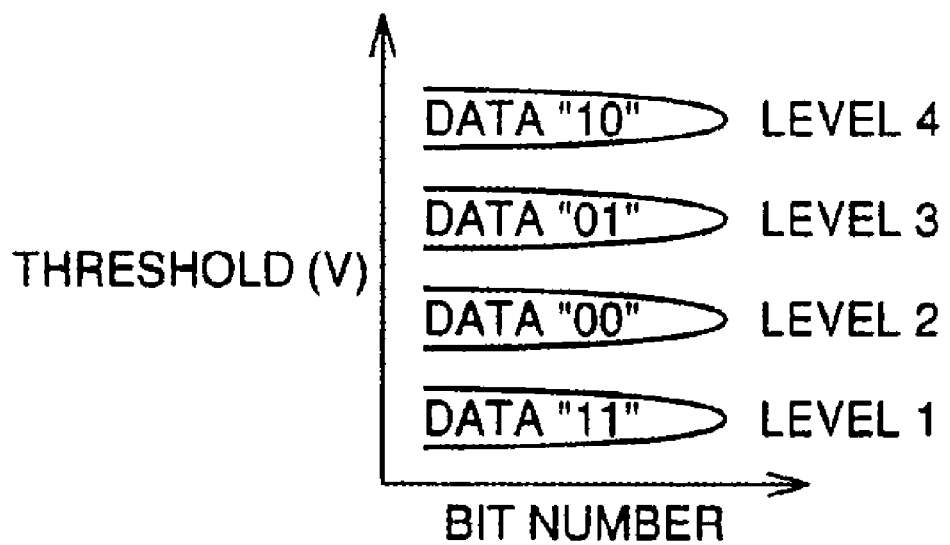
Figure 11:
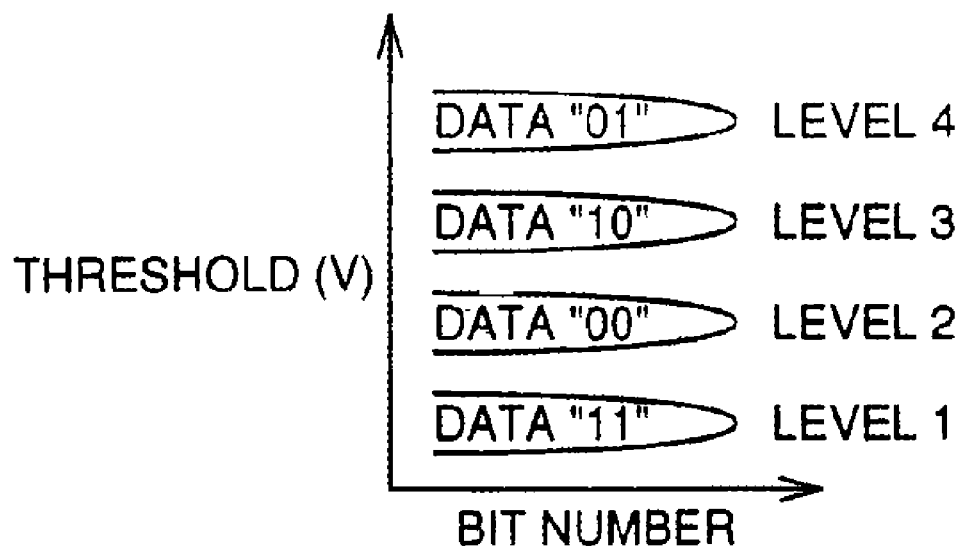
Figure 12:
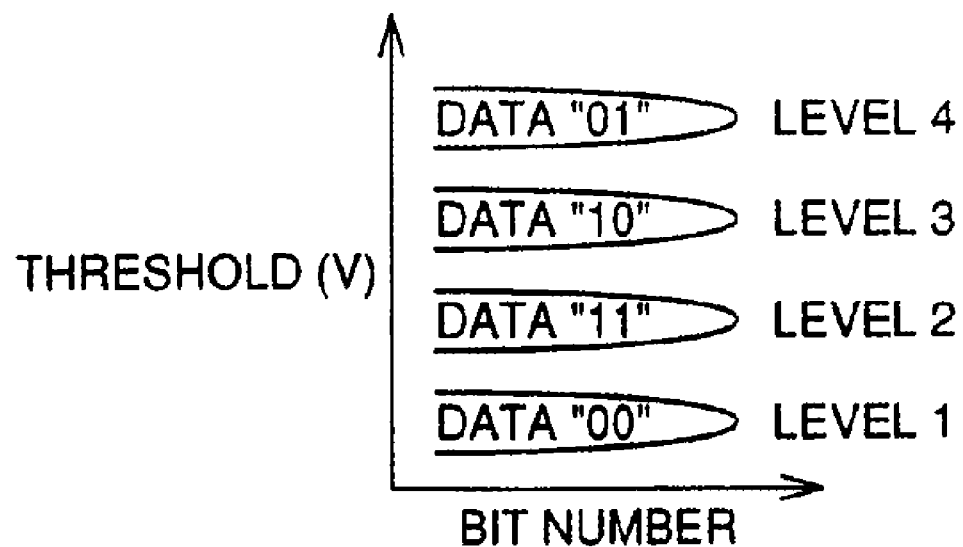

FIG. 4 shows data held in the respective latches DL-L, DL-R and SL in the second processing step of the read operation, and FIG. 5 shows thresholds of the memory cells and determination levels in the second processing step of the read operation.

FIG. 6 shows data held in the respective latches DL-L, DL-R and SL in the third processing step of the read operation, and FIG. 7 shows thresholds of the memory cells and determination levels in the third processing step of the read operation.

Referring to FIGS. 2 and 3, data are collectively read from a plurality of memory cells for 1 KB, for example, connected to the same word line at a second determination level $V_{j2}$ and the results are stored in the sense latch circuit 120 in the first processing step of the read operation.

FIG. 2 extractively shows the sense latch SL, included in the sense latch circuit 120, holding data for one byte first output from the data input/output terminal group 10 in a read operation for one sector and data latches DL-L and DL-R corresponding thereto. Processing similar to that described below is performed in parallel on data read from the data input/output terminal group 10 subsequently to the data for one byte.

It is assumed that memory cells MC0 to MC7 holding a data string including the data for one byte first output from the data input/output terminal group 10 hold data "11", "01", "00", "10", "01", "00", "10" and "11" respectively. Referring to FIG. 2, therefore, the sense latch circuit 120 holds data C9h in hexadecimal notation in an area for one byte.

The data collectively read at the second determination level $V_{j2}$ are stored in the data latch DL-L from the sense latch SL. At this time, the data stored in the data latch DL-L are sequentially output byte by byte from the data input/output terminal group 10 under control of the control circuit 210. The data stored in the data latch circuit DL-L at this point of time correspond to half data for one sector in a read operation of the conventional two-valued flash memory.

Thus, the read operation is first performed at the second determination level $V_{j2}$ in the first processing step so that four types of data in the memory cells are defined as "0" or "1" in reading at this level, as shown in FIG. 3. In other words, it follows that "0" or "1" of the upper bits of the data stored in the memory cells MC0 to MC7 are defined.

Referring to FIGS. 4 and 5, data are read at a first determination level $V_{j1}$ in the second processing step of the read operation when the data are stored in the data latch DL-L from the sense latch SL and the sense latch SL is cleared in the first processing step, and the read data are stored in the sense latch circuit 120. In other words, data are transferred from the sense latch SL to the data latch DL-R while the data latch circuit DL-L performs data output. After data transfer to the data latch DL-R, the sense latch circuit 120 is cleared.

Referring to FIGS. 6 and 7, data are read at a third determination level $V_{j3}$ and stored in the sense latch circuit 120 in the third processing step of the read operation. The read data conversion circuit 220 performs an operation between the data held in the sense latch SL and the data held in the data latch DL-R, and changes bit data of the data latch DL-R only where both bit data are "0".

After data output from the data latch DL-L is terminated, the control circuit 210 starts data output from the data latch DL-R to the data input/output terminal group 10.

The conventional four-valued flash memory 8000 has a sector size of 2 KB, for example, and performs an output operation at 50 nm per byte. Therefore, the conventional flash memory 8000 requires a time of 50 μs for outputting data of 1 KB, i.e., half the sector size.

Also in the conventional four-valued flash memory 8000, the time (referred to as a first access time) up to immediately before output is completed in 50 μs also when starting data output after performing the read operation three times. Therefore, it is possible to complete the access operations from the aforementioned first to third determination levels while outputting data for half a sector in the four-valued flash memory 1000 according to the present invention.

In the four-valued flash memory 1000, therefore, a time for obtaining the result of determination at the second determination level Vj2 may elapse before data output after input of a read command. This is equivalent to a read time for two values, and hence no speed deterioration is caused by the four-valued data stored in the memory cells.

If the output speed is extremely high (or the first access time is extremely long) and output from the data latch DL-L is terminated before the data in the data latch DL-R are defined, it follows that a latency occurs between the data output from the data latch DL-L and that from the data latch DL-R. Also in this case, the read speed is improved by the output time of the data latch DL-L as compared with the conventional data read operation.

In general, however, the sector size is adjusted to cause no such latency. In other words, the sector size (the quantity of data output from memory cells connected with a single word line) may be decided in response to the read time (first access time).

In order to satisfy this condition, the sector size must satisfy the following expression:

$$\{\text{sector size(byte)} \times \text{(output time per byte)} \times \tfrac{1}{2}\} \geq \{\text{single read time} \times 2\} \quad (1)$$

FIG. 8 is a timing chart for illustrating the read operation of the flash memory 1000 according to the first embodiment.

Referring to FIG. 8, data are first read at the second determination level Vj2 and stored in the sense latch circuit 120 at a time t1.

Then, the data held in the sense latch circuit 120 are transferred to the data latch DL-L and the sense latch circuit 120 is cleared at a time t2.

At a time t3, a read operation based on the first determination level Vj1 is started. At a time t4, output of data for a half sector held in the data latch DL-L is started under control of the control circuit 210.

At a time t5, the data read on the basis of the first determination level Vj1 and held in the sense latch circuit 120 are stored in the data latch DL-R. On the other hand, the sense latch circuit 120 is cleared.

At a time t6, a read operation based on the third determination level Vj3 is started and read data are stored in the sense latch circuit 120.

After completion of the read operation based on the third determination level Vj3, the read data conversion circuit 220 performs an operation between the data held in the sense latch circuit 120 and the data held in the data latch circuit DL-R under control of the control circuit 210, and changes bit data held in the data latch DL-R to "1" only where both bit data are "0".

At a time t9, output of data for the remaining half sector held in the data latch DL-R is started. At a time t10, data output for one sector is completed.

While the data string read at the time t1 is output, the read operation of the data string to be subsequently output is completed as hereinabove described. Thus, a delay time can be reduced when outputting read data from four-valued memory cells.

First Modification of First Embodiment

In the first embodiment, the processing shown in FIGS. 4 and 5 and that shown in FIGS. 6 and 7 are performed while outputting the data held in the data latch DL-L after performing the processing shown in FIGS. 2 and 3. However, the present invention is not necessarily restricted to this order of processing but the processing shown in FIGS. 2 and 3 may be performed after performing the processing shown in FIGS. 4 and 5 and that shown in FIGS. 6 and 7, for example. In other words, the processing shown in FIGS. 2 and 3 may be performed while outputting data from the data latch DL-R after reading data at the first determination level Vj1, storing the result of reading in the data latch DL-R, then reading data at the third determination level Vj3 and performing an operation between the data stored in the sense latch SL and the data held in the data latch DL-R. In this case, it follows that output of the data read at the second determination level and stored in the data latch DL-L is started after data output from the data latch DL-R is terminated.

In this case, data reading can be performed in a shorter time than the conventional four-valued flash memory 8000 although the effect of reducing the read operation time is smaller than that in the first embodiment.

The first to third processing steps may not necessarily be continuously performed as described above but the data held in the memory cells MC0 to MC7 may be read bitwise from the upper or lower bits.

Second Modification of First Embodiment

In the first embodiment, as hereinabove described, the write levels and the write data are so associated that four types of data in the memory cells are defined as "0" or "1" by first performing the read operation at the second determination level Vj2 in the first processing step of the read operation.

FIGS. 9 to 12 illustrate exemplary association of write levels and write data capable of defining neither upper bits nor lower bits in single read processing. Referring to each of FIGS. 9 to 12, neither upper bits nor lower bits can be defined in single read processing also when "0" and "1" are replaced with each other.

A read operation according to a second modification of the first embodiment provides another exemplary association of write data and write levels capable of reducing the read time similarly to the first embodiment.

Figures 13, 14:
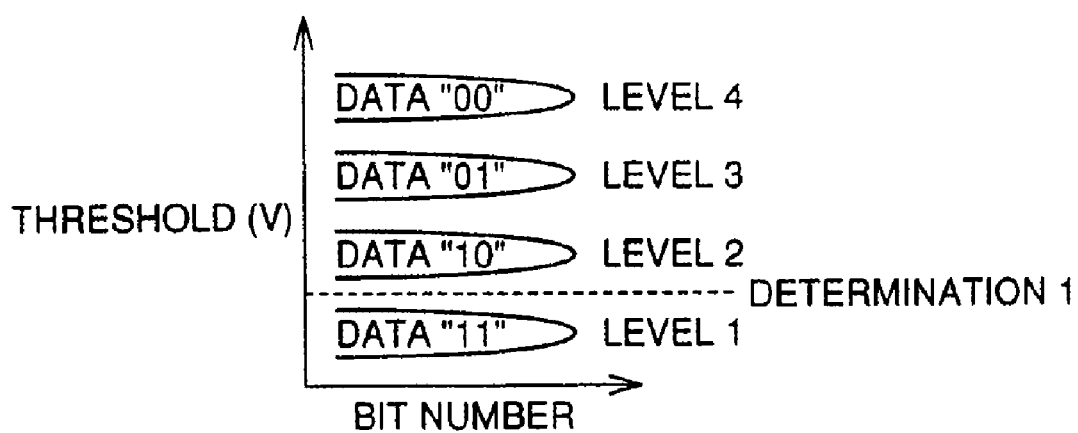
FIG. 13 illustrates data held in respective latches in a second processing step of a read operation in a second modification of the first embodiment.
FIG. 14 illustrates thresholds of memory cells and determination levels in the second processing step of the read operation in the second modification of the first embodiment.

FIG. 13 illustrates data held in the respective latches in a second processing step of the read operation according to the second modification of the first embodiment, and FIG. 14 illustrates thresholds of the memory cells and determination levels in the second processing step of the read operation according to the second modification of the first embodiment.

Also when the data "00" and "01" are replaced with each other in the data arrangement shown in FIG. 3 as shown in FIG. 14, the read time can be reduced by processing similar to that of the first embodiment.

In this case, data are collectively read from a plurality of memory cells connected to the same word line at the second determination level Vj2 and the results are stored in the sense latch circuit 120 in a first processing step of the read operation.

It is assumed that the memory cells MC0 to MC7 holding a data string including data for one byte first output from the data input/output terminal group 10 hold data "11", "00", "01", "10", "00", "01", "10" and "11" respectively. Therefore, the data latch circuit DL-L holds data C9h in hexadecimal notation in an area for one byte.

The data collectively read at the second determination level Vj2 are stored in both the data latches DL-L and DL-R from the sense latch SL. At this point of time, the data stored in the data latch DL-L are sequentially output one by one from the data input/output terminal group 10 under control of the control circuit 210. The data stored in the data latch circuits DL-L and DL-R at this point of time correspond to half the data for one sector in the read operation of the conventional two-valued flash memory.

Also in the first processing step of the read operation according to the second modification of the first embodiment, upper bits of four types of data in the memory cells are defined as "0" or "1" by first performing the read operation at the second determination level Vj2.

Referring to FIGS. 13 and 14, data are read at the first determination level Vj1 in the second processing step of the read operation when the data are stored in the data latches DL-L and DL-R from the sense latch SL and the sense latch SL is cleared in the first processing step, and the read data are stored in the sense latch circuit 120. The read data conversion circuit 220 performs an operation between the data held in the sense latch SL and the data held in the data latch DL-R while the data are output from the data latch DL-L and zeros corresponding bit data of the data latch DL-R when bit data of the sense latch SL are "0" and the corresponding bit data of the data latch DL-R are "1" while otherwise changing the bit data of the data latch DL-R to "1". After data change in the data latch DL-R, the sense latch circuit 120 is cleared.

In a third processing step of the read operation, data are read at the third determination level Vj3 and stored in the sense latch circuit 120. The read data conversion circuit 220 performs an operation between the data held in the sense latch SL and the data held in the data latch DL-R and changes bit data of the data latch DL-R only where both bit data are "0".

After data output from the data latch DL-L is terminated, the control circuit 210 starts data output from the data latch DL-R to the data input/output terminal group 10.

Figure 15:
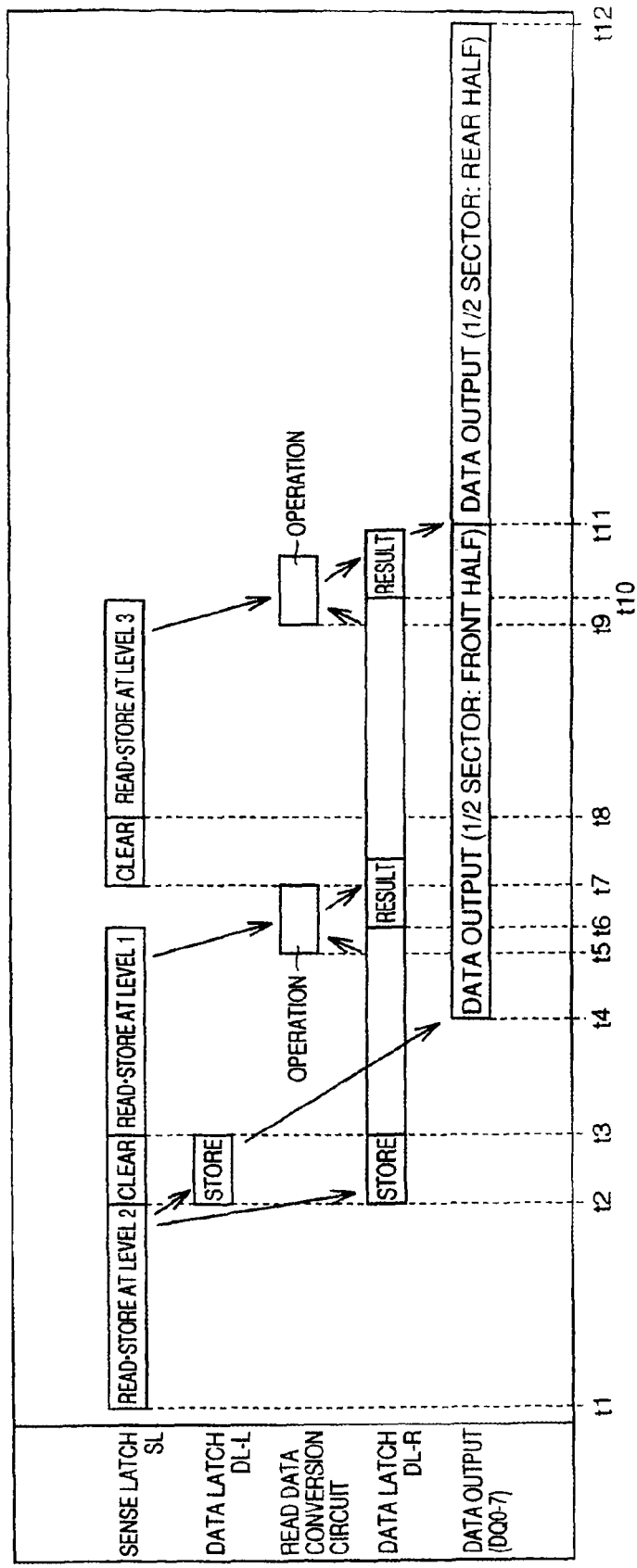
FIG. 15 is a timing chart for illustrating the read operation of a flash memory according to the second modification of the first embodiment.

FIG. 15 is a timing chart for illustrating the read operation of the flash memory according to the second modification of the first embodiment. Referring to FIG. 15, data are read at the second determination level Vj2 and stored in the sense latch circuit 120 at a time t1.

At a time t2, the data held in the sense latch circuit 120 are transferred to the data latches DL-L and DL-R, and the sense latch circuit 120 is cleared.

At a time t3, a read operation based on the first determination level Vj1 is started. At a time t4, output of data for a half sector held in the data latch DL-L is started under control of the control circuit 210.

The read data conversion circuit 220 starts an operation between data held in the sense latch SL and data held in the data latch DL-R at a time t5, and zeros corresponding bit data of the data latch DL-R when bit data of the sense latch SL are "0" and the corresponding bit data of the data latch DL-R are "1" while otherwise changing the bit data of the data latch DL-R to "1".

At a time t7, the sense latch circuit 120 is cleared.

At a time t8, a read operation based on the third determination level Vj3 is started and read data are stored in the sense latch circuit 120.

After completion of the read operation based on the third determination level Vj3, the read data conversion circuit 220 starts an operation between the data held in the sense latch circuit 120 and the data held in the data latch circuit DL-R under control of the control circuit 210 at a time t9, and changes bit data held in the data latch DL-R to "1" only where both bit data are "0".

At a time t11, output of data for the remaining half sector held in the data latch circuit D1-R is started.

At a time t12, data output for one sector is completed.

An effect similar to that of the read operation in the first embodiment is attained also by the aforementioned read operation.

Second Embodiment

Figure 16A:
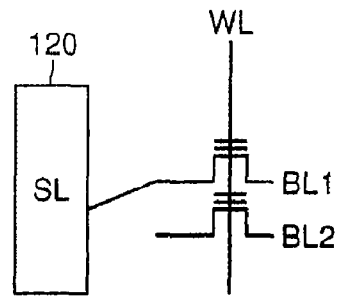
FIGS. 16A and 16B illustrate the concept of a system of switching connection between a sense latch circuit 120 and bit lines in a flash memory according to a second embodiment of the present invention.
Figure 16B:
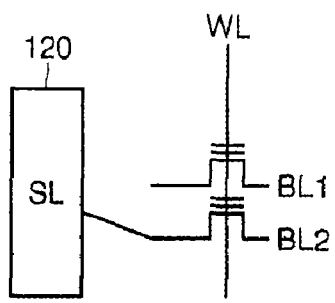

FIGS. 16A and 16B illustrate the concept of a system of switching connection between a sense latch circuit 120 and bit lines BL1 and BL2 of a flash memory according to a second embodiment of the present invention. Referring to FIG. 16A, the bit line BL1 is connected to a sense latch SL corresponding to 1-bit data in the sense latch circuit 120. Referring to FIG. 16B, the bit line BL2 is connected to the aforementioned sense latch SL.

The flash memory according to the second embodiment is basically similar in structure to the flash memory 1000 according to the first embodiment except the structure shown in FIGS. 16A and 16B and a control operation of a control circuit 210.

When the sense latch circuit 120 captures data from the bit lines in a divided manner as to adjacent memory cells while a single word line WL is selected, first to third processing steps can be dividedly performed in parallel with each other every data reading from the memory cells due to the structure shown in FIGS. 16A and 16B, for attaining further speed increase as described below.

Figure 17:
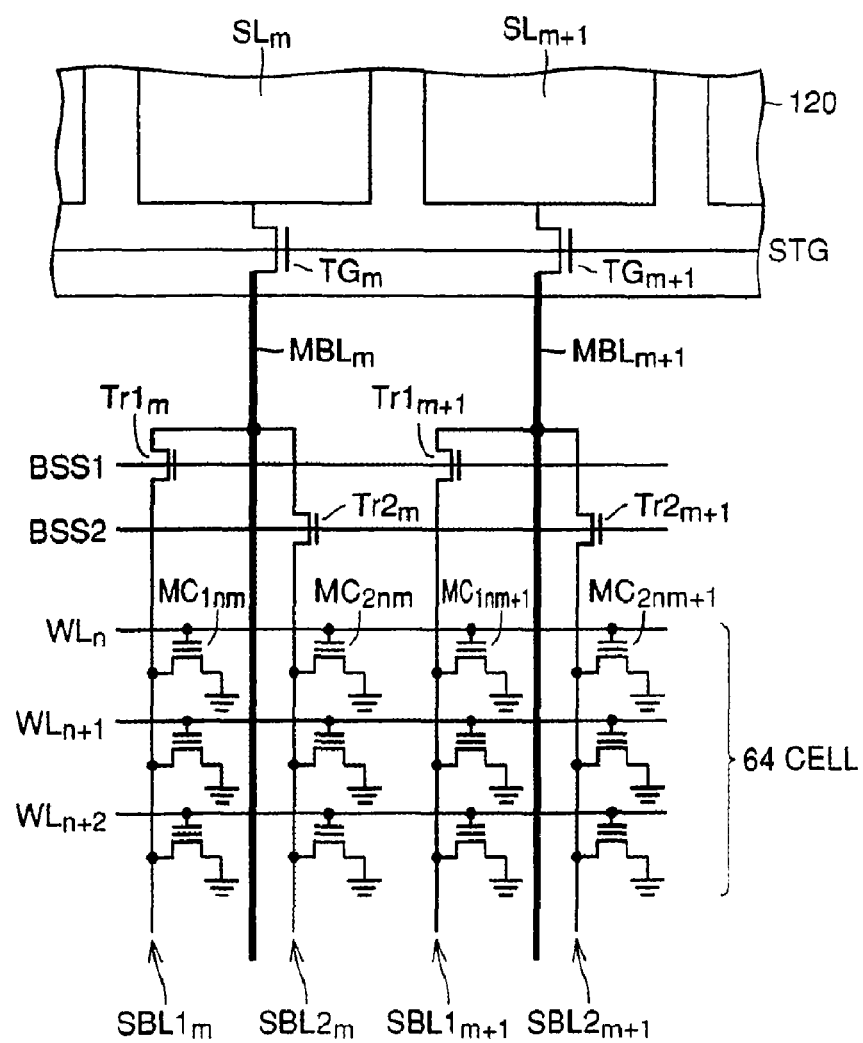
FIG. 17 illustrates a circuit structure for implementing the concept shown in FIGS. 16A and 16B.

FIG. 17 illustrates a circuit structure for implementing the concept shown in FIGS. 16A and 16B. This figures extractively shows a representative structure related to two of sense latches corresponding to respective bit data in the sense latch circuit 120.

Referring to FIG. 17, drains of memory cell transistors MC1nm, MC2nm, MC1nm+1 and Mc2nm+1 having gates connected with a single word line WLn are connected with sub bit lines SBL1m, SBL2m, SBL1m+1 and SBL2m+1 respectively, for example. The memory cell transistors MC1nm, MC2nm, MC1nm+1 and Mc2nm+1 are the so-called floating gate transistors having control gates and floating gates.

The sub bit lines SBL1m and SBL2m are connected with a main bit line MBLm through transistors Tr1m and Tr2m respectively. Gates of the transistors Tr1m and Tr2m are controlled by signals BSS1 and BSS2 respectively.

The sub bit lines SBL1m+1 and SBL2m+1 are connected with a main bit line MBLm+1 through transistors Tr1m+1 and Tr2m+1 respectively. Gates of the transistors Tr1m+1 and Tr2m+1 are controlled by the signals BSS1 and BSS2 respectively.

The main bit line MBLm is connected with a latch circuit SLm corresponding to 1-bit data in the sense latch circuit 120 through a gate transistor TGm having a gate potential controlled by a signal STG. The main bit line MBLm+1 is connected with a latch circuit SLm+1 corresponding to another 1-bit data in the sense latch circuit 120 through a gate transistor TGm+1 having a gate potential controlled by the signal STG. The number of sub bit lines connected to each main bit line is not restricted to two as shown in FIG. 17 but a larger number is employable.

FIGS. 18 to 29, illustrating operations of the flash memory according to the second embodiment, are conceptual diagrams showing data held in data latches DL-L and DL-R and a sense latch SL as well as thresholds of memory cells and determination levels in reading in first to sixth processing steps of a read operation.

Figure 18:
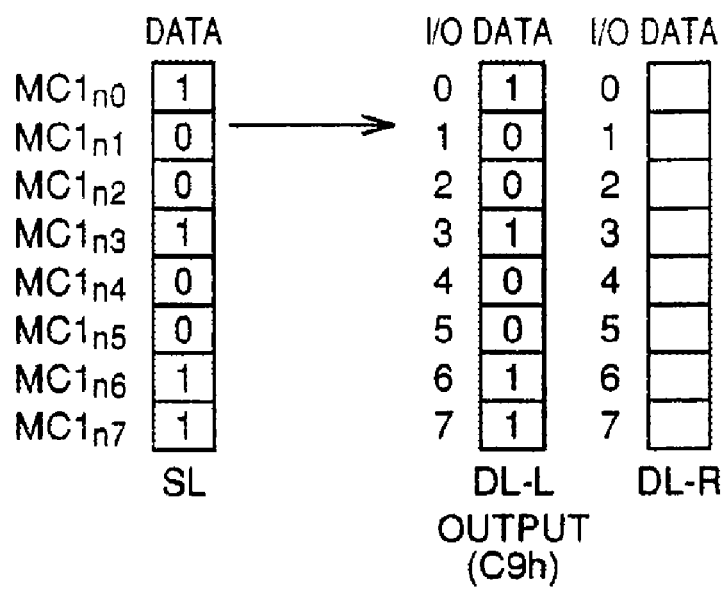
FIG. 18 illustrates data held in respective latches in a first processing step of a read operation.
Figure 19:
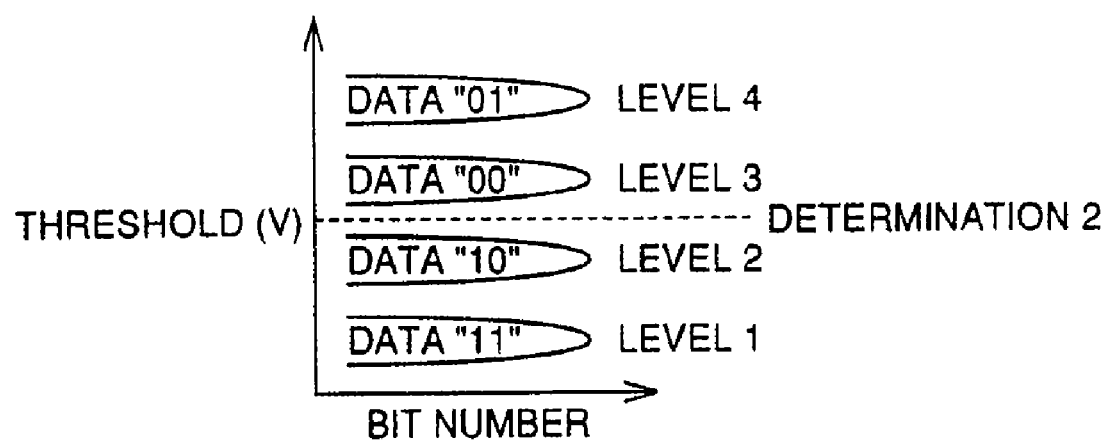
FIG. 19 illustrates thresholds of memory cells and determination levels in the first processing step of the read operation.

FIG. 18 shows data held in the respective latches in the first processing step of the read operation, and FIG. 19 shows thresholds of the memory cells and determination levels in the first processing step of the read operation.

Figures 20, 21:
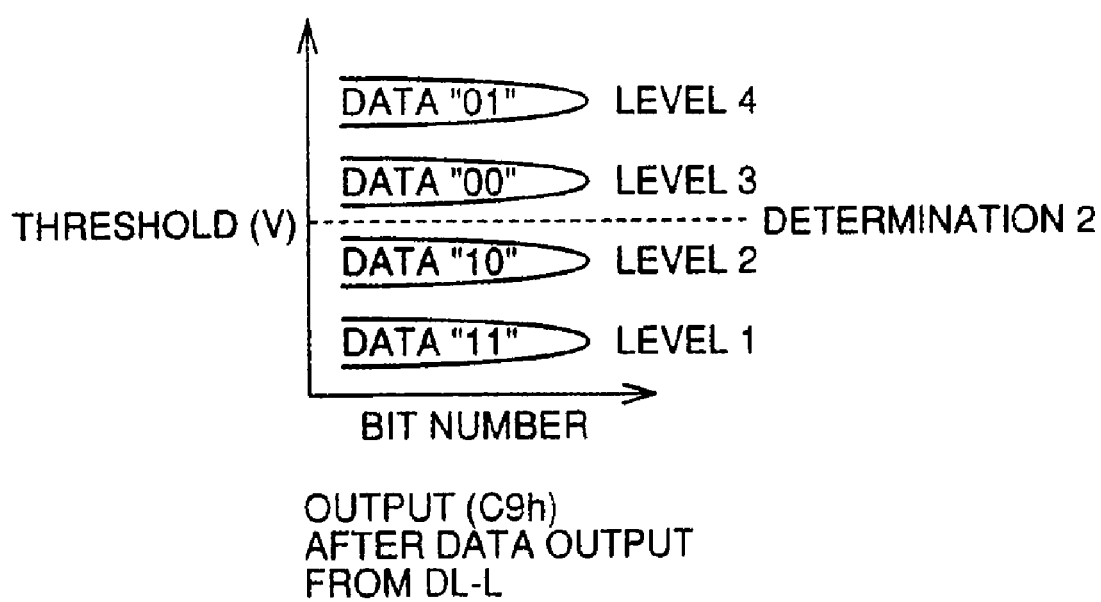
FIG. 20 illustrates data held in the respective latches in a second processing step of the read operation.
FIG. 21 illustrates thresholds of the memory cells and determination levels in the second processing step of the read operation.

FIG. 20 shows data held in the respective latches in the second processing step of the read operation, and FIG. 21 shows thresholds of the memory cells and determination levels in the second processing step of the read operation.

Figures 22, 23:
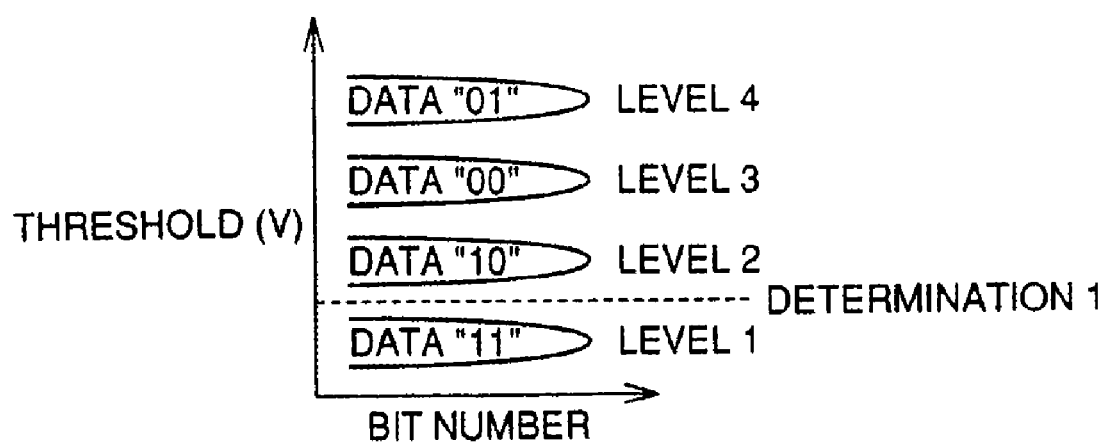
FIG. 22 illustrates data held in the respective latches in a third processing step of the read operation.
FIG. 23 illustrates thresholds of the memory cells and determination levels in the third processing step of the read operation.

FIG. 22 shows data held in the respective latches in the third processing step of the read operation, and FIG. 23 shows thresholds of the memory cells and determination levels in the third processing step of the read operation.

Figures 24, 25:
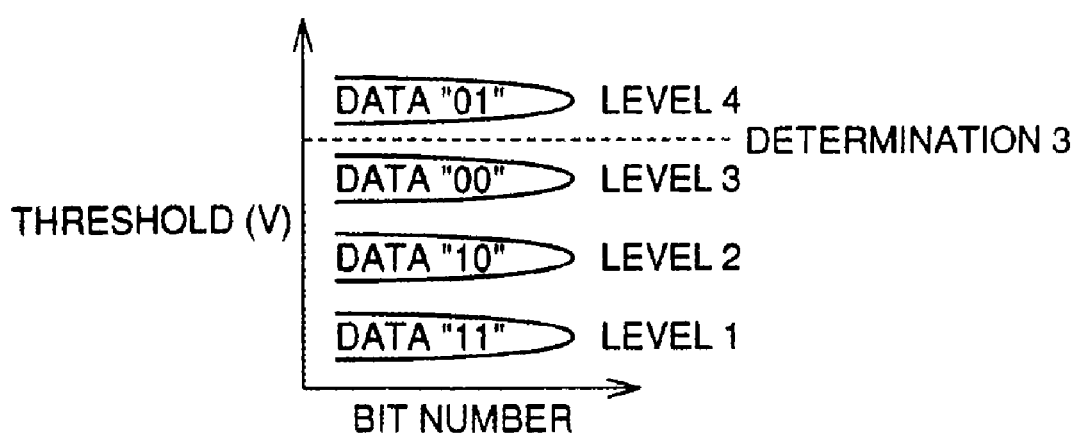
FIG. 24 illustrates data held in the respective latches in a fourth processing step of the read operation.
FIG. 25 illustrates thresholds of the memory cells and determination levels in the fourth processing step of the read operation.

FIG. 24 shows data held in the respective latches in the fourth processing step of the read operation, and FIG. 25 shows thresholds of the memory cells and determination levels in the fourth processing step of the read operation.

Figures 26, 27:
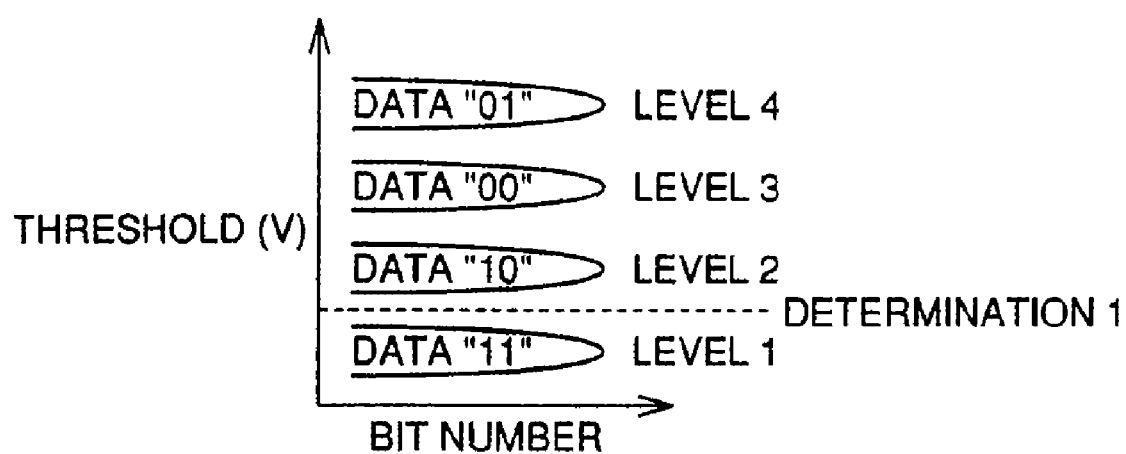
FIG. 26 illustrates data held in the respective latches in a fifth processing step of the read operation.
FIG. 27 illustrates thresholds of the memory cells and determination levels in the fifth processing step of the read operation.

FIG. 26 shows data held in the respective latches in the fifth processing step of the read operation, and FIG. 27 shows thresholds of the memory cells and determination levels in the fifth processing step of the read operation.

Figures 28, 29:
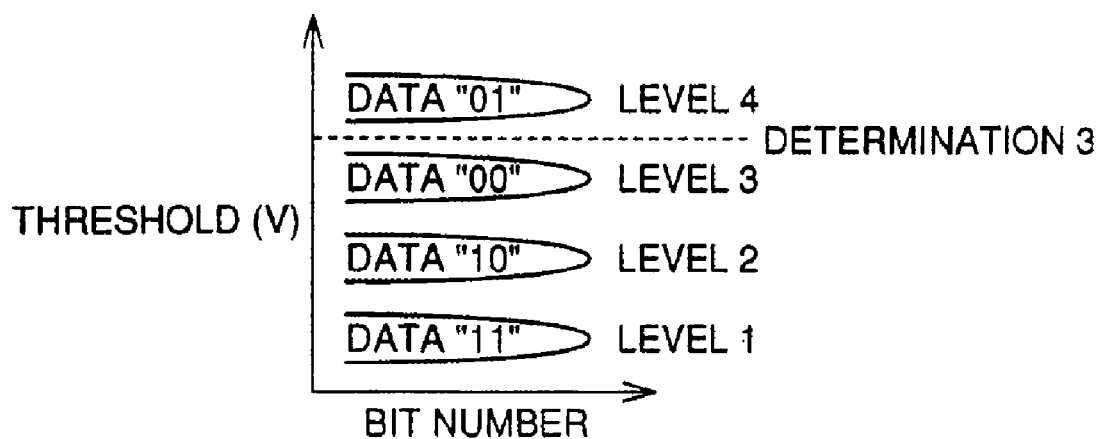
FIG. 28 illustrates data held in the respective latches in a sixth processing step of the read operation.
FIG. 29 illustrates thresholds of the memory cells and determination levels in the sixth processing step of the read operation.

FIG. 28 shows data held in the respective latches in the sixth processing step of the read operation, and FIG. 29 shows thresholds of the memory cells and determination levels in the sixth processing step of the read operation.

Referring to FIGS. 18 and 19, data are collectively read from a plurality of memory cells for 1 KB, for example, connected to the same word line at a second determination level Vj2 and the results are stored in the sense latch circuit 120 in the first processing step of the read operation.

FIG. 18 extractively shows a sense latch SL, included in the sense latch circuit 120, holding data for 1 byte first output from a data input/output terminal group 10 in a read operation for one sector and data latches DL-L and DL-R corresponding thereto. Processing similar to that described below is performed in parallel on data read from the data input/output terminal group 10 subsequently to the data for one byte.

It is assumed that memory cells MC1n0 to MC1n7 connected to the sub bit lines SBL1m and SBL1m+1 selected by the signal BSS1 among the sub bit lines shown in FIG. 17 for holding a data string including the data for one byte first output from the data input/output terminal group 10 hold data "11", "01", "00", "10", "01", "00", "10" and "11" respectively. Referring to FIG. 18, therefore, the sense latch circuit 120 holds data C9h in hexadecimal notation in an area for one byte.

The data collectively read at the second determination level Vj2 are stored in the data latch DL-L from the sense latch SL. At this time, the data stored in the data latch DL-L are sequentially output byte by byte from the data input/output terminal group 10 under control of a control circuit 210. The data stored in the data latch DL-L at this point of time correspond to ¼ those for one sector in the read operation of the conventional two-valued flash memory.

Thus, the read operation is first performed at the second determination level Vj2 in the first processing step of the read operation so that four types of data in the memory cells are defined as "0" or "1" as shown in FIG. 19. In other words, it follows that "0" or "1" of the upper bits of the data stored in the memory cells MC1n0 to MC1n7 are defined.

Referring to FIGS. 20 and 21, data are read from memory cells MC2n0 to MC2n7 connected with the sub bit lines SBL2m and SBL2m+1 selected by the signal BSS2 among the sub bit lines shown in FIG. 17 at the second determination level Vj2 in the second processing step of the read operation when the data are stored in the data latch DL-L from the sense latch SL in the first processing step, and the read data are stored in the sense latch circuit 120.

It is assumed that the memory cells MC2n0 to MC2n7 also hold data "11", "01", "00", "10", "01", "00", "10" and "11" respectively. Referring to FIG. 20, therefore, the sense latch circuit 120 also holds data C9h in hexadecimal notation in an area for one byte.

In other words, the data are transferred from the sense latch SL to the data latch DL-R while data output is performed from the data latch circuit DL-L. Following data output from the data latch DL-L, the data are output from the data latch DL-R.

Similar processing is performed in parallel also as to memory cells, other than the memory cells MC2n0 to MC2n7, connected to the same word line and sub bit lines selected by the signal BSS2 among the sub bit lines shown in FIG. 17.

Referring to FIGS. 22 and 23, data are read at a first determination level Vj1 in the third processing step of the read operation when the data are stored in the data latch DL-L from the sense latch SL and the sense latch SL is cleared in the second processing step, and the read data are stored in the sense latch circuit 120.

Then, data are transferred from the sense latch SL to the data latch DL-L while data output is performed from the data latch circuit DL-R. After data transfer to the data latch DL-L, the sense latch circuit 120 is cleared.

Referring to FIGS. 24 and 25, data are read from the memory cells MC1n0 to MCC1n7 at a third determination level Vj3 and stored in the sense latch circuit 120 in the fourth processing step of the read operation. A read data conversion circuit 220 performs an operation between the data held in the sense latch circuit SL and the data held in the data latch DL-L and changes bit data of the data latch DL-L to "1" only where both bit data are "0". At this time, the data latch DL-R is in the process of outputting data.

After data output from the data latch DL-R is terminated, the control circuit 210 starts data output from the data latch DL-L to the data input/output terminal group 10.

Referring to FIGS. 26 and 27, data are read from the memory cells MC2n0 to MC2n0 at the first determination level Vj1 in the fifth processing step of the read operation when the data are stored in the data latch DL-L from the sense latch SL and the sense latch SL is cleared in the fourth processing step, and the read data are stored in the sense latch circuit 120.

Then, data are transferred from the sense latch SL to the data latch DL-R in the process of data output from the data latch DL-L. After data transfer to the data latch DL-R, the sense latch circuit 120 is cleared.

Referring to FIGS. 28 and 29, data are read from the memory cells MC2n0 to MC2n7 at the third determination level Vj3 and stored in the sense latch circuit 120 in the sixth processing step of the read operation.

The read data conversion circuit 220 performs an operation between the data held in the sense latch SL and the data held in the data latch DL-R, and changes bit data of the data latch DL-R to "1" only where both bit data are "0". At this time, the data latch DL-L is in the process of data output.

After data output from the data latch DL-L is terminated, the control circuit 210 starts data output from the data latch DL-R to the data input/output terminal group 10.

In the four-valued flash memory according to the second embodiment, therefore, a time for obtaining the result of determination at the second determination level Vj2 for data for a quarter sector may elapse before data output after input of a read command. Thus, the read time can be further reduced as compared with the first embodiment.

Figure 30:
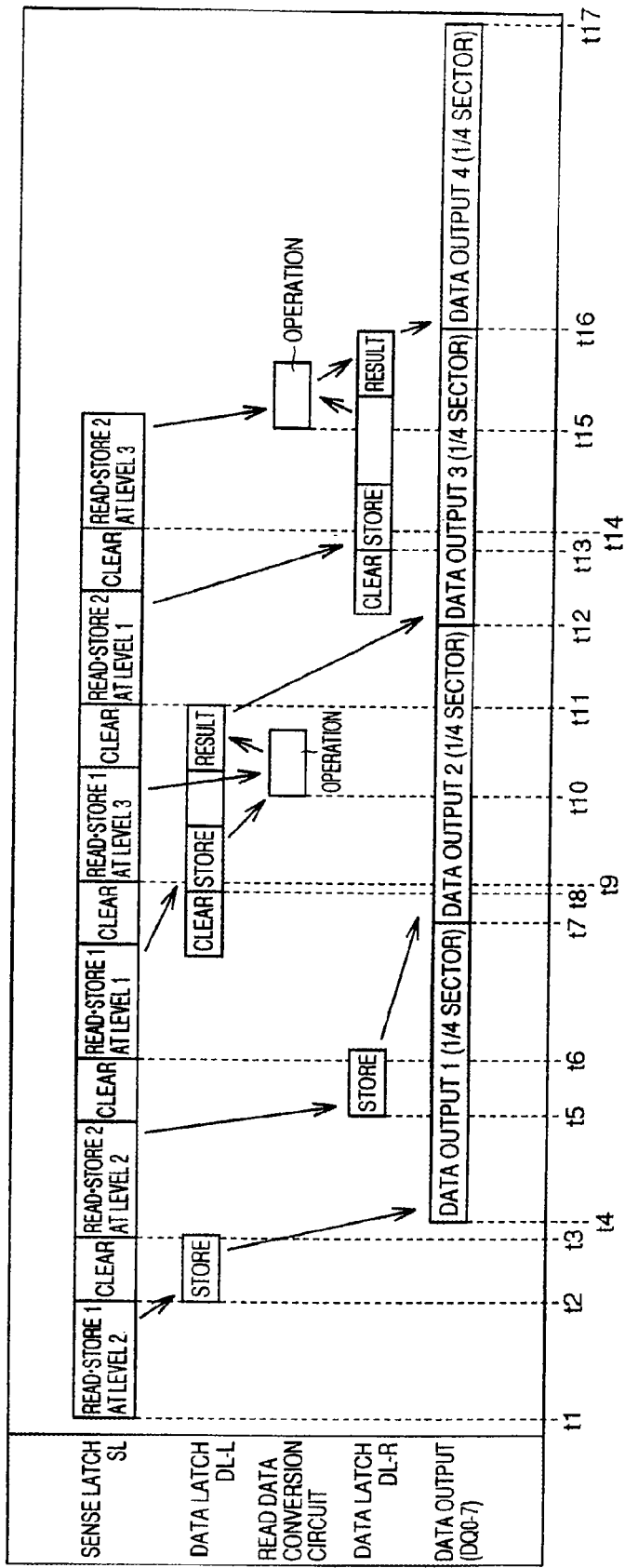
FIG. 30 is a timing chart for illustrating a read operation of the flash memory according to the second embodiment of the present invention.

FIG. 30 is a timing chart for illustrating the read operation of the flash memory according to the second embodiment.

Referring to FIG. 30, data are first read from the memory cells MC1n0 to MC1n7 etc. at the second determination level Vj2 and stored in the sense latch circuit 120 at a time t1.

At a time t2, the data held in the sense latch circuit 120 are transferred to the data latch DL-L, and the sense latch circuit 120 is cleared.

At a time t3, a read operation from the memory cells MC2n0 to MC2n7 etc. is started at the second determination level Vj2 and the read data are stored in the sense latch circuit 120.

At a time t4, data output from the data latch DL-L is started. At a time t5, data read from the memory cells MC2n0 to MC2n7 etc. at the second determination level Vj2 are stored in the data latch DL-R.

At a time t6, a read operation from the memory cells MC1n0 to MC1n7 etc. is started on the basis of the first determination level Vj1. At a time t7, output of read data from the memory cells MC2n0 to MC2n7 etc. for a quarter sector held in the data latch DL-R is started under control of the control circuit 210.

At a time t8, the data read on the basis of the first determination level Vj1 and held in the sense latch circuit 120 are stored in the data latch DL-L. The sense latch circuit 120 is cleared.

At a time t9, a read operation from the memory cells MC1n0 to MC1n7 etc. is started on the basis of the third determination level Vj3, and the read data are stored in the sense latch circuit 120.

On the basis of the read data from the memory cells MC1n0 to MC1n7 etc. based on the third determination level Vj3, the read data conversion circuit 220 performs an operation between the data held in the sense latch circuit 120 and the data held in the data latch circuit DL-L under control of the control circuit 210 and changes bit data held in the data latch DL-L to "1" only where both bit data are "0".

At a time t11, a read operation is started from the memory cells MC2n0 to MC2n7 etc. on the basis of the first determination level Vj1. At a time t12, output of the read data from the memory cells MC1n0 to MC1n7 etc. for a quarter sector held in the data latch DL-L is started under control of the control circuit 210.

At a time t13, the data read on the basis of the first determination level Vj1 and held in the sense latch circuit 120 are stored in the data latch DL-R. The sense latch circuit 120 is cleared.

At a time t14, a read operation from the memory cells MC2n0 to MC2n7 etc. is started on the basis of the third determination level Vj3 and the read data are stored in the sense latch circuit 120. On the basis of the data read from the memory cells MC2n0 to MC2n7 etc. on the basis of the third determination level Vj3, the read data conversion circuit 220 performs an operation between the data held in the sense latch circuit 120 and the data held in the data latch circuit DL-R under control of the control circuit 210 and changes bit data held in the data latch DL-R to "1" only where both bit data are "0" at a time t15.

At a time t16, output of data for a quarter sector held in the data latch DL-R is started. At a time t17, output of data for one sector is completed.

While the data strings read at the times t1 are t3 are output, the read operations of the data strings to be subsequently output are completed as hereinabove described. Thus, a delay time can be reduced when outputting read data from four-valued memory cells.

Third Embodiment

An exemplary data write operation in the structure of the flash memory 1000 according to the first embodiment is now described as a third embodiment of the present invention.

FIGS. 31 to 36, illustrating operations of the third embodiment of the present invention, are conceptual diagrams showing data held in data latches DL-L and DL-R and a sense latch SL as well as thresholds of memory cells and determination levels in writing in first to third processing steps of a write operation.

Figure 31:
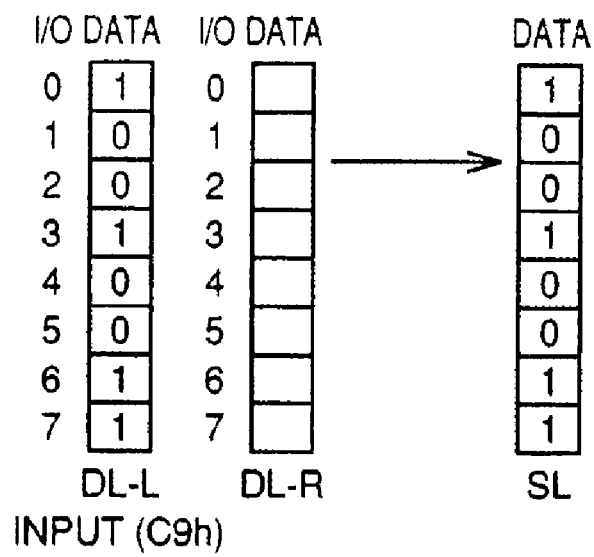
FIG. 31 illustrates data held in respective latches in a first processing step of a read operation in a flash memory according to a third embodiment of the present invention.
Figure 32:
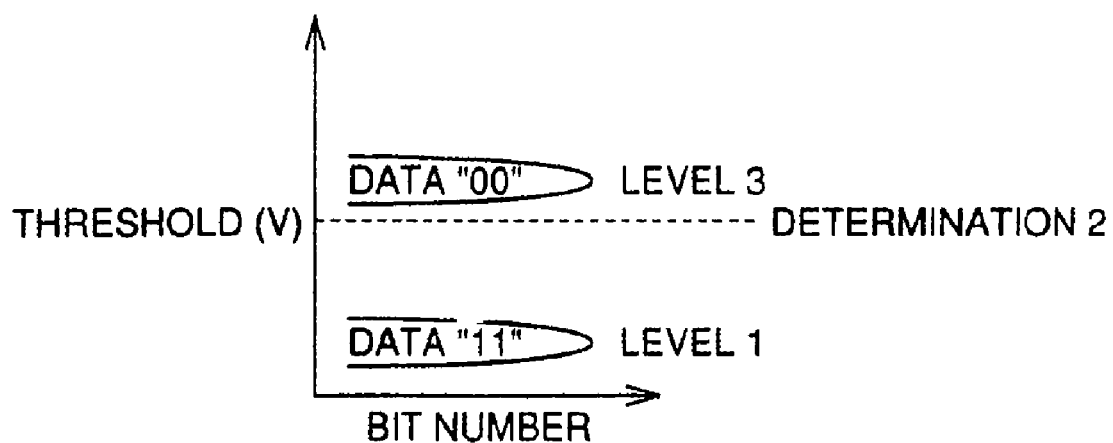
FIG. 32 illustrates thresholds of memory cells and determination levels in the first processing step of the read operation.

FIG. 31 shows data held in the respective latches in the first processing step of the write operation, and FIG. 32 shows thresholds of the memory cells and determination levels in the first processing step of the write operation.

Figures 33, 34:
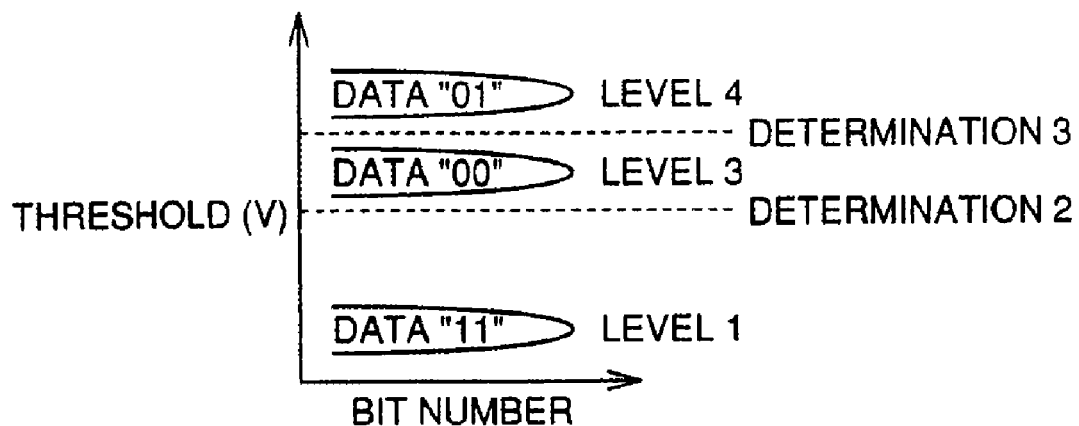
FIG. 33 illustrates data held in the respective latches in a second processing step of the read operation.
FIG. 34 illustrates thresholds of the memory cells and determination levels in the second processing step of the read operation.

FIG. 33 shows data held in the respective latches in the second processing step of the write operation, and FIG. 34 shows thresholds of the memory cells and determination levels in the second processing step of the write operation.

Figures 35, 36:
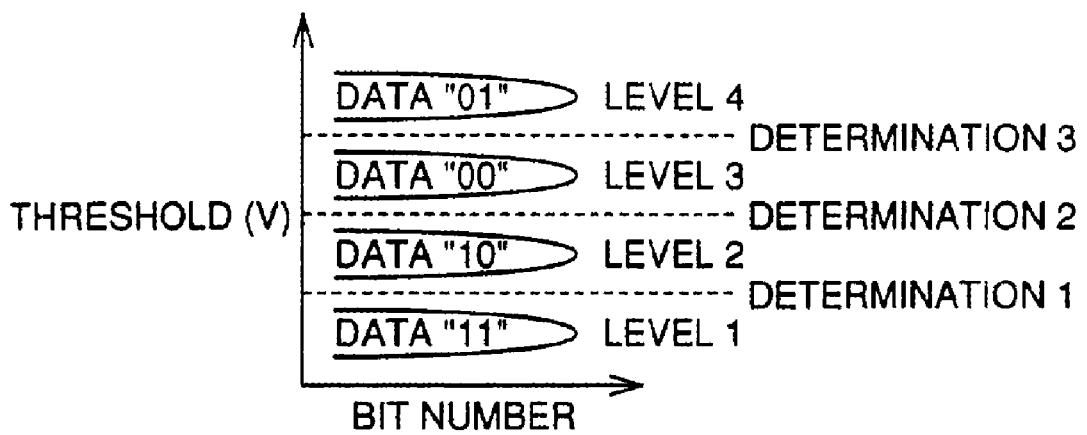
FIG. 35 illustrates data held in the respective latches in a third processing step of the read operation.
FIG. 36 illustrates thresholds of the memory cells and determination levels in the third processing step of the read operation.

FIG. 35 shows data held in the respective latches in the third processing step of the write operation, and FIG. 36 shows thresholds of the memory cells and determination levels in the third processing step of the write operation.

In a memory cell block subjected to the write operation, all memory cells are set to thresholds corresponding to data "11".

Referring to FIGS. 31 and 32, input data (for a half sector: C9h in hexadecimal notation) are stored in the data latch DL-L and transferred to the sense latch SL in the first processing step of the write operation. Writing up to a threshold corresponding to level 3 is performed on the basis of a second determination level Vj2. During the write operation at the second determination level Vj2, data for the remaining half sector (93h in hexadecimal notation) are stored in the data latch DL-R.

Referring to FIGS. 33 and 34, a write data conversion circuit 230 performs an operation on a corresponding set of bit data as to the data contained in the data latches DL-R and DL-L thereby zeroing only bit data of the sense latch SL corresponding to such data that bits held in the data latch DL-L are "0" and bits held in the data latch DL-R are "1" in the second processing step of the write operation.

As shown in FIG. 33, the sense latch SL holds data "10110111" after this operation. On the basis of the data thus held in the sense latch SL, data are written in memory cells MC0 to MC7 corresponding to the bits of the sense latch SL respectively. The memory cells MC0 to MC7 are connected to the same word line WL. A third determination level Vj3 is employed as the determination value for a verify operation.

At this time, the data are written in memory cells corresponding to data "0" in the sense latch SL. Therefore, data (corresponding to data "01") of level 4 are written in the memory cells MC1 and MC4 corresponding to the first and fourth bits of the sense latch SL respectively.

The data are written through an FN (Fowler-Nordheim) tunnel current by applying a high voltage to the word line WL.

A voltage below the word line voltage is applied to a bit line BL corresponding to bits of bit data "1" in the sense latch SL, in order to relax a voltage applied from the word line WL. Consequently, data are written in only memory cells connected to a bit line BL corresponding to bit data "0" held in the sense latch SL.

Referring to FIGS. 35 and 36, the write data conversion circuit 230 performs an operation of the data held in the data latches DL-R and DL-R in the third step of the write operation, so that "0" is written in bits of the sense latch SL corresponding to such a set of data that the bit data held in the data latch DL-L are "1" and the bit data held in the data latch DL-R are "0". The determination value for the verify operation is changed to a first determination level Vj1, and data are written only in the memory cells MC3 and MC6.

As clearly understood from the above description, data are temporarily written as the level 3 also in the memory cells to be essentially subjected to data writing as level 4 in the step shown in FIGS. 31 and 32. All memory cells subjected to writing as the level 4 are included in the memory cells subjected to writing as the level 3 in FIGS. 31 and 32.

Similarly, memory cells subjected to writing as level 2 are included in memory cells having thresholds of level 1 immediately before this step. In other words, it follows that the memory cells subjected to writing of levels 4 and 3 and those subjected to writing of levels 2 and 1 are separated when performing the writing shown in FIGS. 31 and 32.

In the four-valued flash memory according to the third embodiment, therefore, the write operation is already started when data for a half sector are input in the data latch DL-R after input of a write command, and hence the write time can be reduced.

The effect of such reduction is particularly remarkable when the condition of the following expression (2) is satisfied:

$$\{\text{sector size(byte)} \times \text{(input time per byte)} \times \frac{1}{2}\} \geq \{\text{write time of level 3}\} \quad (2)$$

Figure 37:
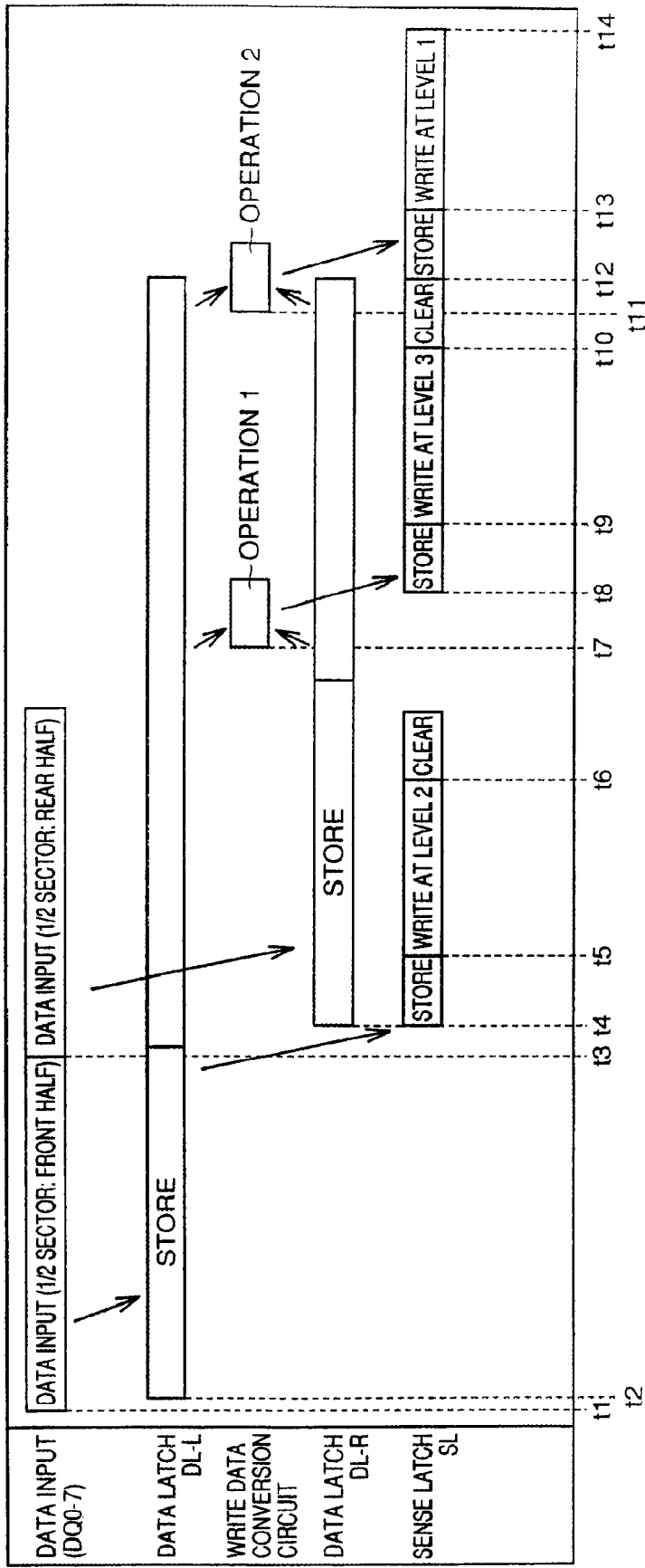
FIG. 37 is a timing chart for illustrating a write operation of the flash memory according to the third embodiment.

FIG. 37 is a timing chart for illustrating the write operation of the flash memory according to the third embodiment.

Referring to FIG. 37, input of data (data of upper bits) for a half sector is started at a time t1, and storage in the data latch DL-L is started from a time t2.

When data input for the front half sector is terminated, the data stored in the data latch DL-L are transferred to the sense latch SL at a time t3.

Input of data (data of lower bits) for a half sector is started at the time t3, and storage in the data latch DL-R is started from a time t4.

At a time t5, a write operation is performed in response to the second determination level Vj2 on the basis of the data stored in the sense latch SL. When the write operation at the second determination level Vj2 is terminated at a time t6, the sense latch SL is cleared.

The write data conversion circuit 230 starts an operation on the data contained in the data latches DL-R and DL-L as to a corresponding set of data at a time t7, and zeros only bit data of the sense latch SL corresponding to such data that bits held in the data latch DL-L are "0" and bits held in the data latch DL-R are "1" from a time t8.

At a time t9, a write operation is performed in response to the third determination level Vj3 on the basis of the data stored in the sense latch SL.

When the write operation at the third determination level Vj3 is terminated at a time t10, the sense latch SL is cleared.

The write data conversion circuit 230 starts an operation of the data held in the data latches DL-R and DL-L at a time t11, and writes "0" in bits of the sense latch SL corresponding to such a set of data that bit data held in the data latch DL-L are "1" and bit data held in the data latch DL-R are "0" from a time t12.

At a time t13, a write operation is performed in response to the first determination level Vj1 on the basis of the data stored in the sense latch SL.

While the data string input at the time t1 is written, storage of the data string to be subsequently written is completed as hereinabove described. Thus, a delay time can be reduced when writing data in four-valued memory cells.

Modification of Third Embodiment

In the write operation according to the third embodiment, reduction of the write time is enabled. On the other hand, the number of data latches employed in the write operation can be reduced.

Figures 38, 39:
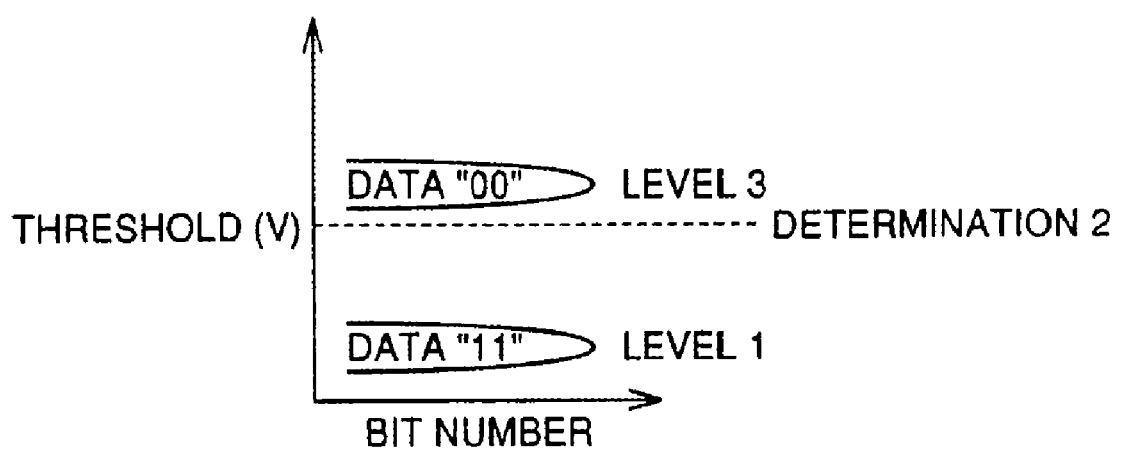
FIG. 38 illustrates data held in the respective latches in a second processing step of the write operation.
FIG. 39 illustrates thresholds of memory cells and determination levels in a read operation in the second processing step of the write operation.

FIGS. 38 and 39, illustrating operations of a modification of the third embodiment of the present invention, are conceptual diagrams showing data held in the data latches DL-L and DL-R and the sense latch SL as well as thresholds of the memory cells and determination levels in reading in a second processing step of a write operation.

FIG. 38 shows data held in the respective latches in the second processing step of the write operation, and FIG. 39 shows thresholds of the memory cells and determination levels in the second processing step of the write operation.

First, data are written in memory cells in a first processing step of the write operation, similarly to FIGS. 31 and 32.

Then, data of a remaining half sector are captured in the data latch DL-L again in the second processing step of the write operation. On the other hand, the data written in the memory cells in the first processing step are read at the second determination level Vj2 and stored in the sense latch SL. The write data conversion circuit 230 performs an operation similar to that in FIGS. 33 and 34 between the data held in the data latch DL-L and the data held in the sense latch SL, and rewrites the contents of the sense latch SL. A write operation responsive to the third determination level Vj3 is executed on the basis of the data in the sense latch SL.

Then, the data written in the memory cells are read at the second determination level Vj2 again and stored in the sense latch SL. The write data conversion circuit 230 performs an operation similar to that in FIGS. 35 and 36 between the data held in the data latch DL-L and the data held in the sense latch SL, and rewrites the contents of the sense latch SL. A write operation responsive to the first determination level Vj1 is executed on the basis of the data in the sense latch SL.

The number of data latches necessary for data writing can be reduced due to the aforementioned operations.

Fourth Embodiment

A fourth embodiment of the present invention provides write processing capable of simultaneously performing writing at the determination level Vj3 described with reference to FIGS. 33 and 34 and writing at the determination level Vj1 described with reference to FIGS. 35 and 36 with reference to the third embodiment, in order to further reduce the time required for the write operation in the third embodiment.

In the write processing of the fourth embodiment, write inhibit voltages are applied to drains of memory cells not subjected to data writing when writing data in threshold levels 4, 3 and 2 at determination levels Vj3, Vj2 and Vj1, as shown in Table 1.

TABLE 1

| Write Mode | | Gate Voltage (Word Line Voltage) | Drain Voltage | Source Voltage |
|---|---|---|---|---|
| Writing at Level 4 | write bit | VW4 (e.g., 17 V) | V1 (e.g., 0 V) | open |
| | write inhibit bit | VW4 (e.g., 17 V) | V3 (e.g., 6 V) | open |
| Writing at Level 3 | write bit | VW3 (e.g., 16 V) | V1 (e.g., 0 V) | open |
| | write inhibit bit | VW3 (e.g., 16 V) | V3 (e.g., 6 V) | open |
| Writing at Level 2 | write bit | VW2 (e.g., 15 V) | V1 (e.g., 0 V) | open |
| | write inhibit bit | VW2 (e.g., 15 V) | V3 (e.g., 6 V) | open |

Figure 40:
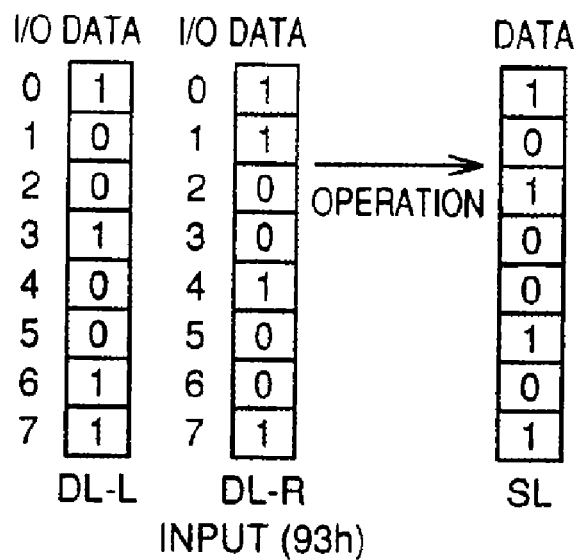
FIG. 40 illustrates data held in respective latches in a second processing step of a write operation in a flash memory according to a fourth embodiment of the present invention.
Figure 41:
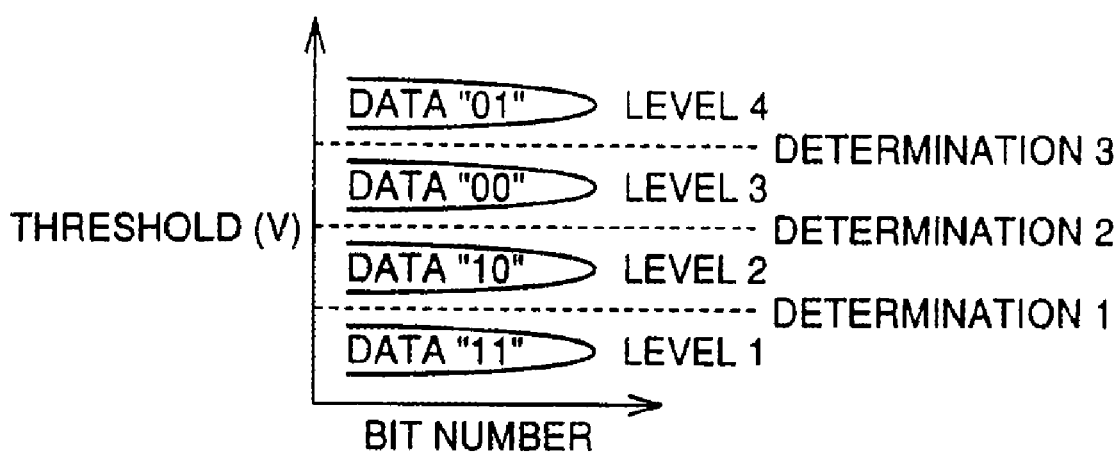
FIG. 41 illustrates thresholds of memory cells and determination levels in the second processing of the write operation.

FIGS. 40 and 41, illustrating operations of the fourth embodiment of the present invention, are conceptual diagrams showing data held in data latches DL-L and DL-R and a sense latch SL as well as thresholds of memory cells and determination levels in writing in a second processing step of a read operation.

FIG. 40 shows data held in the respective latches in the second processing step of the write operation, and FIG. 41 shows thresholds of the memory cells and determination levels in the second processing step of the write operation.

First, data are written in memory cells on the basis of a second determination level Vj2 in a first processing step of the write operation, similarly to FIGS. 31 and 32.

Then, data for a remaining half sector are captured in the data latch DL-R in the second processing step of the write operation. A read data conversion circuit 230 performs an operation as to the data contained in the data latches DL-R and DL-L on a corresponding set of bit data, thereby zeroing corresponding bit data of the sense latch SL only when bit data held in the data latch DL-L and the bit data held in the data latch DL-R are different from each other. This corresponds to inversion of results of an exclusive OR operation of the respective bit data held in the data latches DL-R and DL-L.

On the basis of the values of the sense latch SL rewritten in the aforementioned manner, data are written in memory cells to satisfy conditions in Table 2. In the memory cells subjected to data writing, drain voltages are changed as shown in Table 2 in response to whether the written data are "01" or "10".

TABLE 2

| Write Mode | | Gate Voltage (Word Line Voltage) | Drain Voltage | Source Voltage |
|---|---|---|---|---|
| Writing at Level 4 | write bit sense latch: "0" data latch: "0" in DL-L, "1" in DL-R | VW4 (e.g., 17 V) | V1 (e.g., 0 V) | open |
| | write inhibit bit | VW4 (e.g., 17 V) | V3 (e.g., 6 V) | open |
| Writing at Level 2 | write bit sense latch: "0" data latch: "1" in DL-L, "0" in DL-R | VW4 (e.g., 17 V) | V2 (e.g., 2 V) | open |
| | write inhibit bit | VW4 (e.g., 17 V) | V3 (e.g., 6 V) | open |

The relation voltage V1<voltage V2<voltage V3 holds in Table 2. If set values of threshold voltages of memory cell transistors are different, the values of the voltages V2 and V3 may be changed while maintaining the aforementioned relation between the voltages V1, V2 and V3.

The time required for data writing can be further reduced due to the aforementioned operations.

Fifth Embodiment

The aforementioned description has been made on data read and write operations with reference to data of two bits, i.e., four values held in a single memory cell.

Assuming that $n \geq m+1$ and $m \geq 0$, where n and m represent natural numbers, one bit (e.g., the most significant bit) among n bits can be defined in reading at a $2^{n-1}$-th determination level in n-bit data held in each memory cell when each memory cell holds data of $2^n$ values and constant relation holds for association with write data and levels of thresholds of memory cell transistors corresponding to the write data.

Further, another bit among n bits can be defined by read processing at two determination levels, i.e., $2^{n-2}$-th and $(2^{n-1}+2^{n-2})$-th determination levels.

In addition, still another bit among n bits can be defined by read processing at $2^m$ levels such as a $\Sigma(2^{n-1-m+Y})$-th determination level ($\Sigma$: the sum from Y=0 to Y=m as to Y; $m \geq 0$ and $n \geq m+1$).

Finally, a further bit among n bits can be defined by read processing at first, third, fifth, . . . , $2^{n-1}$-th determination levels.

Figure 42:
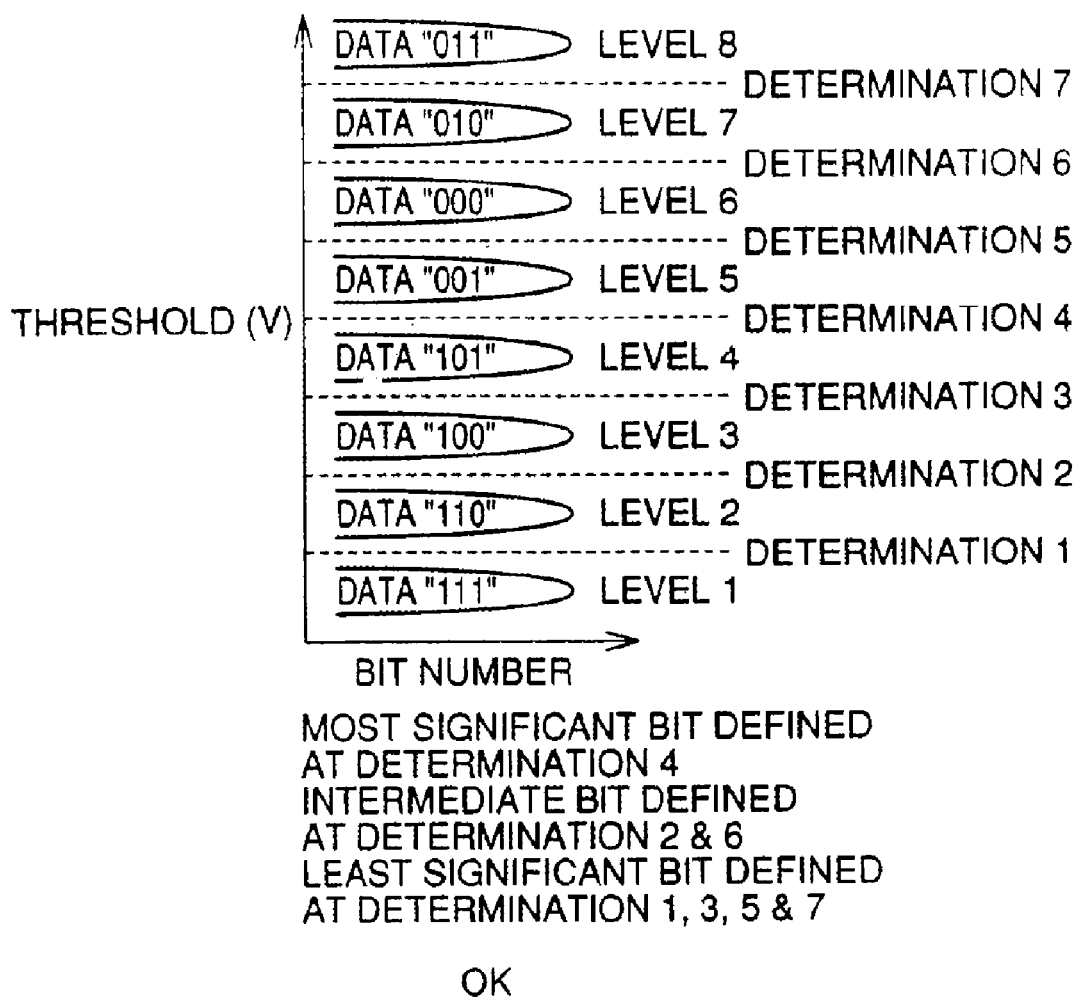
FIG. 42 illustrates association between write data writable in the procedure of the first embodiment and threshold levels of the memory cell transistors.

FIG. 42 illustrates association between write data allowing reading in the aforementioned manner and threshold levels of memory cell transistors corresponding to the write data in the case of writing data of three bits, i.e., eight values in a single memory cell.

The most significant bit is defined in reading at a fourth determination level, an intermediate bit is defined in reading at second and sixth determination levels, and the least significant bit is defined in reading at first, third, fifth and seventh determination levels.

Figure 43:
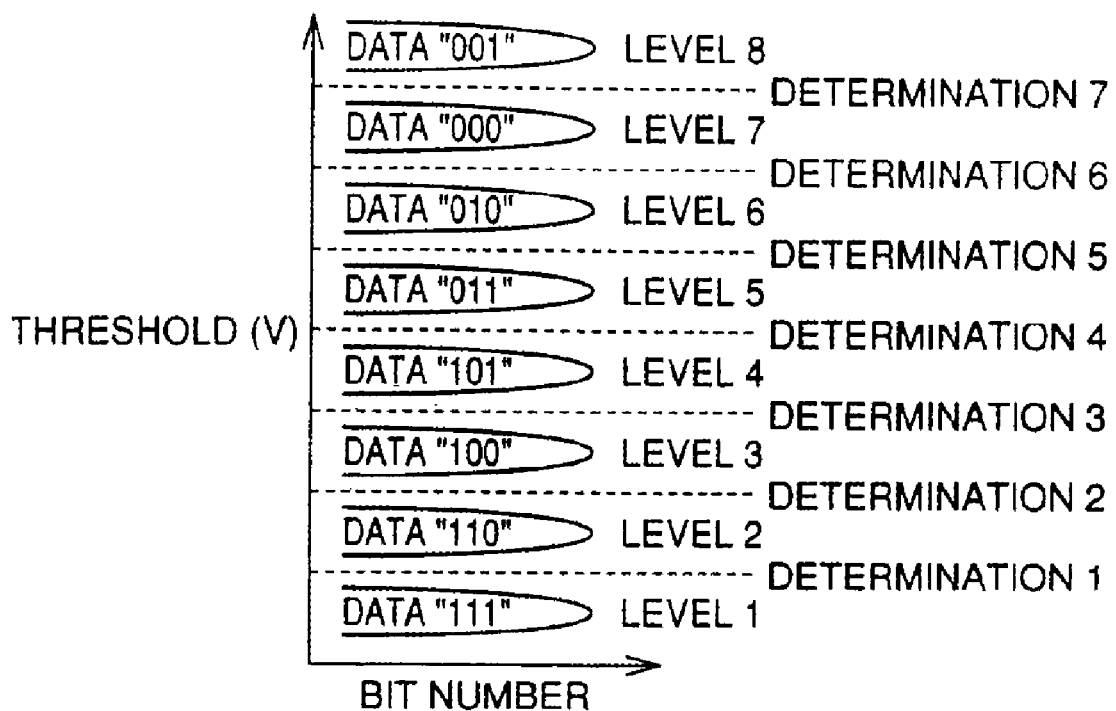
FIG. 43 illustrates association between write data unwritable in the procedure of the first embodiment and threshold levels of the memory cell transistors.

FIG. 43 illustrates association between write data allowing no reading in the aforementioned manner and threshold levels of memory cell transistors corresponding to the write data in the case of writing data of three bits, i.e., eight values in a single memory cell.

Although the most significant bit is defined in reading at a fourth determination level, an intermediate bit is not defined in reading at second and sixth determination levels.

[Read Operation of 16-Valued Data]

A read operation is now described with reference to 16 (=$2^n$; n=4) values. As described below, the flash memory according to this embodiment is similar in structure to the flash memory 1000 according to the first embodiment except that four data latch circuits DL-1 to DL-4 are provided in place of the two data latch circuits DL-L and DL-R and that a control circuit 210 performs different operations.

FIGS. 44 to 81, illustrating operations of the fifth embodiment of the present invention, are conceptual diagrams showing data held in the data latches DL-1 to DL-4 and a sense latch SL as well as thresholds of memory cells and determination levels in reading in first to nineteenth processing steps of the read operation.

Figure 45:
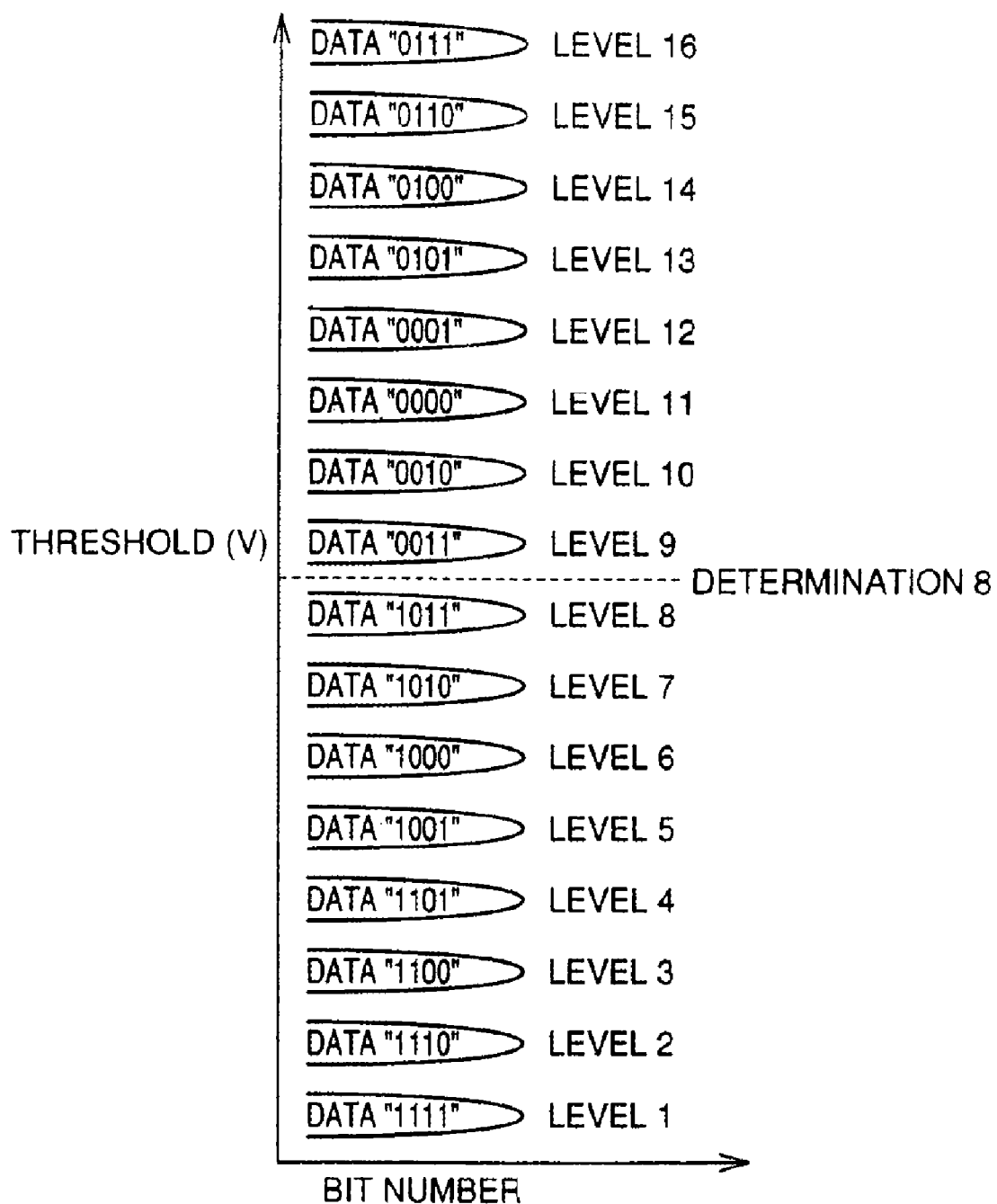
FIG. 45 illustrates thresholds of memory cells and determination levels in the first processing step of the read operation in the fifth embodiment.

FIG. 44 shows data held in the respective latches in the first processing step of the read operation, and FIG. 45 shows thresholds of the memory cells and determination levels in the first processing step of the read operation.

Referring to FIGS. 44 and 45, data are collectively read from a plurality of memory cells for 1 KB, for example, connected to the same word line at an eighth (=$2^{n-1}$; n=4) determination level Vj8 and stored in a sense latch circuit 120 in the first processing step of the read operation.

FIG. 44 extractively shows a sense latch SL holding data for two bytes first output from a data input/output terminal group 10 in a read operation for one sector in the sense latch circuit 120 and data latches DL-1 to DL-4 corresponding thereto. Processing similar to that described below is performed in parallel also on data read from the data input/output terminal group 10 subsequently to the data for two bytes.

It is assumed that memory cells MC0 to MC15 holding a data string containing data for one byte first output from the data input/output terminal group 10 hold data "0111", "0110", "0100", "0101", "0001", "0000", "0010", "0011", "1011", "1010", "1000", "1001", "1101", "1100", "1110" and "1111" respectively.

It is also assumed that write data corresponding to thresholds of the memory cells from higher level 16 to lower level 1 respectively are "0111", "0110", "0100", "0101", "0001", "0000", "0010", "0011", "1011", "1010", "1000", "1001", "1101", "1100", "1110" and "1111", as shown in FIG. 45.

Therefore, the sense latch circuit 120 holds data 00h and FFh in hexadecimal notation in an area for two bytes in FIG. 44.

The data collectively read at the eighth determination level Vj8 are stored in the data latch DL-1 from the sense latch SL. At this point of time, the data stored in the data latch DL-1 are sequentially output from the data input/output terminal group 10 byte by byte (or in 2-byte groups) under control of the control circuit 210.

Thus, the read operation is first performed at the eighth determination level Vj8 in the first processing step of the read operation since 16 types of data in the memory cells are defined as "0" or "1" in reading at this level, as shown in FIG. 45. In other words, it follows that the most significant bits of the data stored in the memory cells MC0 to MC15 are defined as "0" or "1".

Figure 47:
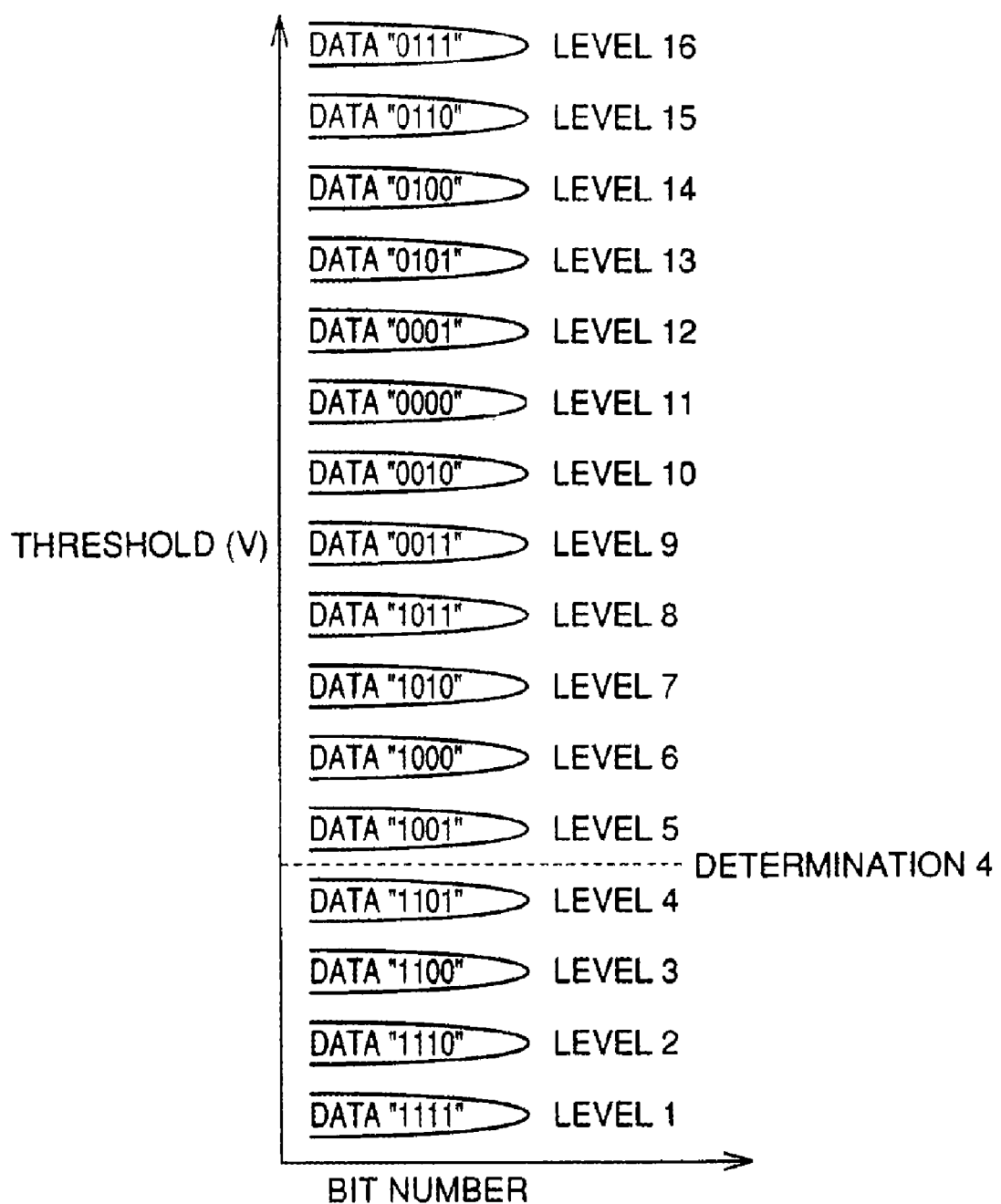
FIG. 47 illustrates thresholds of the memory cells and determination levels in the second processing step of the read operation in the fifth embodiment.

FIG. 46 shows data held in the respective latches in the second processing step of the read operation, and FIG. 47 shows thresholds of the memory cells and determination levels in the second processing step of the read operation.

Referring to FIGS. 46 and 47, a read operation is performed at a fourth ($=2^{n-2}$; n=4) determination level in the second processing step of the read operation when the data are stored in the data latch DL-1 from the sense latch SL and the sense latch SL is cleared in the first processing step, and the read data are stored in the sense latch circuit 120. In other words, data are transferred from the sense latch SL to the data latch DL-2 while data output from the data latch DL-1 is performed. After data transfer to the data latch DL-2, the sense latch circuit 120 is cleared.

Figure 49:
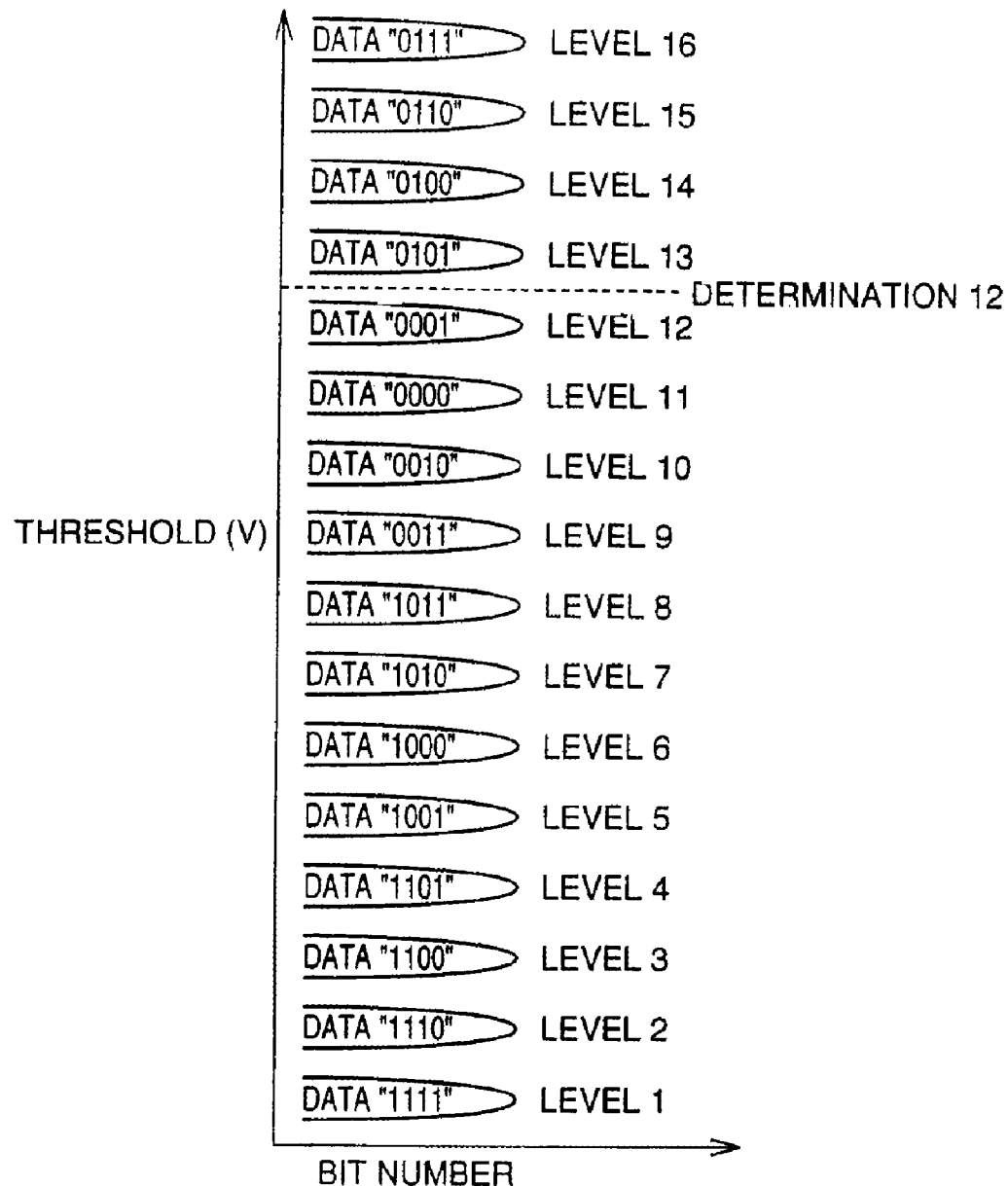
FIG. 49 illustrates thresholds of the memory cells and determination levels in the third processing step of the read operation in the fifth embodiment.

FIG. 48 shows data held in the respective latches in the third processing step of the read operation, and FIG. 49 shows thresholds of the memory cells and determination levels in the third processing step of the read operation.

Referring to FIGS. 48 and 49, data are read at a twelfth ($=+2^{n-2}$; n=4) determination level Vj12 and stored in the sense latch circuit 120 in the third processing step of the read operation. The read data conversion circuit 220 changes data bits in the data latch DL2 in accordance with results of a NOR operation between inverted data of the data held in the sense latch SL and the data held in the data latch DL-2.

Figure 51:
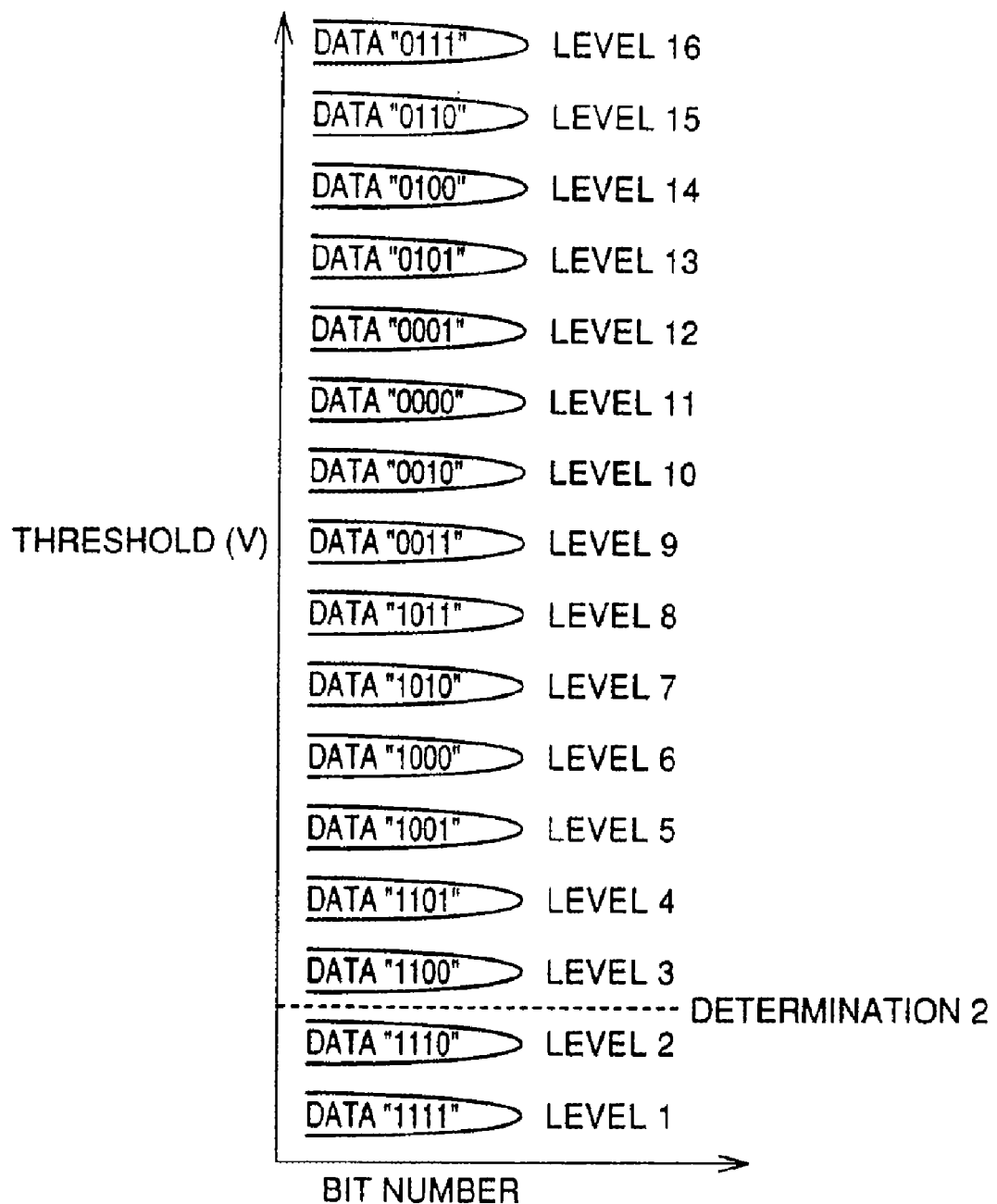
FIG. 51 illustrates thresholds of the memory cells and determination levels in the fourth processing step of the read operation in the fifth embodiment.

FIG. 50 shows data held in the respective latches in the fourth processing step of the read operation, and FIG. 51 shows thresholds of the memory cells and determination levels in the fourth processing step of the read operation.

Referring to FIGS. 50 and 51, data are read at a second ($=2^{n-3}$; n=4) determination level Vj2 in the fourth processing step of the read operation when the data are stored in the data latch DL-1 from the sense latch SL and the sense latch SL is cleared in the third processing step, and the read data are stored in the sense latch circuit 120. Data are output from the data latch circuit DL-1 and thereafter data transfer from the sense latch SL to the data latch DL-3 is performed while data are output from the data latch circuit DL-2. After data transfer to the data latch DL-3, the sense latch circuit 120 is cleared.

Figure 53:
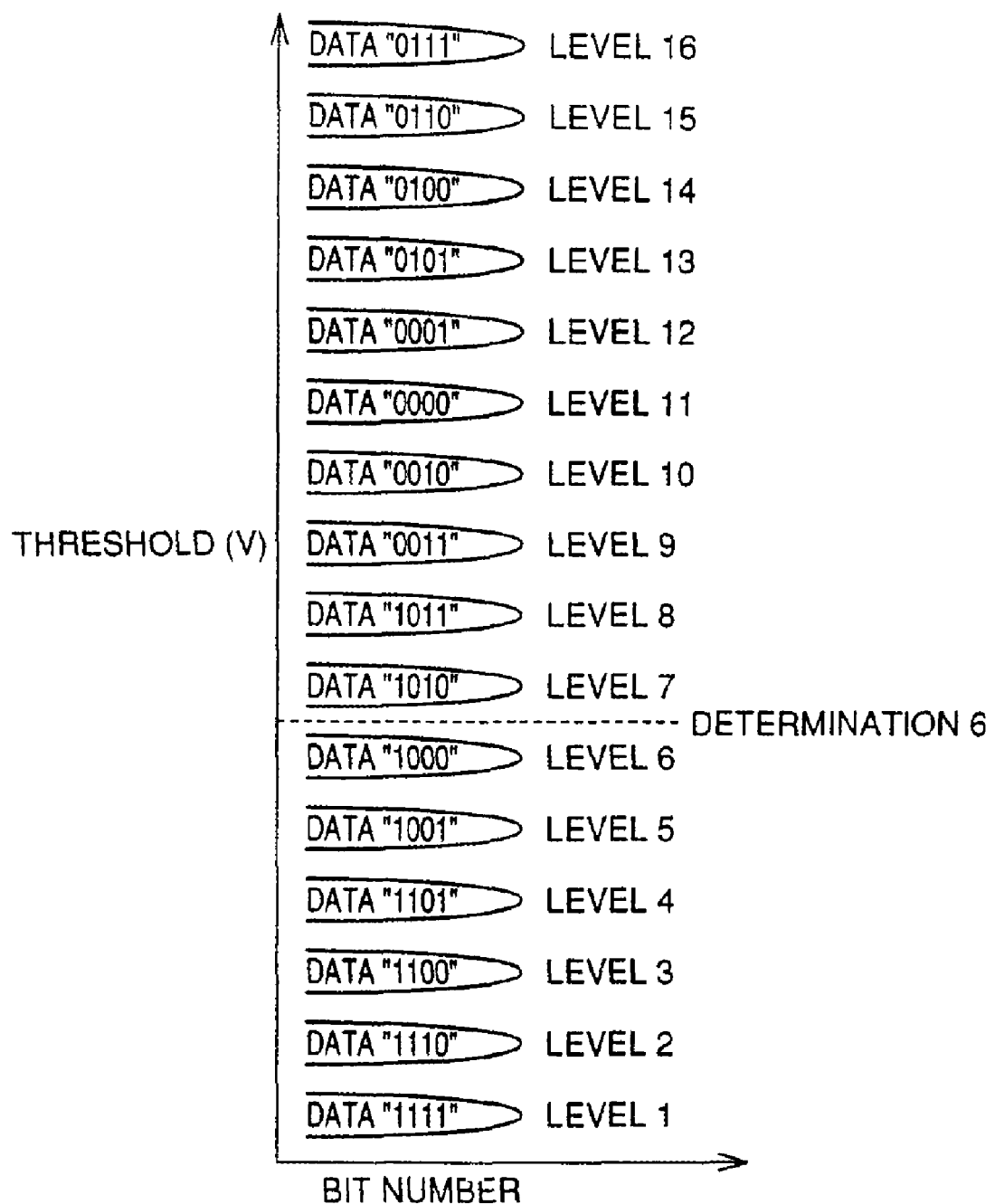
FIG. 53 illustrates thresholds of the memory cells and determination levels in the fifth processing step of the read operation in the fifth embodiment.

FIG. 52 shows data held in the respective latches in the fifth processing step of the read operation, and FIG. 53 shows thresholds of the memory cells and determination levels in the fifth processing step of the read operation.

Referring to FIGS. 52 and 53, data are read at a sixth ($=2^{n-2}+2^{n-3}$; n=4) determination level Vj6 and stored in the sense latch circuit 120 in the fifth processing step of the read operation. The read data conversion circuit 220 changes data bits in the data latch DL3 in accordance with results of a NOR operation between inverted data of the data held in the sense latch SL and the data held in the data latch DL-3.

Figure 55:
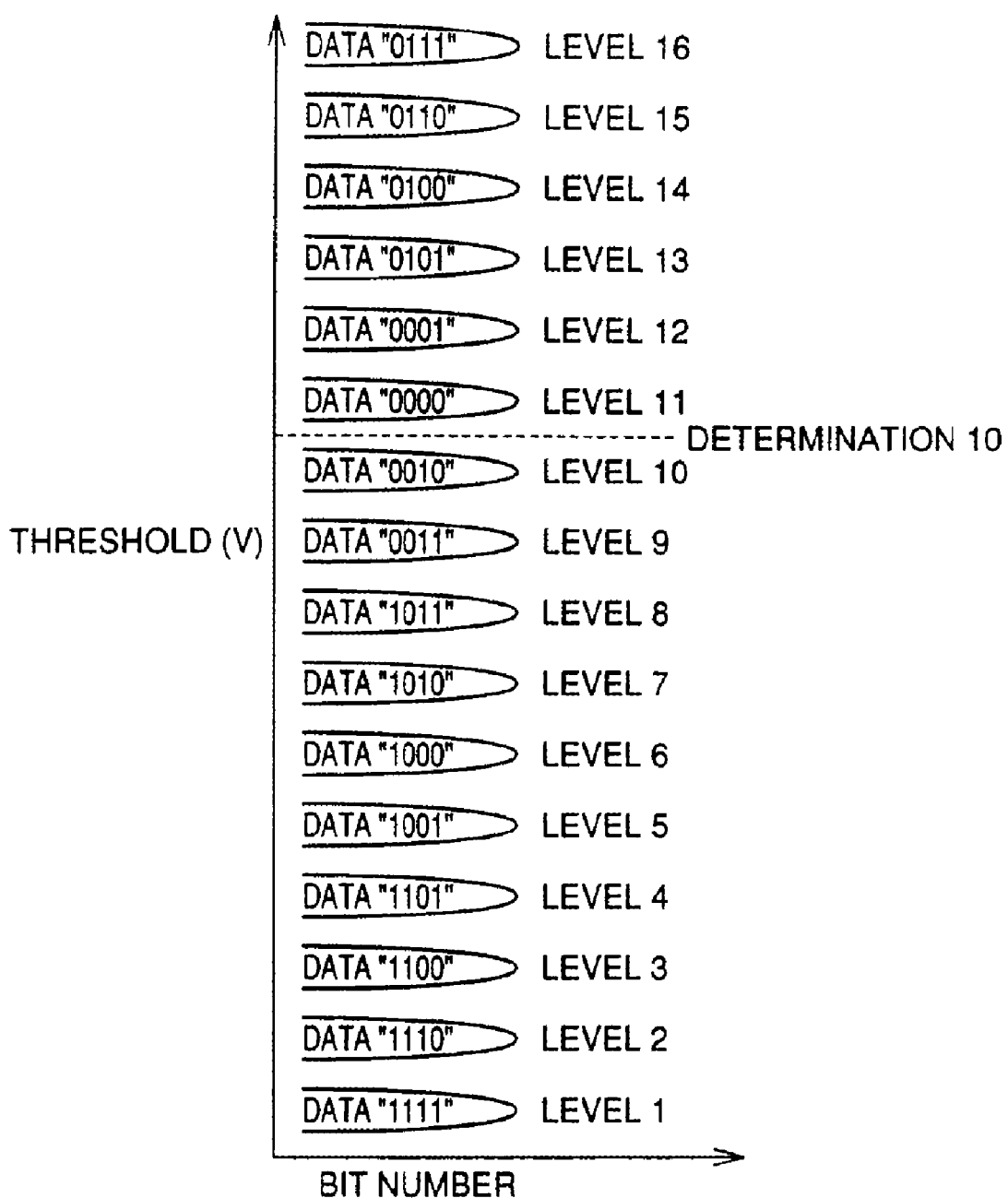
FIG. 55 illustrates thresholds of the memory cells and determination levels in the sixth processing step of the read operation in the fifth embodiment.

FIG. 54 shows data held in the respective latches in the sixth processing step of the read operation, and FIG. 55 shows thresholds of the memory cells and determination levels in the sixth processing step of the read operation.

Referring to FIGS. 54 and 55, data are read at a tenth ($=2^{n-1}+2^{n-3}$; n=4) determination level Vj10 in the sixth processing step of the read operation when the data are stored in the data latch DL-3 from the sense latch SL and the sense latch SL is cleared in the fifth processing step, and the read data are stored in the sense latch circuit 120. Data are output from the data latch circuit DL-1, and thereafter data are transferred from the sense latch SL to the data latch DL-4 while data are output from the data latch circuit DL-2. After data transfer to the data latch DL-4, the sense latch circuit 120 is cleared.

Figure 57:
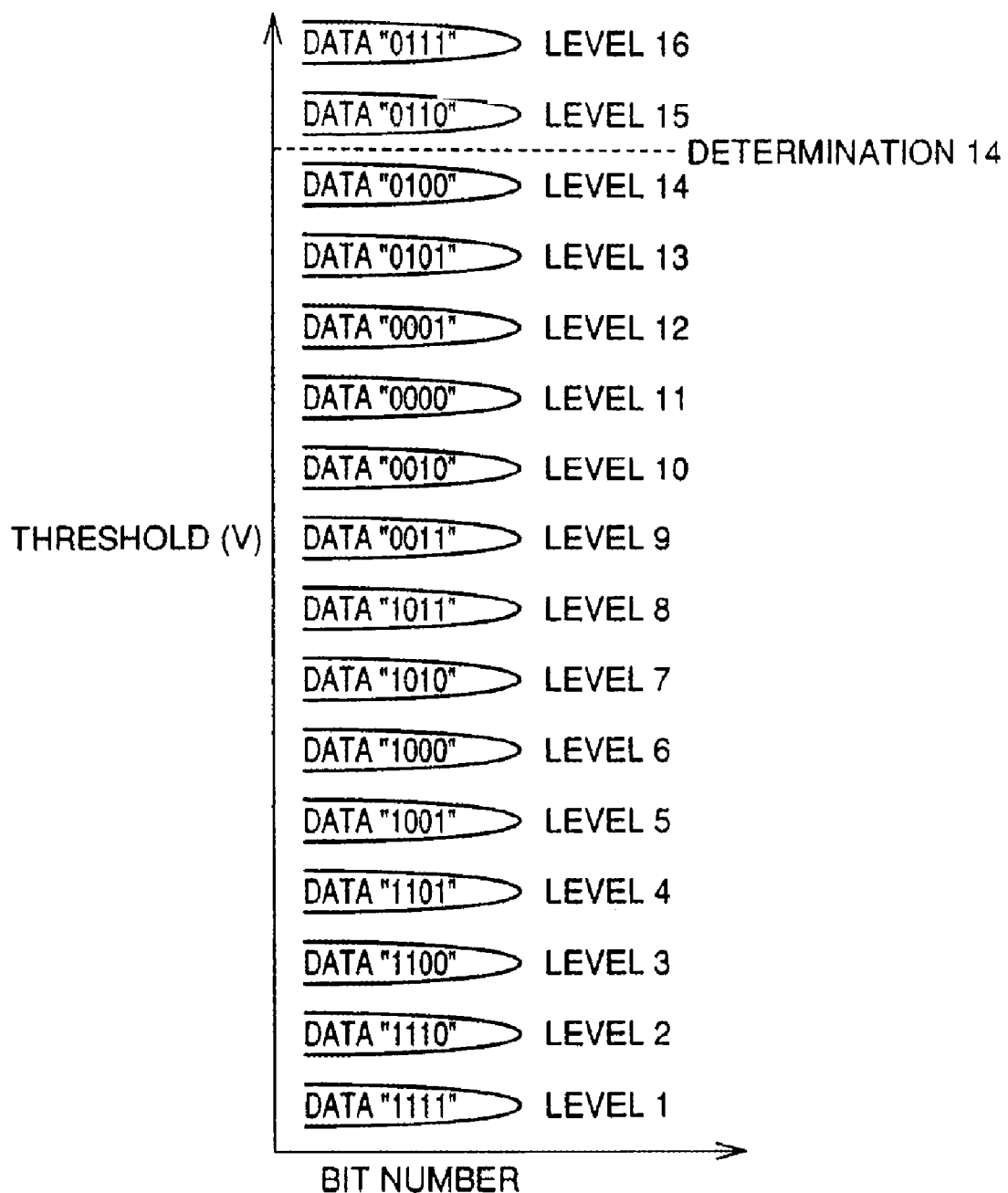
FIG. 57 illustrates thresholds of the memory cells and determination levels in the seventh processing step of the read operation in the fifth embodiment.

FIG. 56 shows data held in the respective latches in the seventh processing step of the read operation, and FIG. 57 shows thresholds of the memory cells and determination levels in the seventh processing step of the read operation.

Referring to FIGS. 56 and 57, data are read at a fourteenth ($=2^{n-1}+2^{n-2}+2^{n-3}$; n=4) determination level Vj14 and stored in the sense latch circuit 120 in the seventh processing step of the read operation. The read data conversion circuit 220 changes data bits in the data latch DL4 in accordance with results of a NOR operation between inverted data of the data held in the sense latch SL and the data held in the data latch DL-4.

Figure 59:
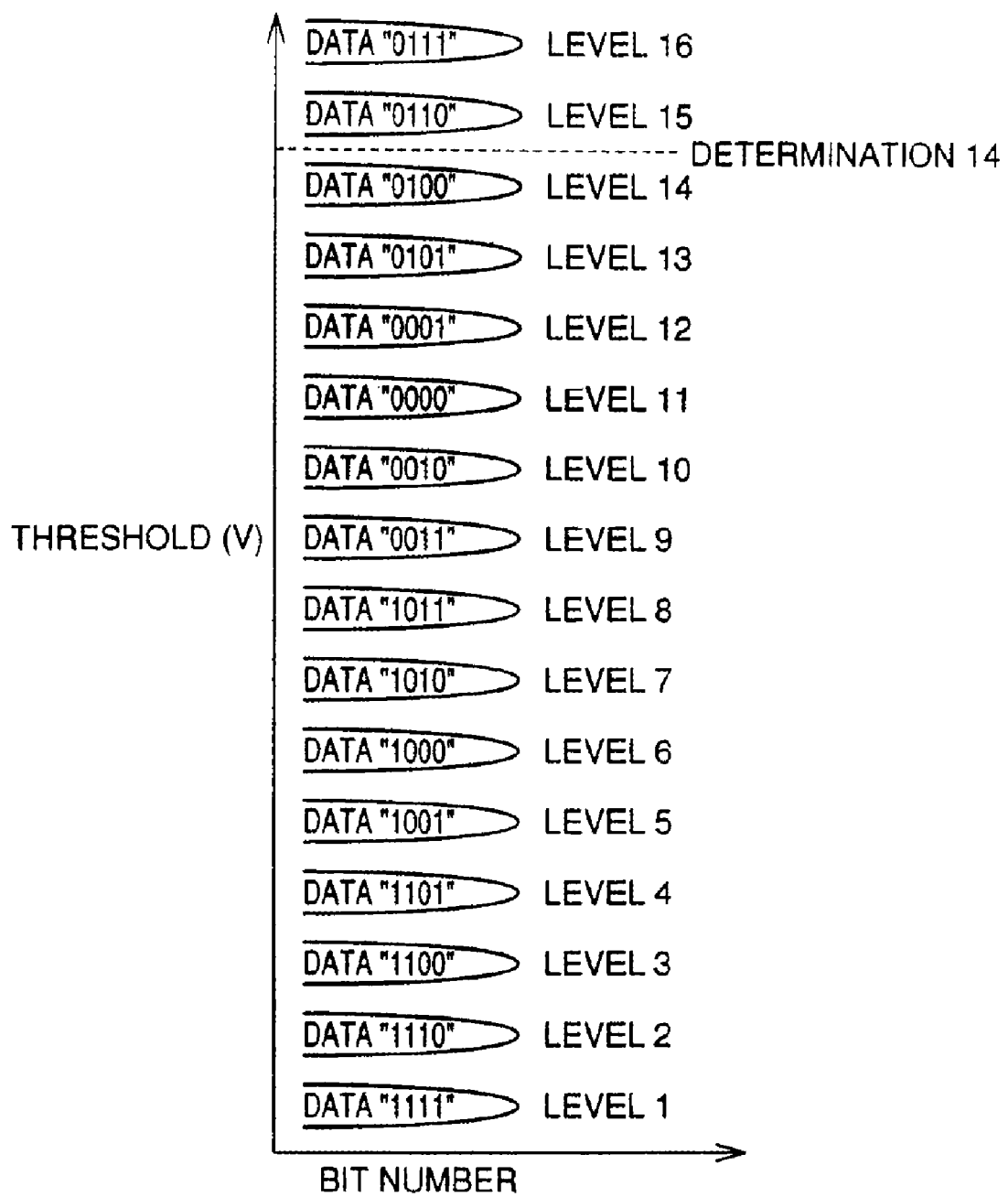
FIG. 59 illustrates thresholds of the memory cells and determination levels in the eighth processing step of the read operation in the fifth embodiment.

FIG. 58 shows data held in the respective latches in the eighth processing step of the read operation, and FIG. 59 shows thresholds of the memory cells and determination levels in the eighth processing step of the read operation.

Referring to FIGS. 58 and 59, the read data conversion circuit 220 performs an OR operation between the bit data held in the data latches DL-3 and DL-4 and stores the results in the data latch circuit DL-3.

Figure 61:
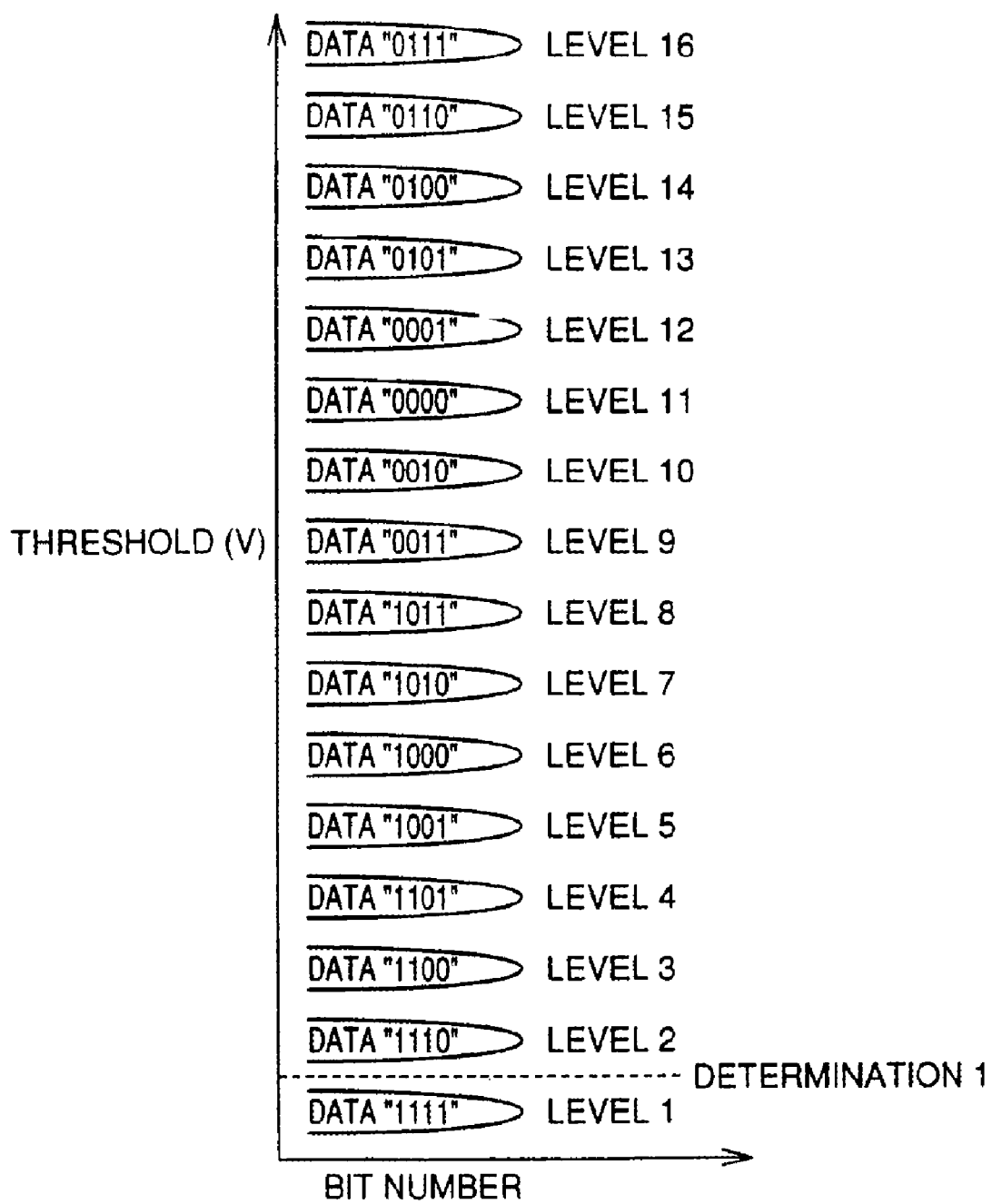
FIG. 61 illustrates thresholds of the memory cells and determination levels in the ninth processing step of the read operation in the fifth embodiment.

FIG. 60 shows data held in the respective latches in the ninth processing step of the read operation, and FIG. 61 shows thresholds of the memory cells and determination levels in the ninth processing step of the read operation.

Referring to FIGS. 60 and 61, data are read at a first ($=2^{n-4}$; n=4) determination level Vj1 and stored in the sense latch circuit 120 during data output from the data latch DL-2. Data in the sense latch SL are transferred to the data latch DL-4. The read data conversion circuit 220 outputs inverted data of data held in the data latch DL-3 to the data input/output terminal group 10 after data output from the data latch DL-2 is terminated.

Figure 63:
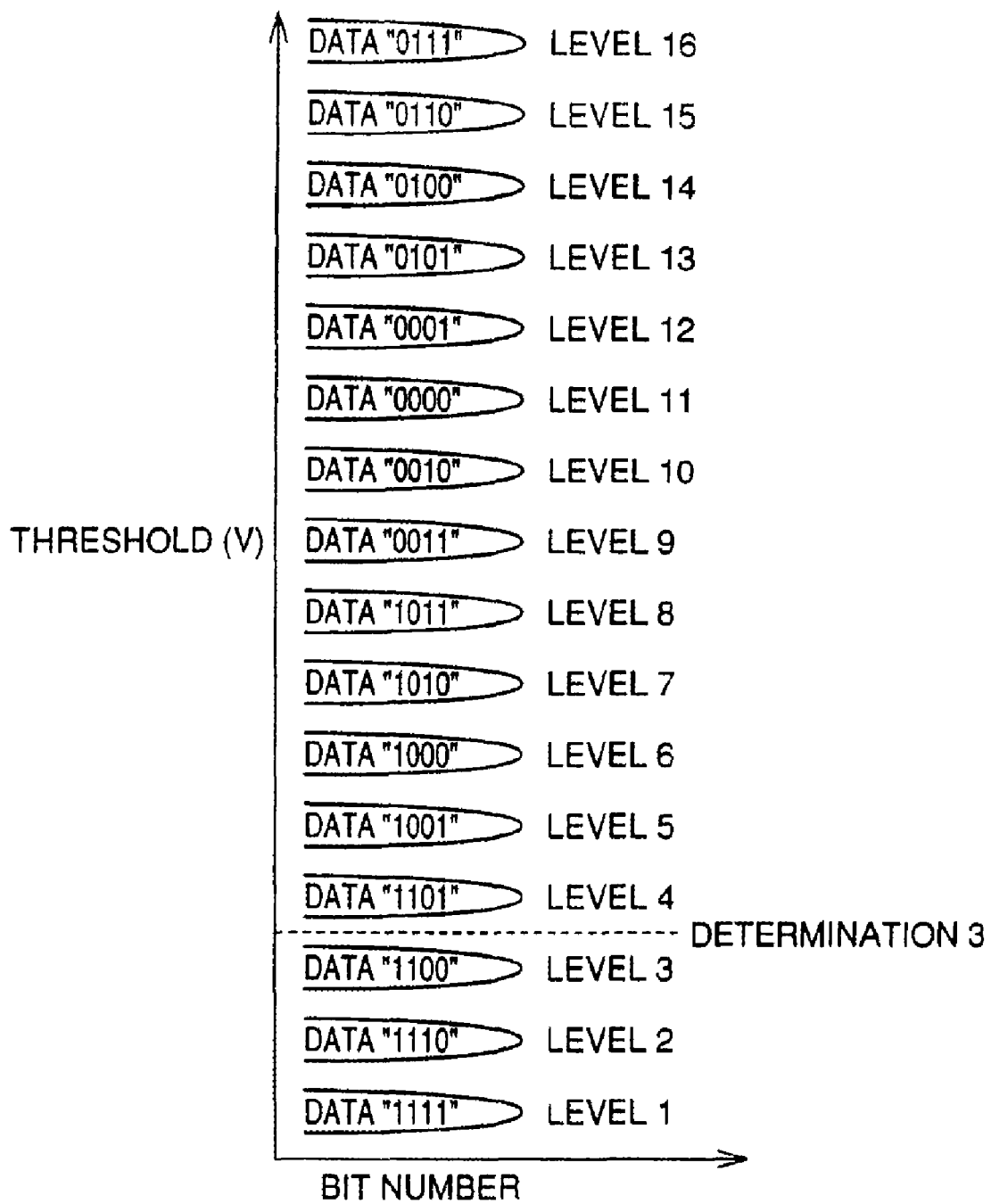
FIG. 63 illustrates thresholds of the memory cells and determination levels in the tenth processing step of the read operation in the fifth embodiment.

FIG. 62 shows data held in the respective latches in the tenth processing step of the read operation, and FIG. 63 shows thresholds of the memory cells and determination levels in the tenth processing step of the read operation.

Referring to FIGS. 62 and 63, data are read at a third ($=2^{n-3}+2^{n-4}$; n=4) determination level Vj3 and stored in the sense latch circuit 120 in the tenth processing step of the read operation. The read data conversion circuit 220 changes data bits in the data latch DL-4 in accordance with results of a NOR operation between inverted data of data held in the sense latch SL and data held in the data latch DL-4.

Figure 65:
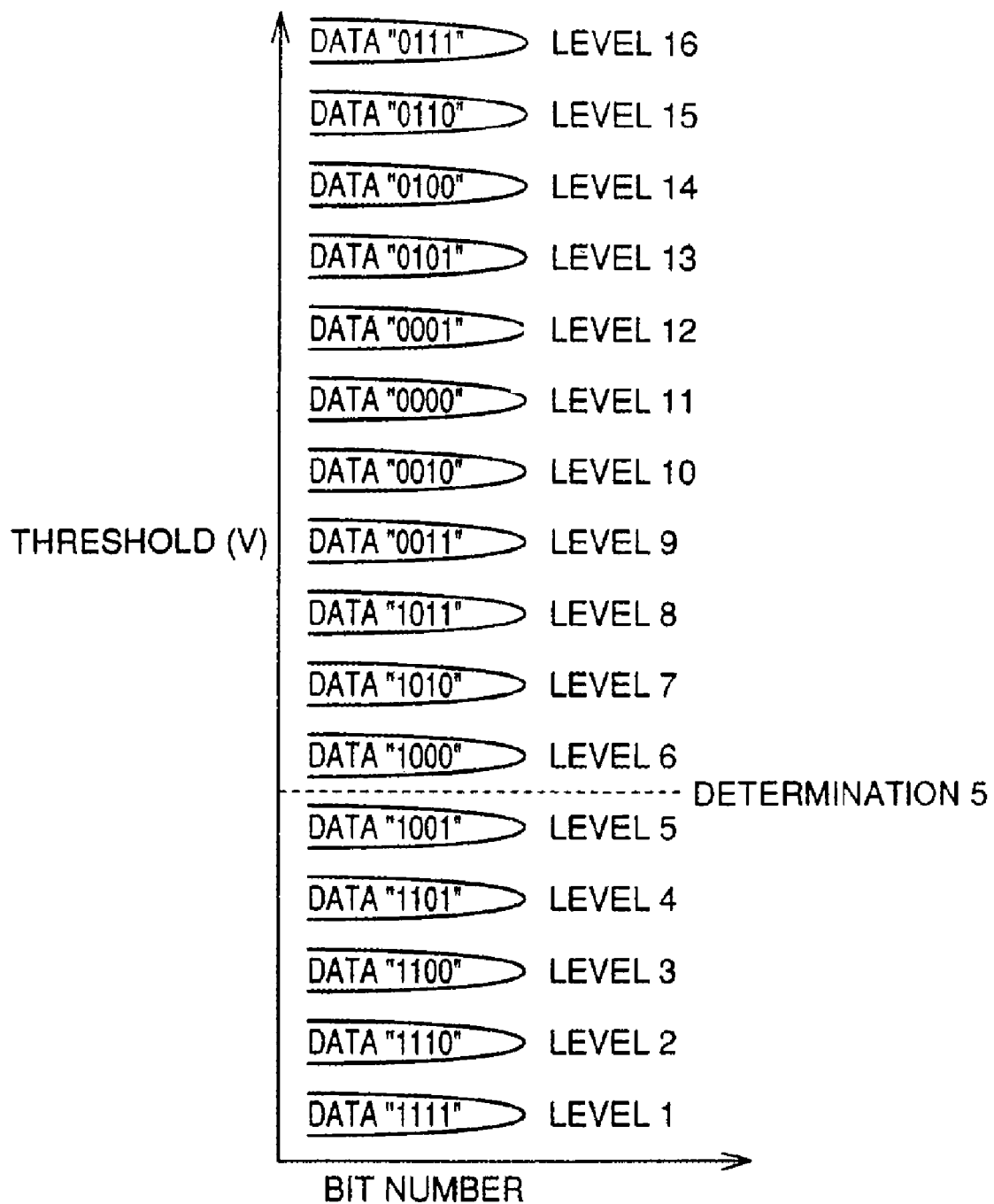
FIG. 65 illustrates thresholds of the memory cells and determination levels in the eleventh processing step of the read operation in the fifth embodiment.

FIG. 64 shows data held in the respective latches in the eleventh processing step of the read operation, and FIG. 65 shows thresholds of the memory cells and determination levels in the eleventh processing step of the read operation.

Referring to FIGS. 64 and 65, data are read at a fifth ($=2^{n-2}+2^{n-4}$; n=4) determination level Vj5 and stored in the sense latch circuit 120 during data output from the data latch DL-2. Data in the sense latch SL are transferred to the data latch DL-1.

Figure 67:
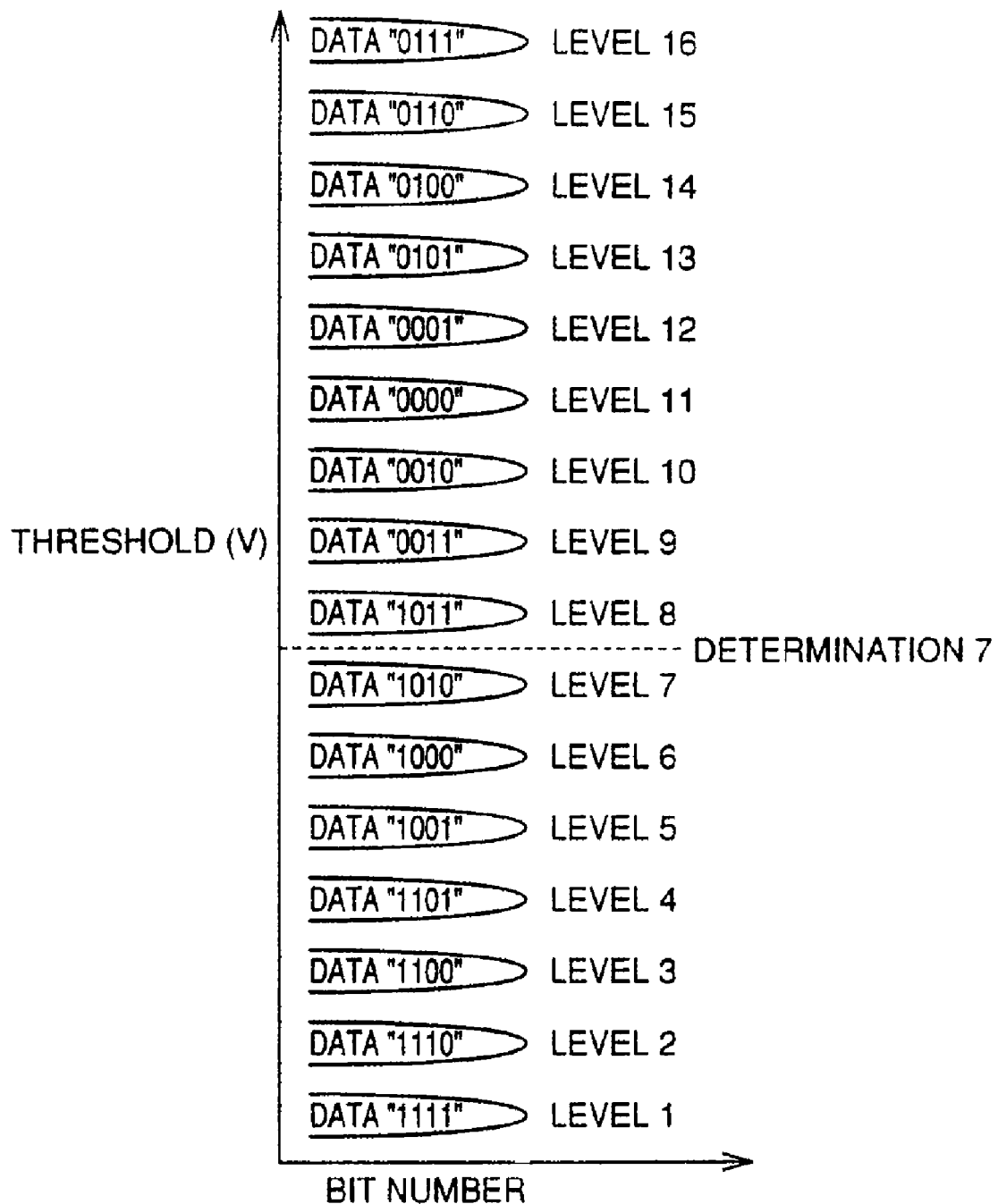
FIG. 67 illustrates thresholds of the memory cells and determination levels in the twelfth processing step of the read operation in the fifth embodiment.

FIG. 66 shows data held in the respective latches in the twelfth processing step of the read operation, and FIG. 67 shows thresholds of the memory cells and determination levels in the twelfth processing step of the read operation.

Referring to FIGS. 66 and 67, data are read at a seventh ($=2^{-n-2}+2^{n-3}+2^{n-4}$; n=4) determination level Vj7 and stored in the sense latch circuit 120 in the twelfth step of the read operation. The read data conversion circuit 220 changes data bits in the data latch DL1 in accordance with results of a NOR operation between inverted data of data held in the sense latch SL and data held in the data latch DL-1.

Figure 69:
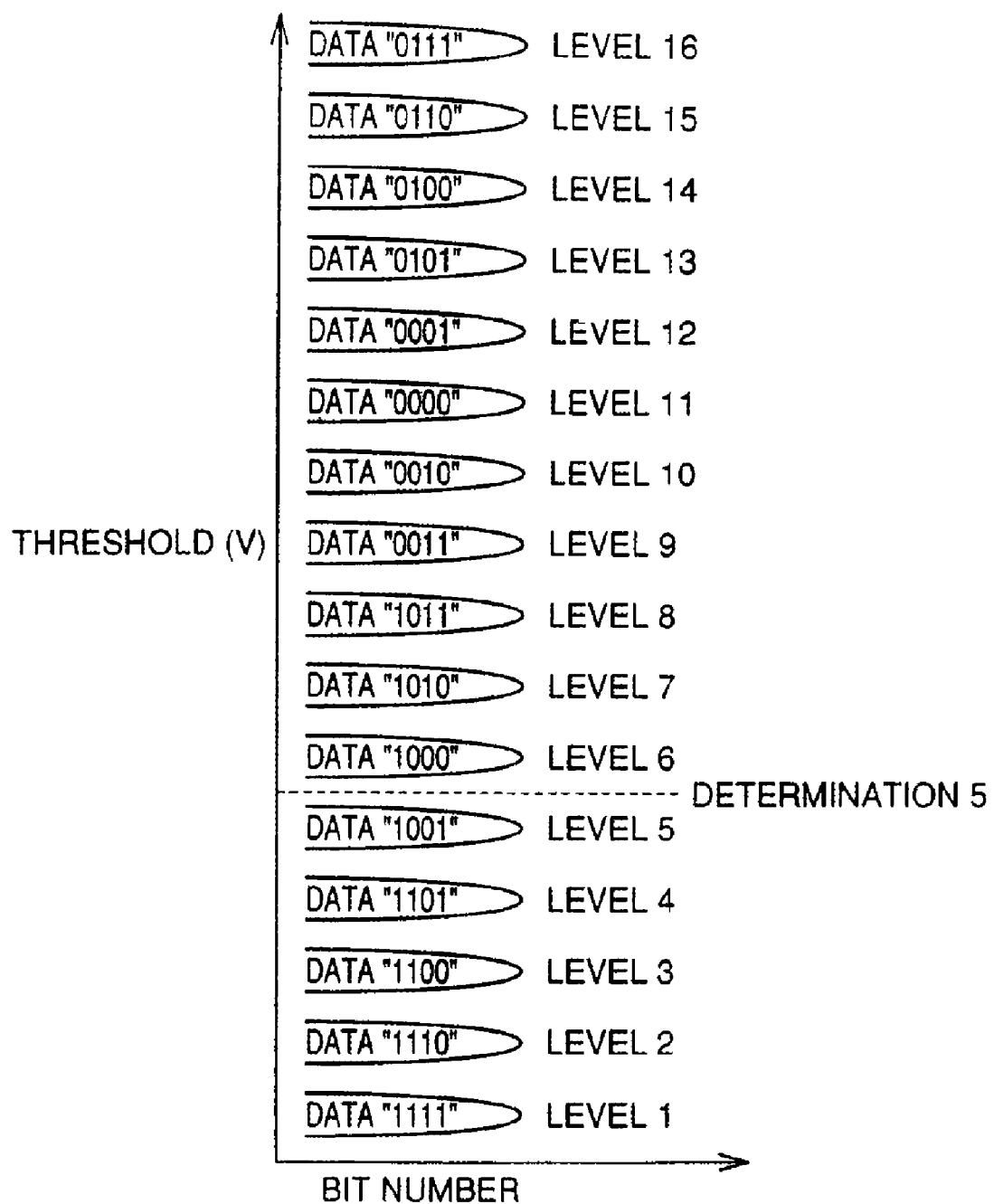
FIG. 69 illustrates thresholds of the memory cells and determination levels in the thirteenth processing step of the read operation in the fifth embodiment.

FIG. 68 shows data held in the respective latches in the thirteenth processing step of the read operation, and FIG. 69 shows thresholds of the memory cells and determination levels in the thirteenth processing step of the read operation.

Referring to FIGS. 68 and 69, the read data conversion circuit 220 performs an OR operation between bit data held in the data latches DL-1 and DL-4 and stores the results in the data latch DL-4.

Figure 71:
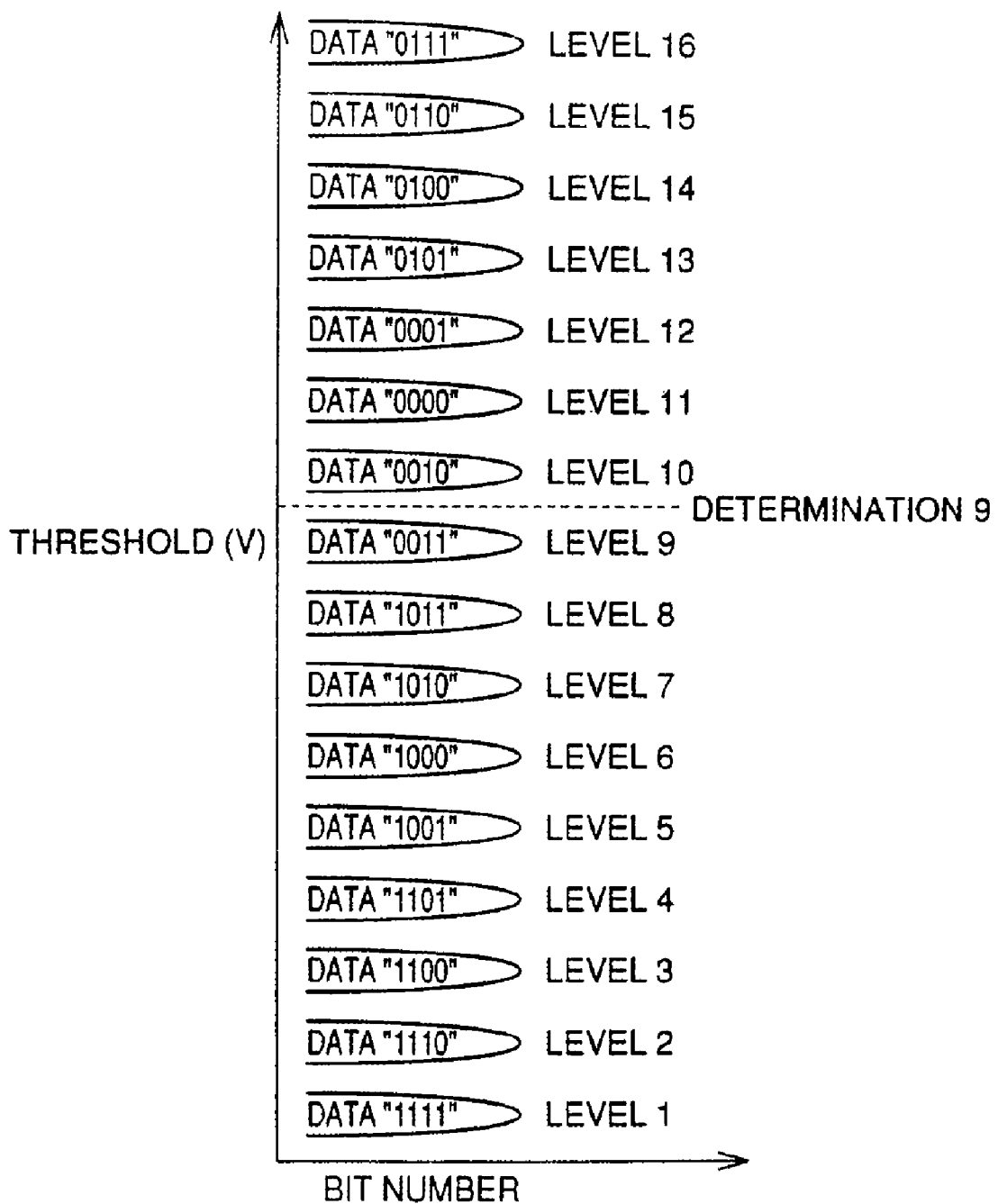
FIG. 71 illustrates thresholds of the memory cells and determination levels in the fourteenth processing step of the read operation in the fifth embodiment.

FIG. 70 shows data held in the respective latches in the fourteenth processing step of the read operation, and FIG. 71 shows thresholds of the memory cells and determination levels in the fourteenth processing step of the read operation.

Referring to FIGS. 70 and 71, data are read at a ninth ($=2^{n-1}+2^{n-4}$; n=4) determination level Vj9 and stored in the sense latch circuit 120 during data output from the data latch DL-2 or DL-3. Data in the sense latch SL are transferred to the data latch DL-1.

Figure 73:
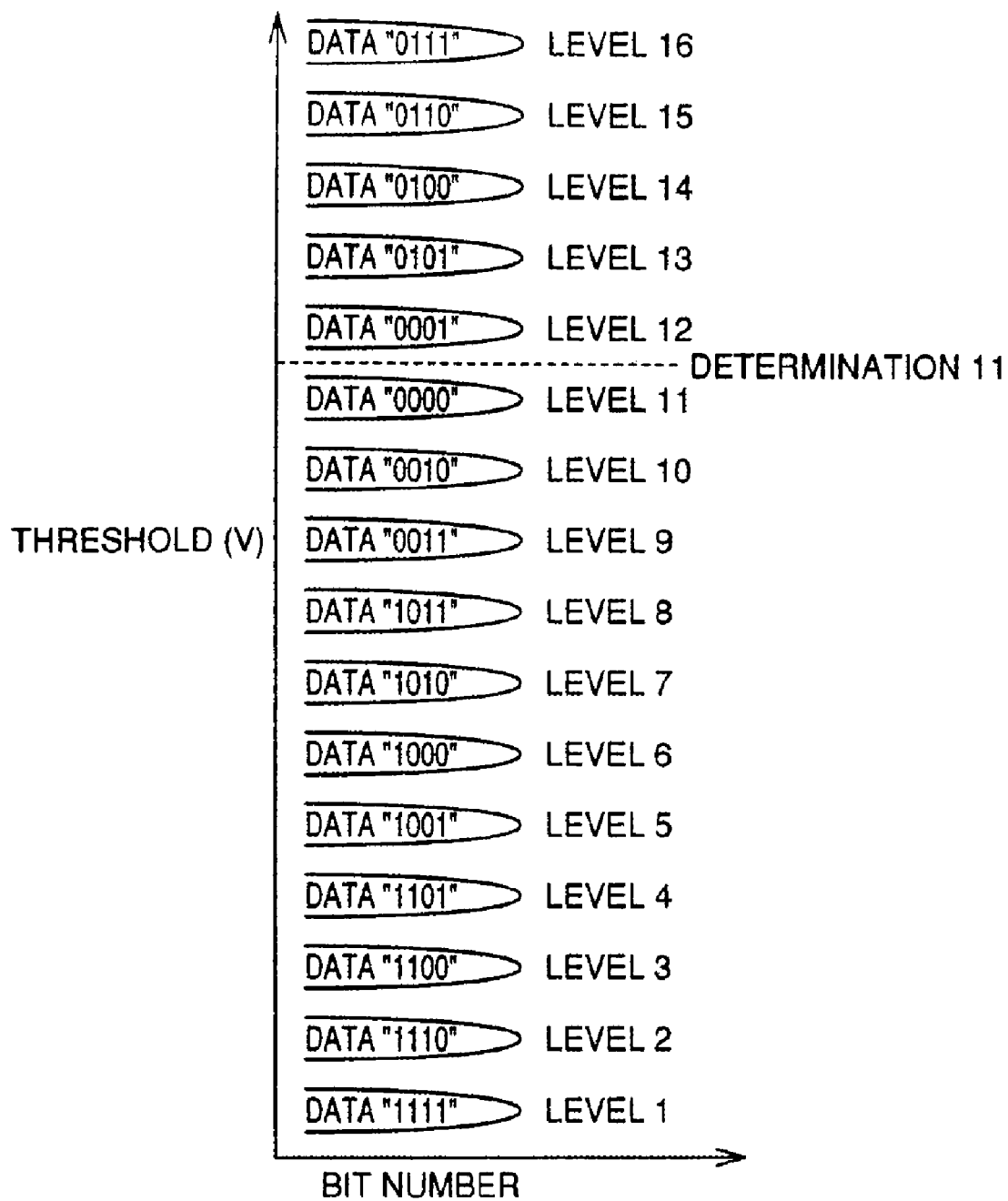
FIG. 73 illustrates thresholds of the memory cells and determination levels in the fifteenth processing step of the read operation in the fifth embodiment.

FIG. 72 shows data held in the respective latches in the fifteenth processing step of the read operation, and FIG. 73 shows thresholds of the memory cells and determination levels in the fifteenth processing step of the read operation.

Referring to FIGS. 72 and 73, data are read at an eleventh ($=2^{n-1}+2^{n-3}+2^{n-4}$; n=4) determination level Vj11 and stored in the sense latch circuit 120 in the fifteenth processing step of the read operation. The read data conversion circuit 220 changes data bits in the data latch DL-1 in accordance of results of a NOR operation between inverted data of data held in the sense latch SL and data held in the data latch DL-1.

Figure 75:
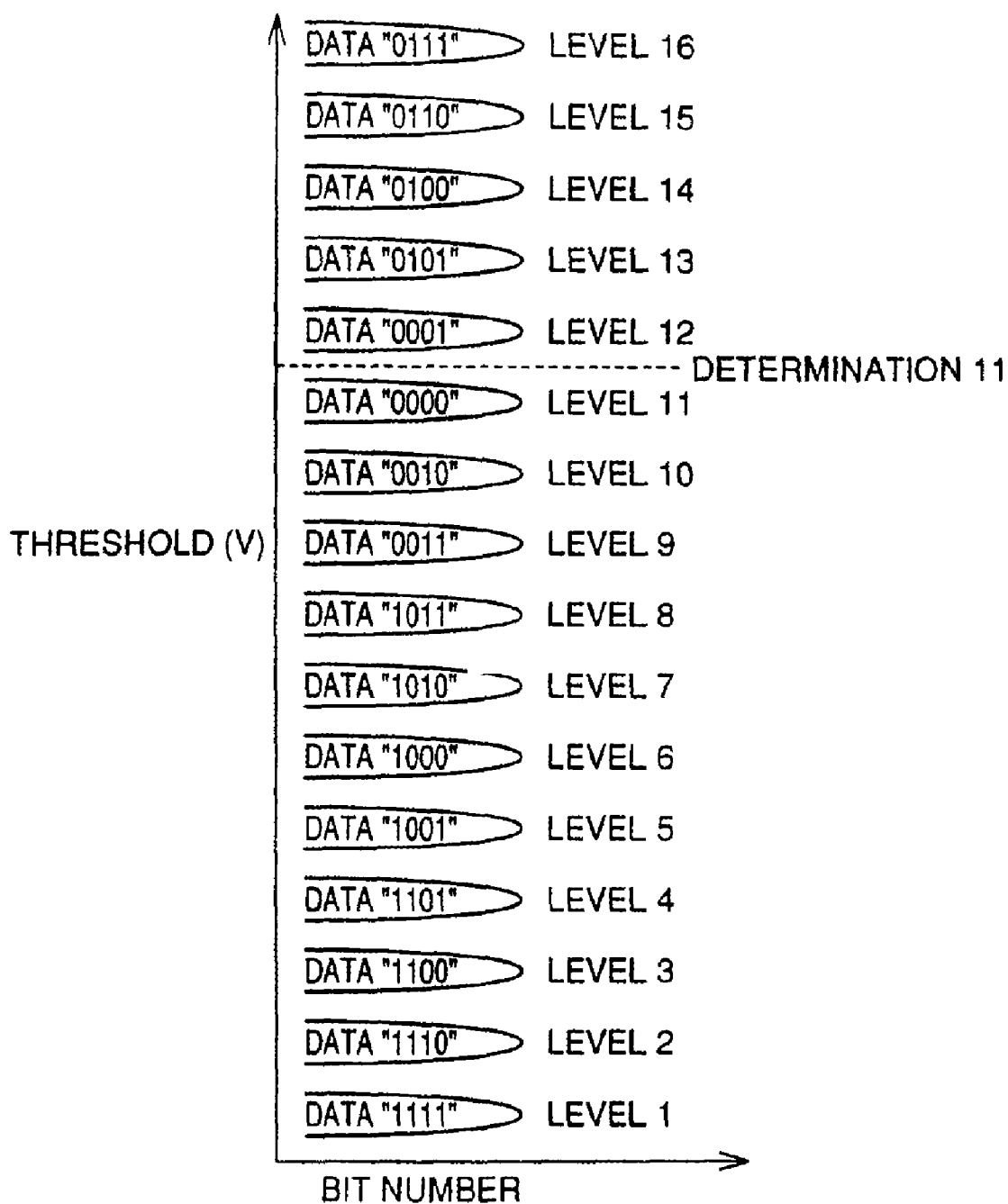
FIG. 75 illustrates thresholds of the memory cells and determination levels in the sixteenth processing step of the read operation in the fifth embodiment.

FIG. 74 shows data held in the respective latches in the sixteenth processing step of the read operation, and FIG. 75 shows thresholds of the memory cells and determination levels in the sixteenth processing step of the read operation.

Referring to FIGS. 74 and 75, the read data conversion circuit 220 performs an OR operation between bit data held in the data latches DL-1 and DL-4 and stores the results in the data latch circuit DL-4.

Figure 77:
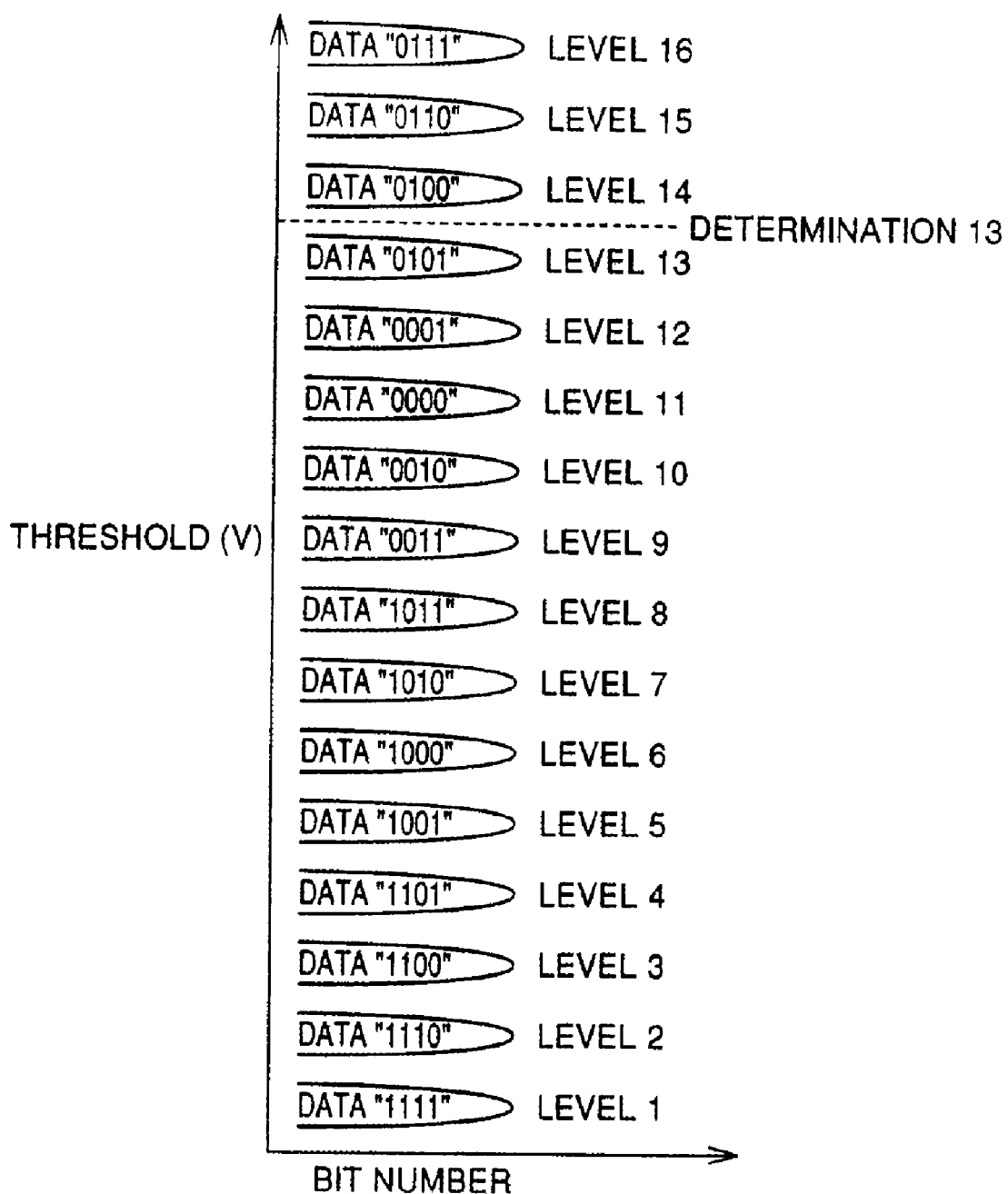
FIG. 77 illustrates thresholds of the memory cells and determination levels in the seventeenth processing step of the read operation in the fifth embodiment.

FIG. 76 shows data held in the respective latches in the seventeenth processing step of the read operation, and FIG. 77 shows thresholds of the memory cells and determination levels in the seventeenth processing step of the read operation.

Referring to FIGS. 76 and 77, data are read at a thirteenth ($=2^{n-1}+2^{n-2}+2^{n-4}$; n=4) determination level Vj13 and stored in the sense latch circuit 120 during data output from the data latch DL-2 or DL-3. Data in the sense latch SL are transferred to the data latch DL-1.

Figure 79:
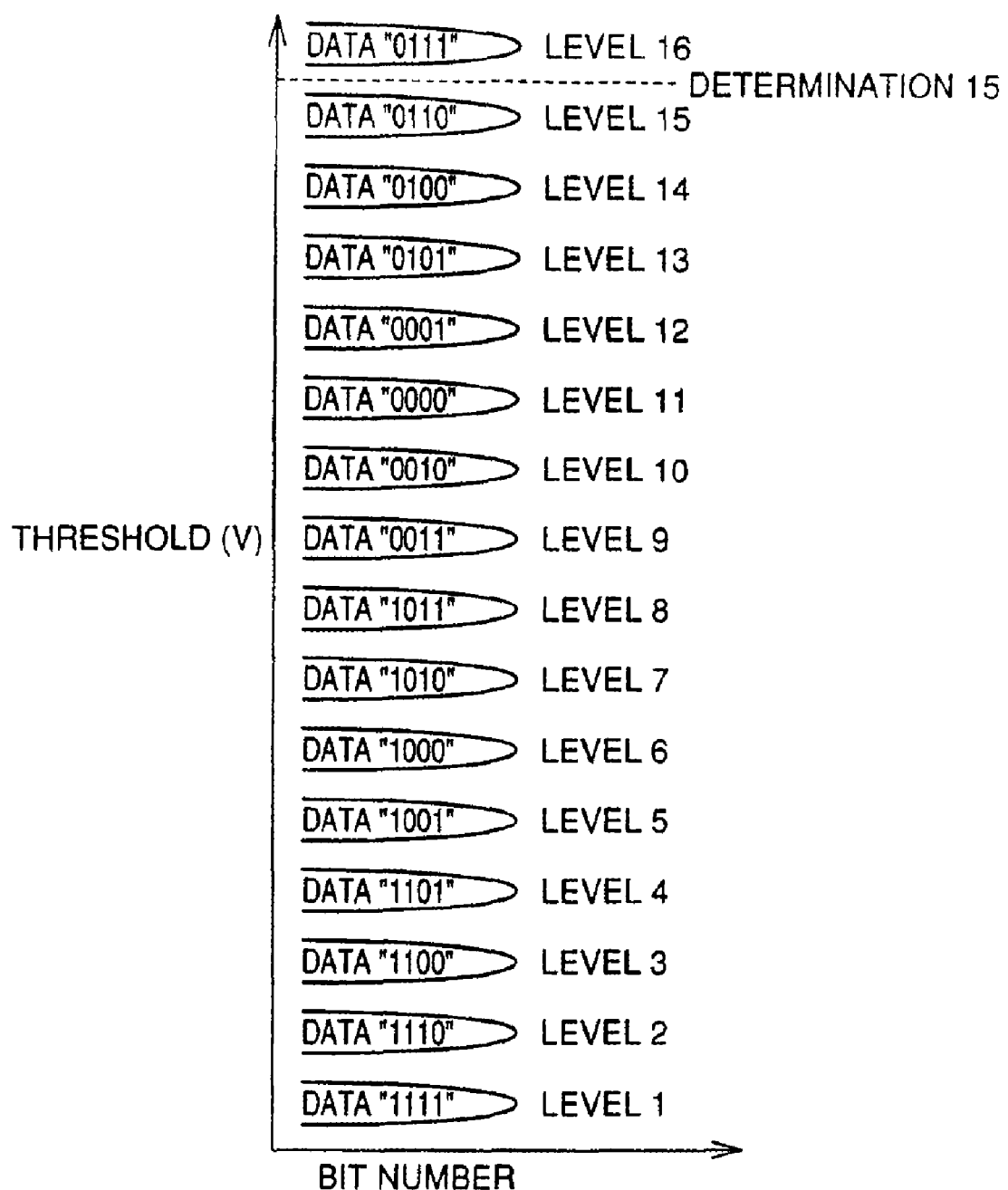
FIG. 79 illustrates thresholds of the memory cells and determination levels in the eighteenth processing step of the read operation in the fifth embodiment.

FIG. 78 shows data held in the respective latches in the eighteenth processing step of the read operation, and FIG. 79 shows thresholds of the memory cells and determination levels in the eighteenth processing step of the read operation.

Referring to FIGS. 78 and 79, data are read at a fifteenth ($=2^{-n-1}+2^{n-2}+2^{n-3}+2^{n-4}$; n=4) determination level Vj15 and stored in the sense latch circuit 120 in the eighteenth processing step of the read operation. The read data conversion circuit 220 changes data bits in the data latch DL-1 in accordance with results of a NOR operation between inverted data of data held in the sense latch SL and data held in the data latch DL-1.

Figure 81:
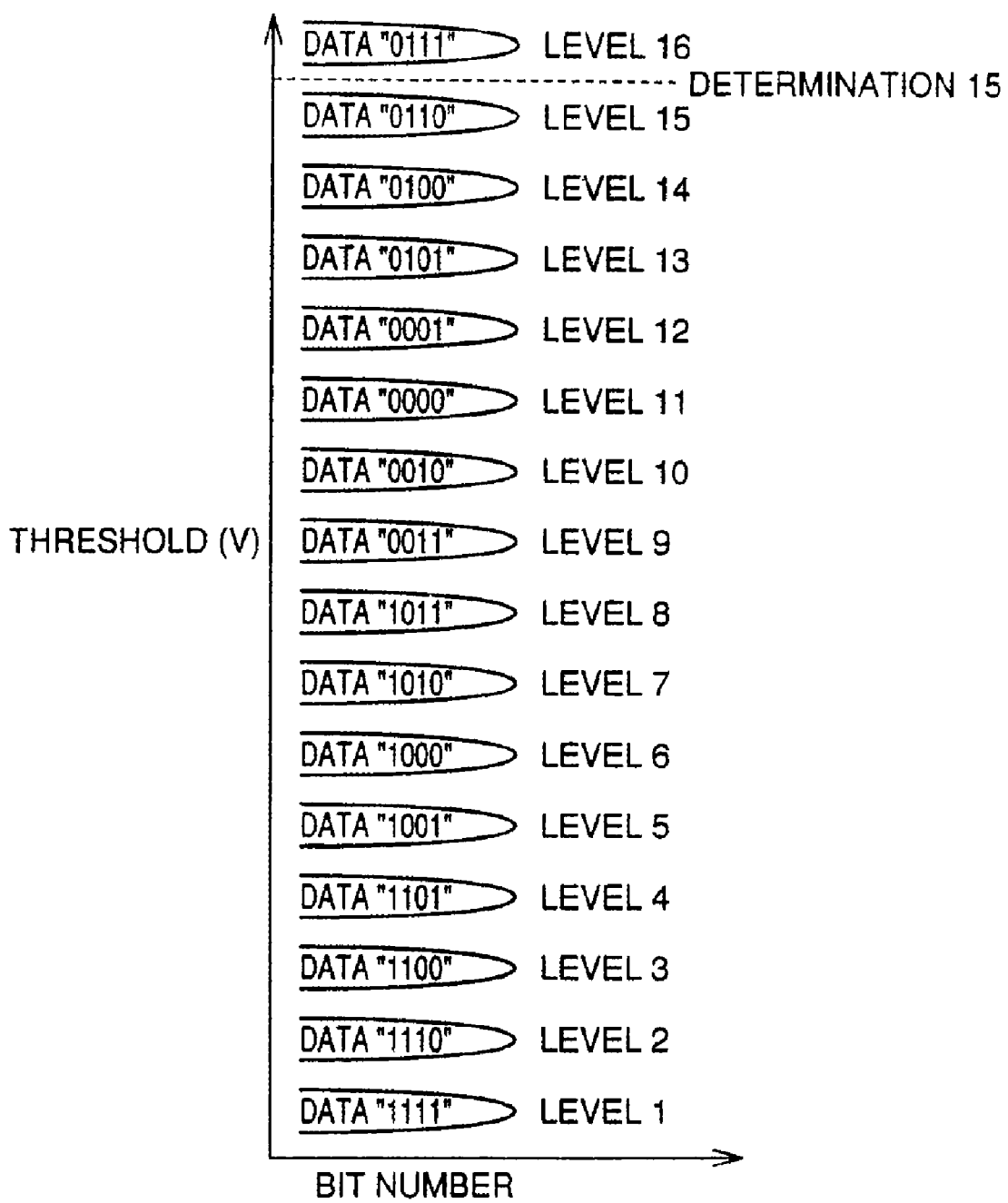
FIG. 81 illustrates thresholds of the memory cells and determination levels in the nineteenth processing step of the read operation in the fifth embodiment.

FIG. 80 shows data held in the respective latches in the nineteenth processing step of the read operation, and FIG. 81 shows thresholds of the memory cells and determination levels in the nineteenth processing step of the read operation.

Referring to FIGS. 80 and 81, the read data conversion circuit 220 performs an OR operation between bit data held in the data latches DL-1 and DL-4 and stores the results in the data latch DL-4.

After data output from the data latch DL-3 is terminated, the control circuit 210 starts outputting inverted data of data held in the data latch DL-4 to the input/output terminal group 10.

The data read time from memory cells capable of holding 16-valued data can be reduced due to the aforementioned operations.

In the above description, the determination levels are paired from the lower level for inverting the upper level of each pair, NORing two determination results and finally ORing the results of each pair. However, the present invention is not restricted to this structure but the determination levels may alternatively be paired from the higher level.

[Write Operation of 16-Valued Data]

A data write operation is now described.

FIGS. 82 to 87 are conceptual diagrams showing data held in the data latches DL-1 to DL-4 and the sense latch SL as well as thresholds of the memory cells and determination levels in writing in first to seventh processing steps of the write operation.

Figure 82:
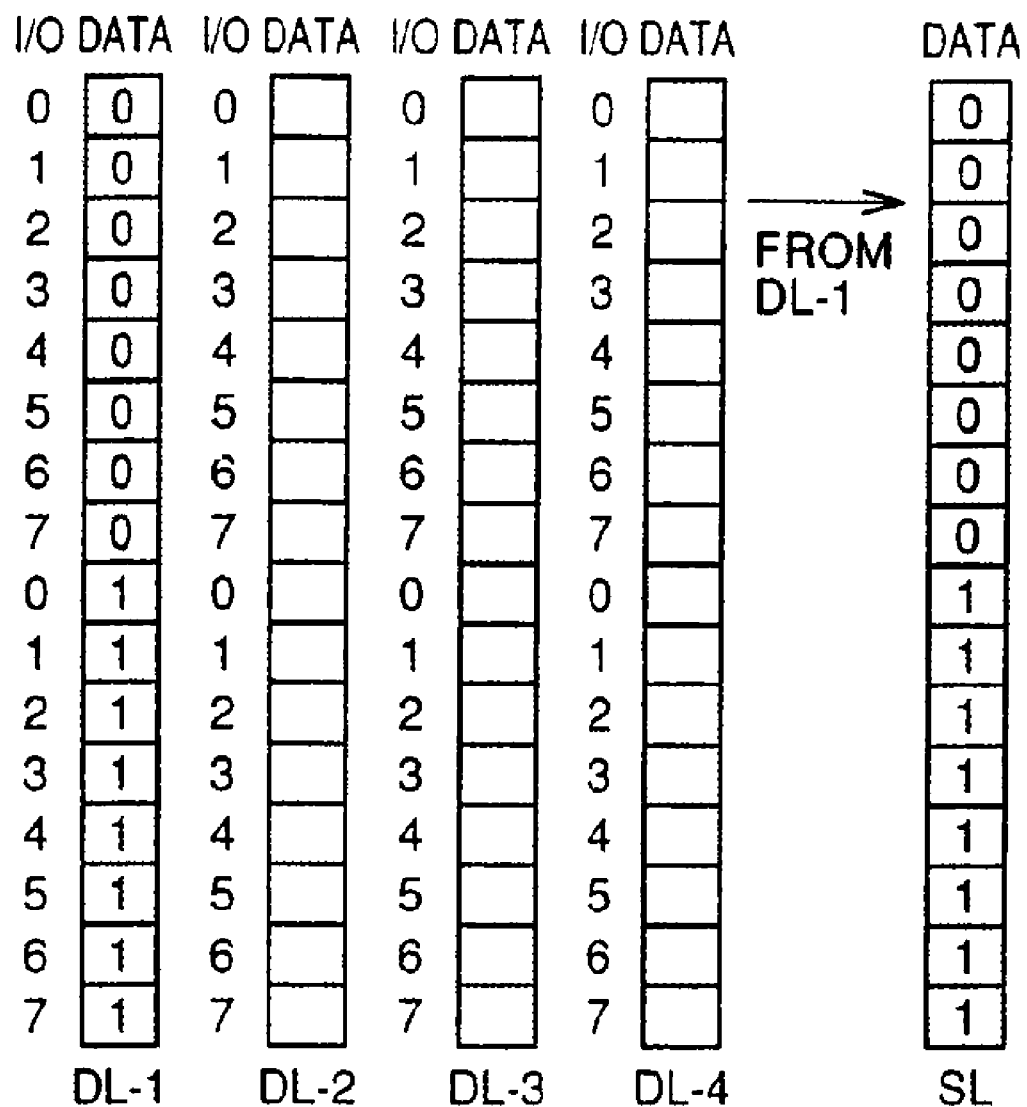
FIG. 82 illustrates data held in the respective latches in a first processing step of a write operation in the fifth embodiment of the present invention.
Figure 83:
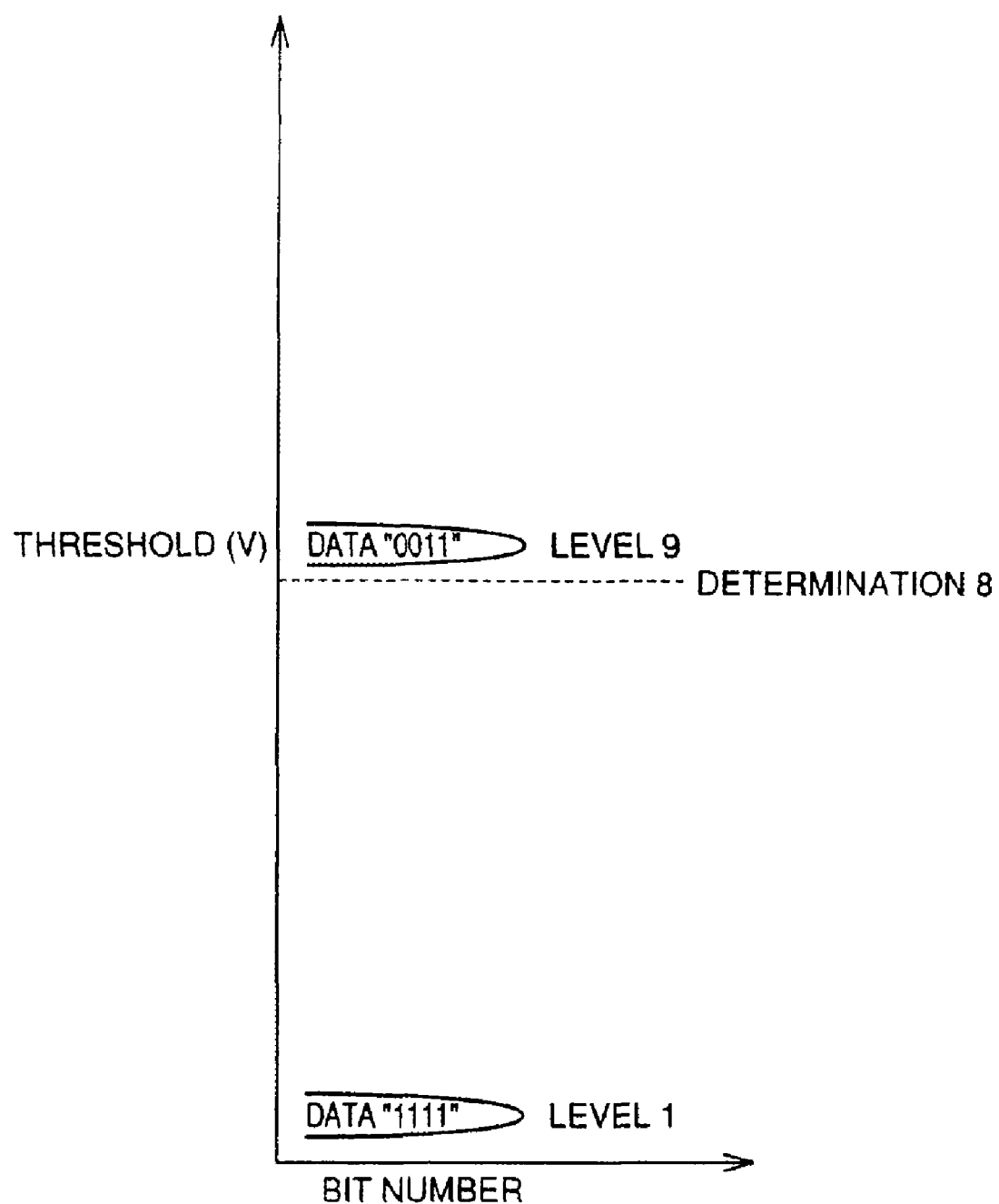
FIG. 83 illustrates thresholds of the memory cells and determination levels in the first processing step of the write operation in the fifth embodiment.

FIG. 82 shows data held in the respective latches in the first processing step of the write operation, and FIG. 83 shows thresholds of the memory cells and determination levels in the first processing step of the write operation.

Figure 84:
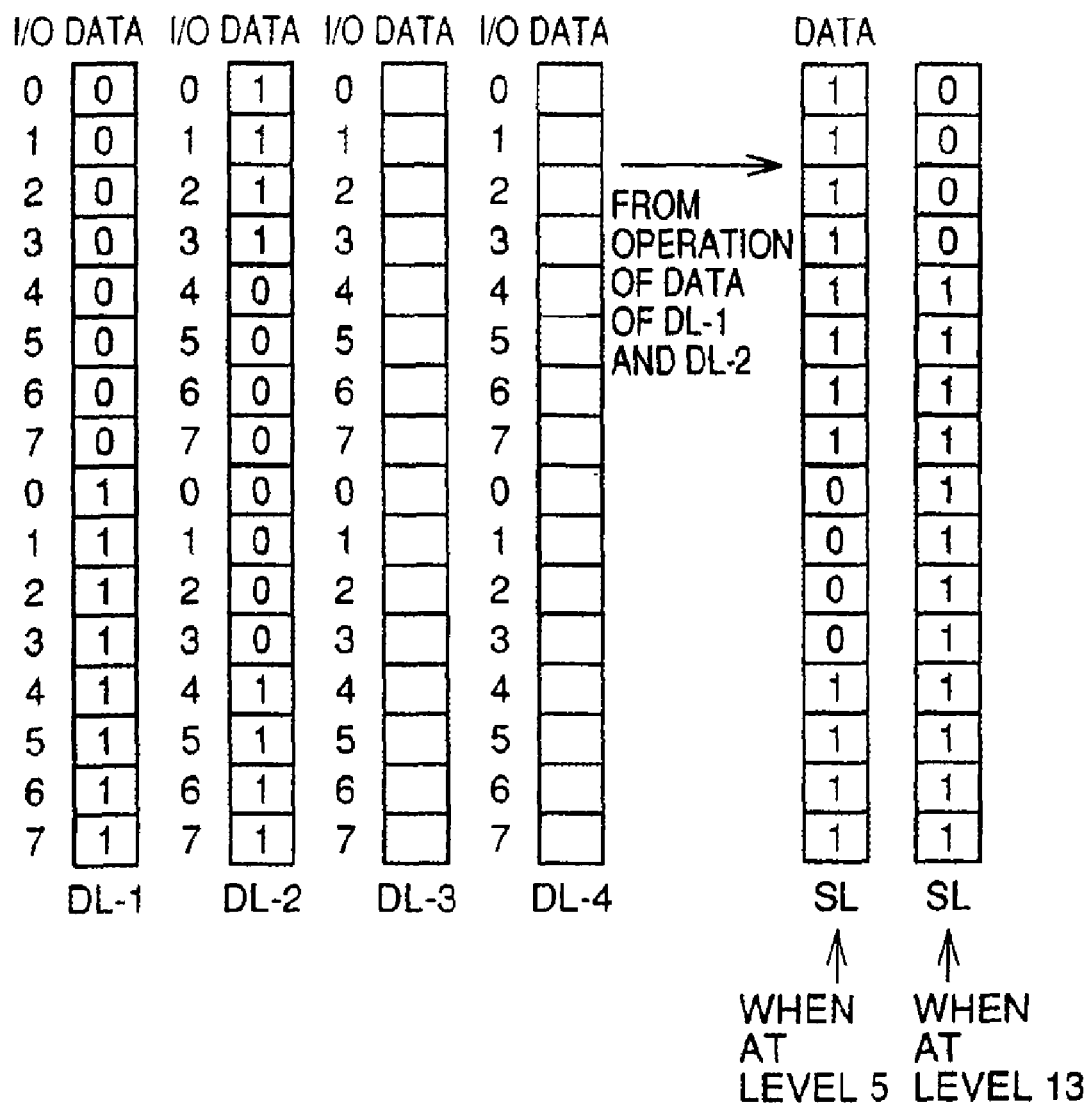
FIG. 84 illustrates data held in the respective latches in second and third processing steps of the write operation in the fifth embodiment of the present invention.
Figure 85:
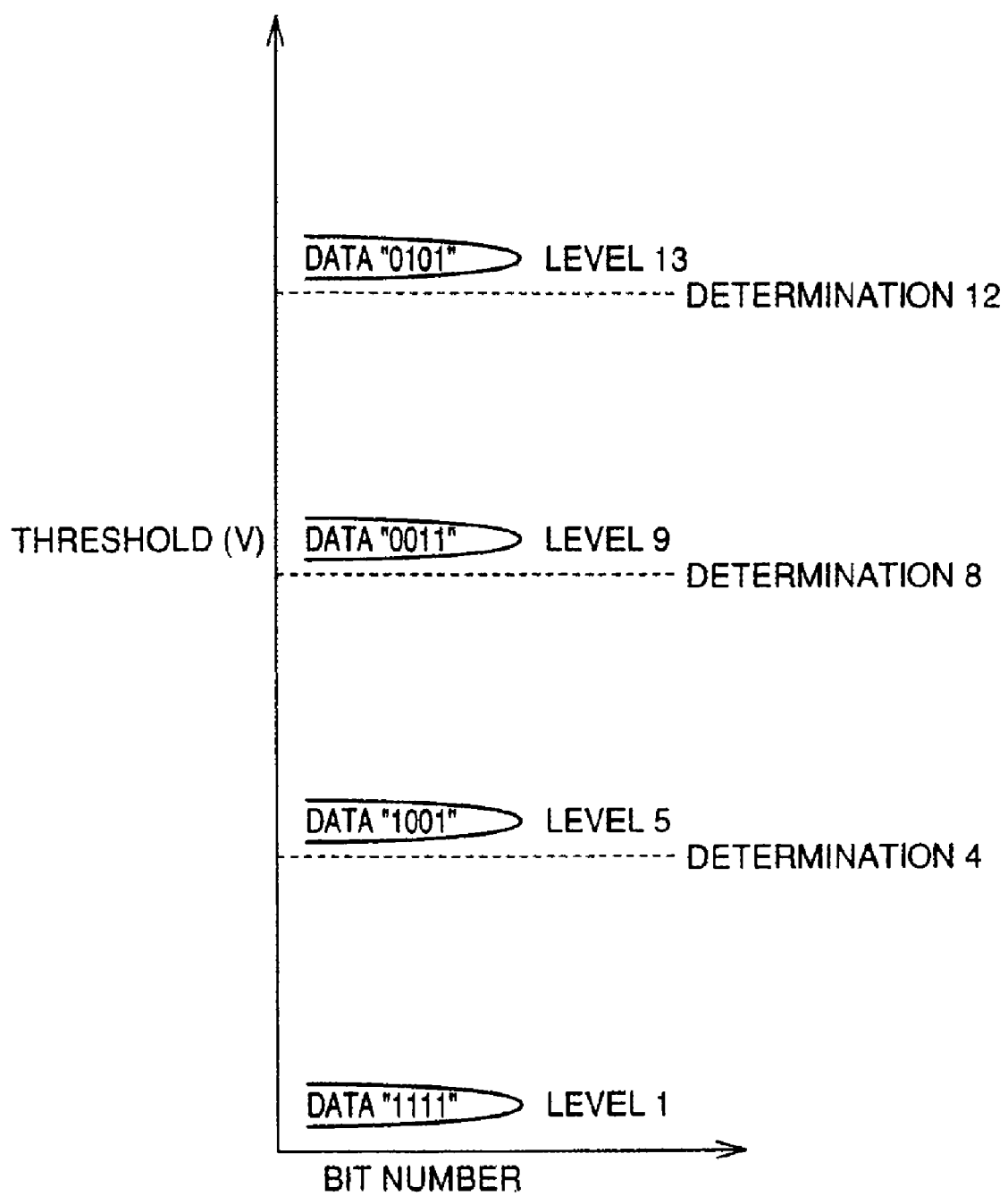
FIG. 85 illustrates thresholds of the memory cells and determination levels in the second and third processing steps of the write operation in the fifth embodiment.

FIG. 84 shows data held in the respective latches in the second and third processing steps of the write operation, and FIG. 85 shows thresholds of the memory cells and determination levels in the second and third processing steps of the write operation.

Figure 86:
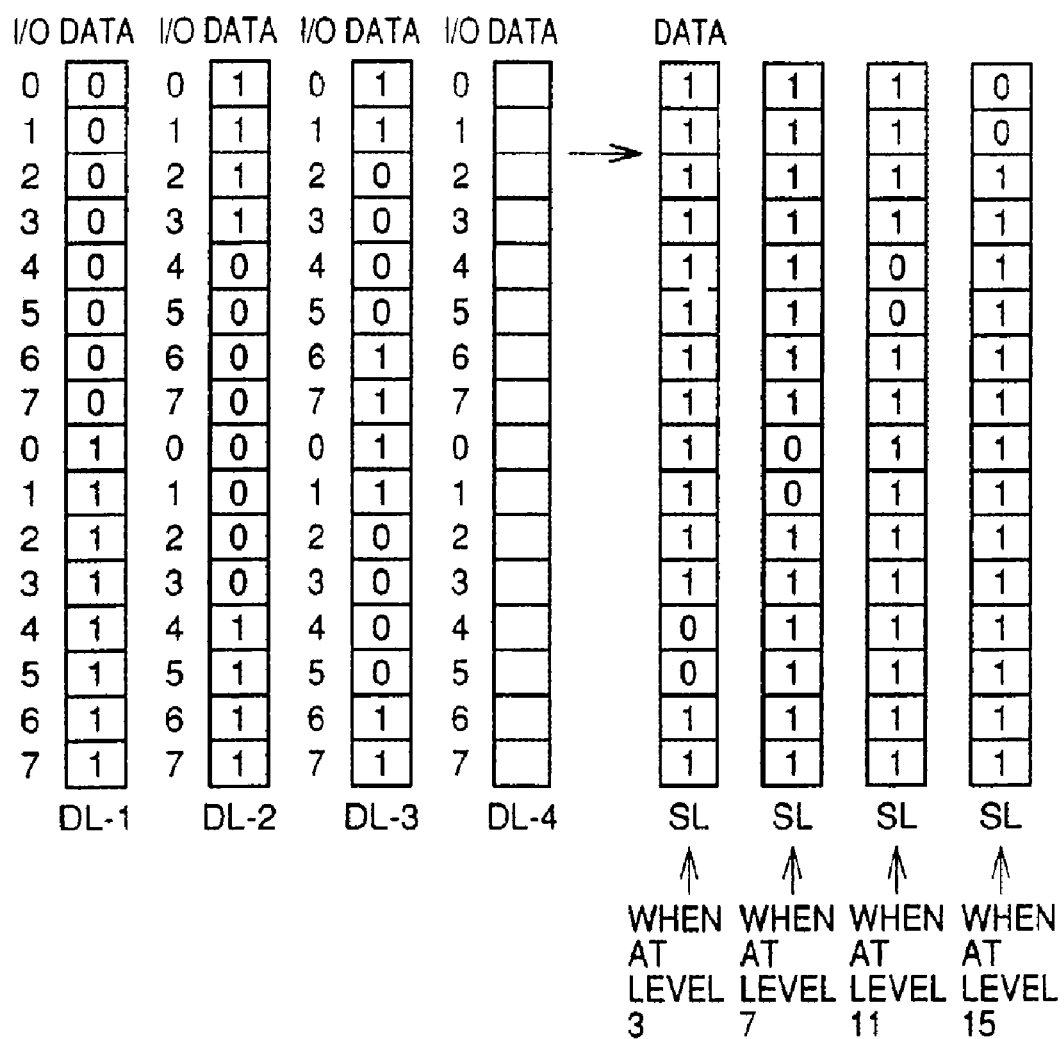
FIG. 86 illustrates data held in the respective latches in fourth to seventh processing steps of the write operation in the fifth embodiment of the present invention.
Figure 87:
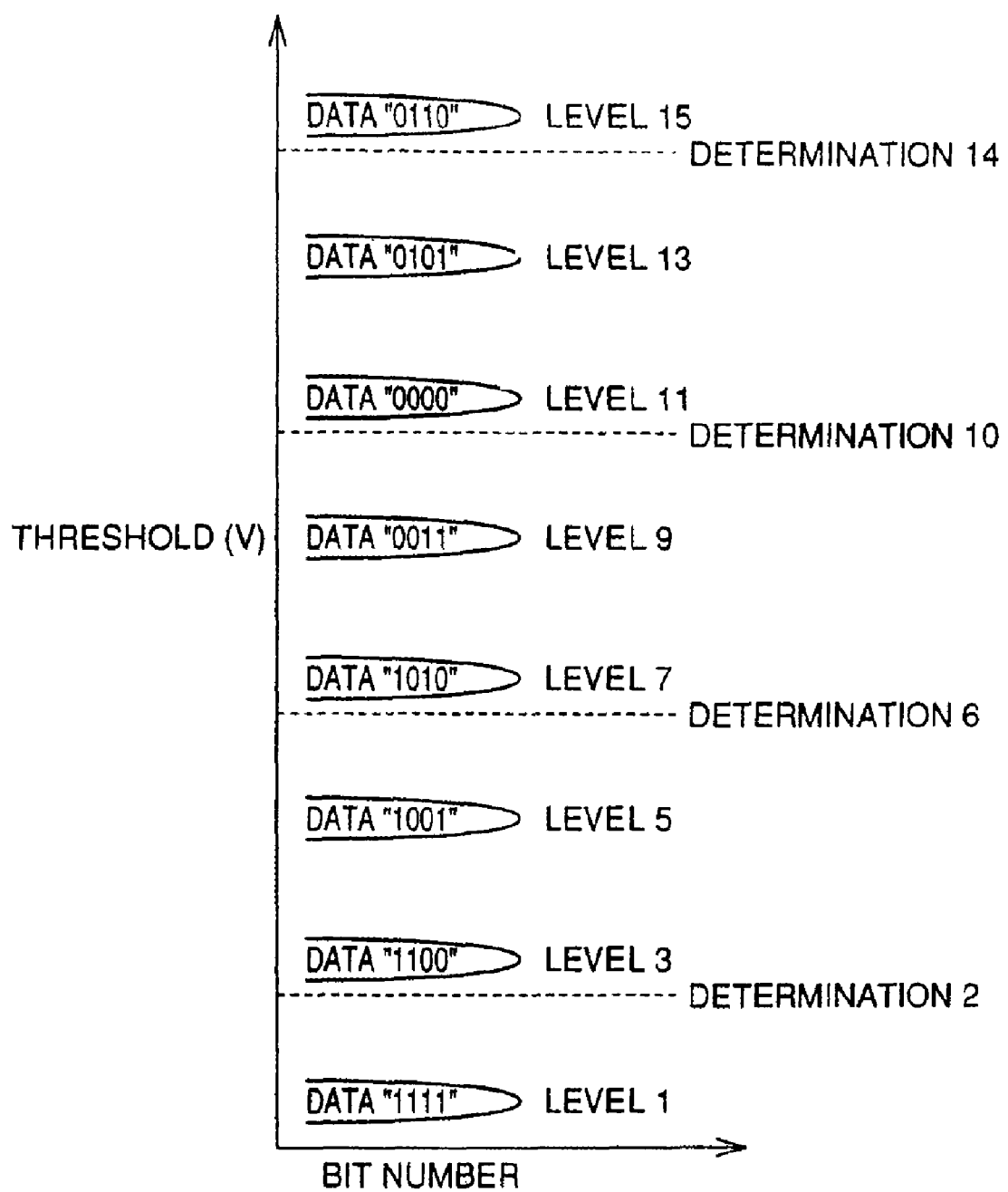
FIG. 87 illustrates thresholds of the memory cells and determination levels in the fourth to seventh processing steps of the write operation in the fifth embodiment.

FIG. 86 shows data held in the respective latches in the fourth to seventh processing steps of the write operation, and FIG. 87 shows thresholds of the memory cells and determination levels in the fourth to seventh processing steps of the write operation.

In a memory cell block subjected to the write operation, all memory cells are set to thresholds corresponding to data "1111".

Referring to FIGS. 82 and 83, input data (00h and FFh in hexadecimal notation) are stored in the data latch DL-1 and transferred to the sense latch SL in the first processing step of the write operation. Writing is performed up to a threshold corresponding to level 9 on the basis of the eighth determination level Vj8. During the write operation at the eighth determination level Vj8, data for two bytes in the remaining data are further stored in the data latch DL-2.

Referring to FIGS. 84 and 85, a write data conversion circuit 230 performs an operation on a corresponding set of bit data as to data contained in the data latches DL-1 and DL-2 in the second processing step of the write operation, thereby zeroing only bit data of the sense latch SL corresponding to such data that bits held in the data latch DL-1 are "1" and bits held in the data latch DL-2 are "0".

Data are written in the memory cells MC0 to MC15 corresponding to the respective bits of the sense latch SL on the basis of the data held in the sense latch SL in the aforementioned manner. The memory cells MC0 to MC15 are connected to the same word line WL. The fourth determination level Vj4 is employed as the determination value for a verify operation, and writing is performed up to level 5 of the thresholds.

At this time, data are written in memory cells corresponding to data "0" in the sense latch SL.

The data are written through an FN (Fowler-Nordheim) tunnel current by applying a high voltage to the word line WL.

A voltage below the word line voltage is applied to bit lines BL corresponding to the bit data "1" of the sense latch SL, in order to relax the voltage applied from the word line WL. Consequently, data are written in only memory cells connected with bit lines BL corresponding to the bit data "0" held in the sense latch SL.

Referring to FIGS. 84 and 85, further, the write data conversion circuit 230 performs an operation on a corresponding set of bit data as to data contained in the data latches DL-1 and DL-2 in the third processing step of the write operation, thereby zeroing only bit data of the sense latch SL corresponding to such data that bits held in the data latch DL-1 are "0" and bits held in the data latch DL-2 are "1".

Data are written in the memory cells MC0 to MC15 corresponding to the respective bits of the sense latch SL on the basis of the data held in the sense latch SL in the aforementioned manner. The twelfth determination level Vj12 is employed as the determination value for the verify operation, and writing is performed up to level 13 of the thresholds.

During the write operation at the twelfth determination level Vj12, data for the remaining quarter sector are stored in the data latch DL-3.

Referring to FIGS. 86 and 87, the write data conversion circuit 230 performs an operation on a corresponding set of bit data as to data contained in the data latches DL-1, DL-2 and DL-3 in the fourth processing step of the write operation, thereby zeroing only bit data of the sense latch SL corresponding to such data that bits held in the data latch DL-1 are "1", bits held in the data latch DL-2 are "1" and bits held in the data latch DL-3 are "0".

Data are written in the memory cells MC0 to MC15 corresponding to the respective bits of the sense latch SL on the basis of the data held in the sense latch SL in the aforementioned manner. The second determination level Vj2 is employed as the determination value for the verify operation, and writing is performed up to level 3 of the thresholds.

Referring to FIGS. 86 and 87, further, the write data conversion circuit 230 performs an operation on a corresponding set of bit data as to data contained in the data latches DL-1, DL-2 and DL-3 in the fifth processing step of the write operation, thereby zeroing only bit data of the sense latch SL corresponding to such data that bits held in the data latch DL-1 are "1", bits held in the data latch DL-2 are "0" and bits held in the data latch DL-3 are "1".

Data are written in the memory cells MC0 to MC15 corresponding to the respective bits of the sense latch SL on the basis of the data held in the sense latch SL in the aforementioned manner. The sixth determination level Vj6 is employed as the determination value for the verify operation, and writing is performed up to level 7 of the thresholds.

Similarly, bit data of the sense latch SL corresponding to such data that a set of bit data held in the data latches DL-1, DL-2 and DL-3 correspond to (0, 0, 0) are zeroed. Then, the tenth determination level Vj10 is employed as the determination value for the verify operation, and writing is performed up to level 11 of the thresholds.

In the seventh processing step of the write operation, bit data of the sense latch SL corresponding to such data that a set of bit data held in the data latches DL-1, DL-2 and DL-3 correspond to (0, 1, 1) are zeroed. Then, the fourteenth determination level Vj14 is employed as the determination value for the verify operation, and writing is performed up to level 15 of the thresholds. During the write operation up to level 15, data of the remaining two bytes are further stored in the data latch DL-4.

In eighth to fifteenth processing steps (not shown) of the write operation, bit data of the sense latch SL corresponding to such data that sets of bit data held in the data latches DL-1, DL-2, DL-3 and DL-4 correspond to (1, 1, 1, 0), (1, 1, 0, 1), (1, 0, 0, 0), (1, 0, 1, 1), (0, 0, 1, 0), (0, 0, 0, 1), (0, 1, 0, 0) and (0, 1, 1, 1) are zeroed. Then, the first, third, fifth, seventh, ninth, eleventh, thirteenth and fifteenth determination levels are employed as the determination value for the verify operation, and writing is performed up to threshold levels corresponding to the respective steps. In a 16-valued flash memory according to the fifth embodiment, as hereinabove described, the write operation is already started while data are input in at least one of a plurality of data latch circuits after input of a write command, whereby the write time can be reduced.

Sixth Embodiment

While the above description has been made with reference to four data latch circuits, three data latch circuits are sufficient for outputting data, NORing data and ORing bits respectively.

The flow of processing for writing data in 16-valued memory cells with three data latch circuits DL-1 to DL-3 is now described.

FIGS. 88 to 117 are conceptual diagrams showing data held in the data latches DL-1 to DL-3 and a sense latch SL as well as thresholds of memory cells and determination levels in writing in first to fifteenth processing steps of the write operation.

Figure 88:
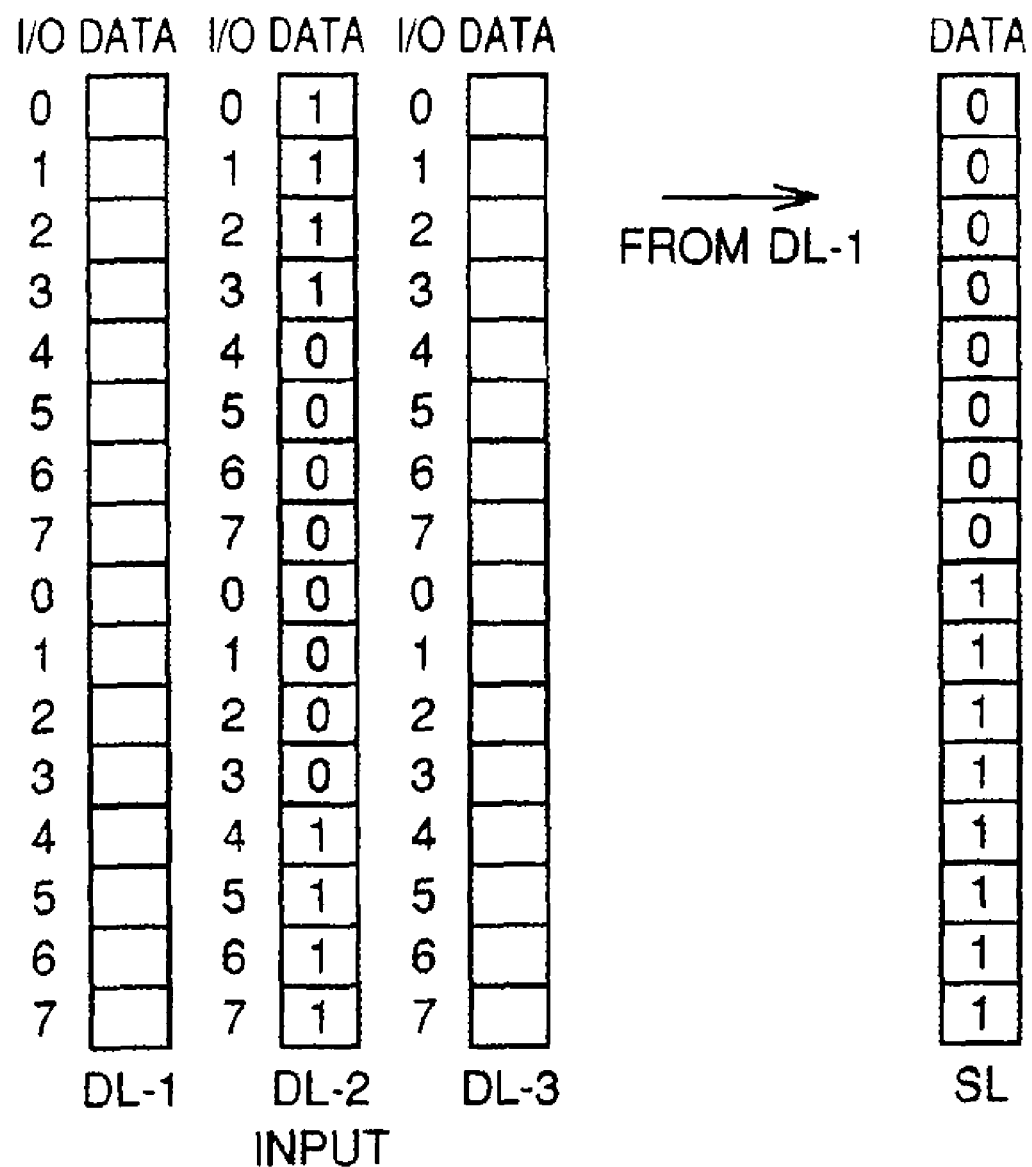
FIG. 88 illustrates data held in respective latches in a first processing step of a write operation in a flash memory according to a sixth embodiment of the present invention.
Figure 89:
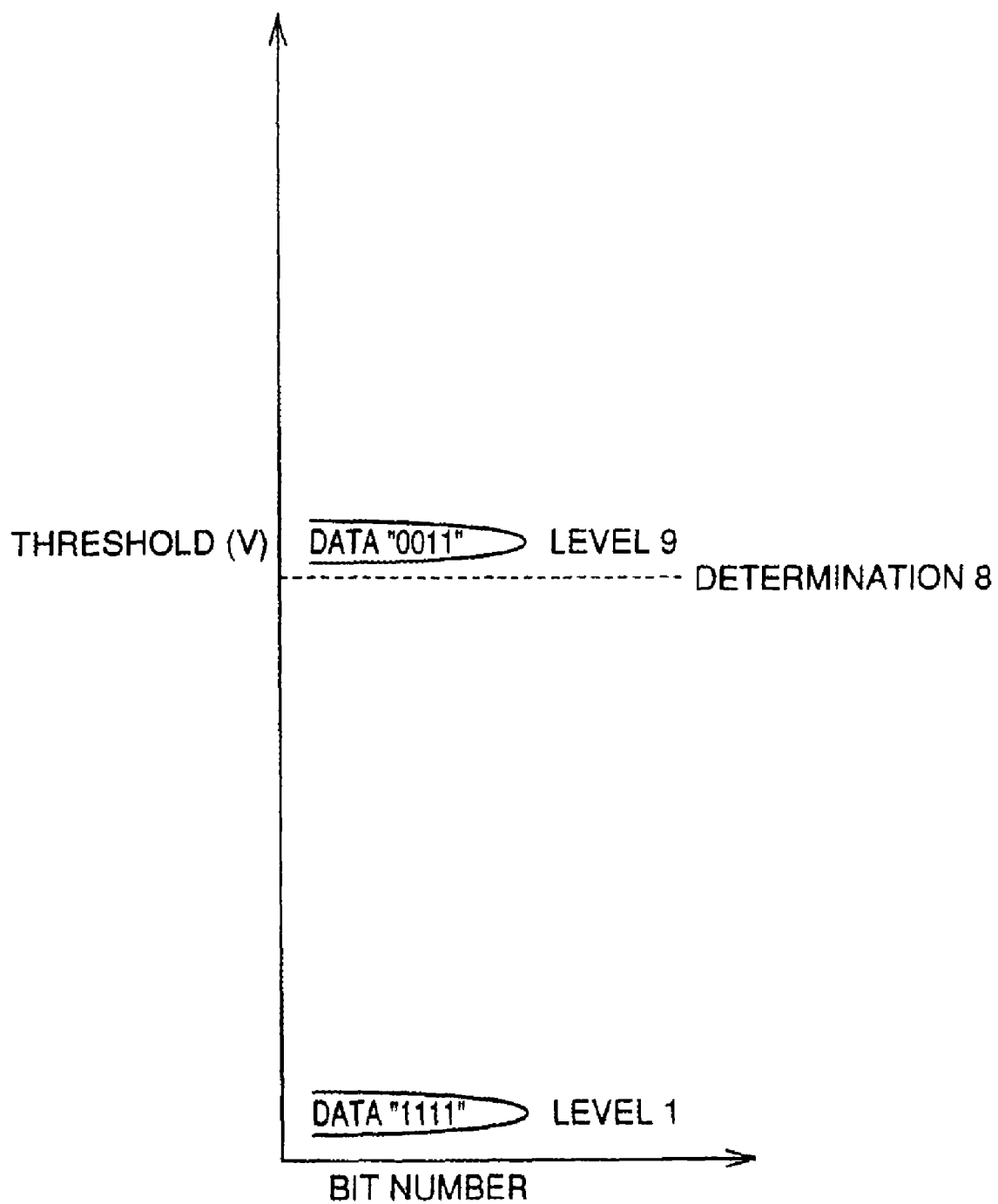
FIG. 89 illustrates thresholds of memory cells and determination levels in the first processing step of the write operation in the sixth embodiment.

FIG. 88 shows data held in the respective latches in the first processing step of the write operation, and FIG. 89 shows thresholds of the memory cells and determination levels in the first processing step of the write operation.

In a memory cell block subjected to the write operation, all memory cells are set to thresholds corresponding to data "1111".

Referring to FIGS. 88 and 89, input data (00h and FFh in hexadecimal notation) are stored in the data latch DL-1 and transferred to the sense latch SL in the first processing step of the write operation. Writing is performed up to a threshold corresponding to level 9 on the basis of an eighth determination level Vj8. During the write operation at the eighth determination level Vj8, data for two bytes in the remaining data are further stored in the data latch DL-2.

Data are read at the eighth determination level Vj8 again and stored in the sense latch SL.

Figure 91:
FIG. 91 illustrates thresholds of the memory cells and determination levels in the second processing step of the write operation in the sixth embodiment.

FIG. 90 shows data held in the respective latches in the second processing step of the write operation, and FIG. 91 shows thresholds of the memory cells and determination levels in the second processing step of the write operation.

Referring to FIGS. 90 and 91, a write data conversion circuit 230 performs an operation on a corresponding set of bit data as to data contained in the sense latch SL and the data latch DL-2 thereby zeroing only bit data of the sense latch SL corresponding to such data that bits held in the sense latch SL are "1" and bits held in the data latch DL-2 are "0".

Data are written in memory cells MC0 to MC15 corresponding to the respective bits of the sense latch SL on the basis of the data held in the sense latch SL in the aforementioned manner. A fourth determination level Vj4 is employed as the determination value for a verify operation, and writing is performed from level 1 up to level 5 of the thresholds.

Referring to FIGS. 90 and 91, further, data are read at the eighth determination level Vj8 and stored in the sense latch SL also in the second processing step of the write operation. The write data conversion circuit 230 performs an operation on a corresponding set of bit data as to data contained in the sense latch SL and the data latch DL-2 thereby zeroing only bit data of the sense latch SL corresponding to such data that bits held in the sense latch SL are "0" and bits held in the data latch DL-2 are "1".

Data are written in the memory cells MC0 to MC15 corresponding to the respective bits of the sense latch SL on the basis of the data held in the sense latch SL in the aforementioned manner in response to a twelfth determination level Vj12 from level 9 up to level 13 of the thresholds.

While data writing up to level 13 is performed, data of the remaining two bytes are further stored in the data latch DL-3.

In the aforementioned operations up to the second processing step of the write operation, reading at the determination level Vj8 may not be performed each time but data may be held without clearing the data latch DL-1 for employing the data in the data latch DL-1 in place of the data held in the sense latch SL in the read operation. In the above description, however, reading at the determination level Vj8 is performed for matching with the following procedure.

Figure 93:
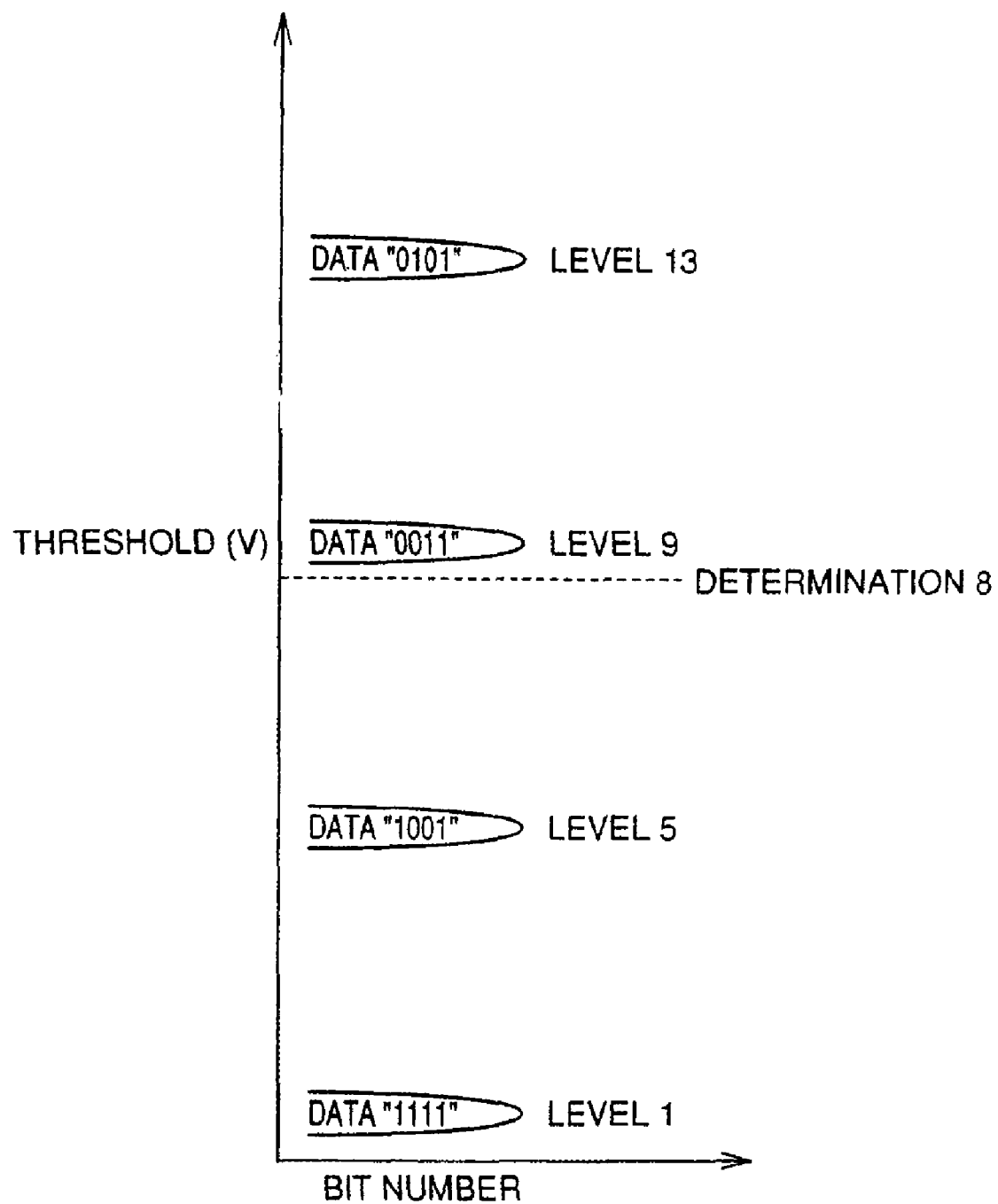
FIG. 93 illustrates thresholds of the memory cells and determination levels in the third processing step of the write operation in the sixth embodiment.

FIG. 92 shows data held in the respective latches in the third processing step of the write operation, and FIG. 93 shows thresholds of the memory cells and determination levels in the third processing step of the write operation.

Referring to FIGS. 92 and 93, data are read at the eighth determination level Vj8 and stored in the sense latch SL in the third processing step of the write operation. A control circuit 210 transfers inverted data of the data in the sense latch SL to the data latch DL-1.

Figure 95:
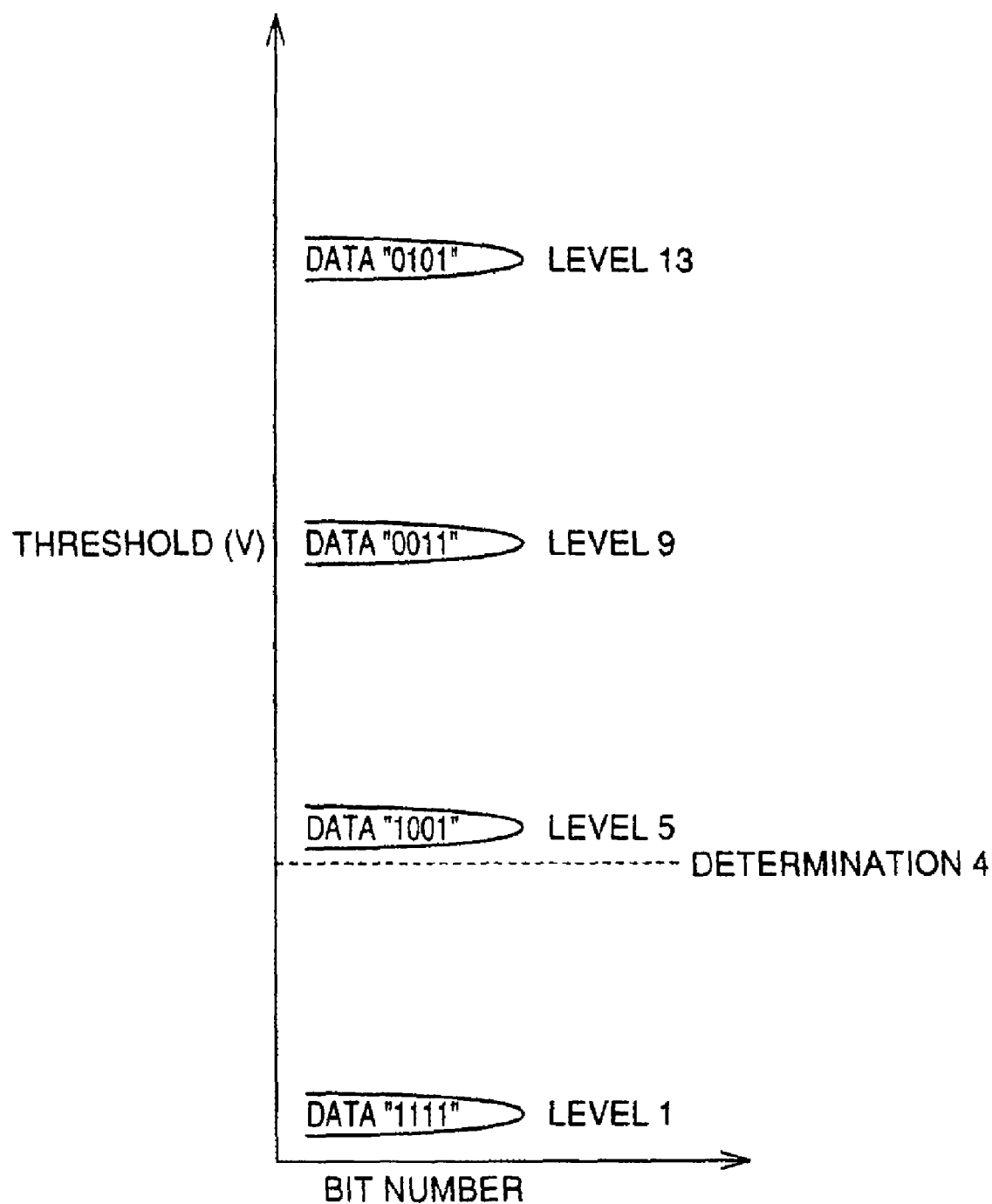
FIG. 95 illustrates thresholds of the memory cells and determination levels in the fourth processing step of the write operation in the sixth embodiment.

FIG. 94 shows data held in the respective latches in the fourth processing step of the write operation, and FIG. 95 shows thresholds of the memory cells and determination levels in the fourth processing step of the write operation.

In the fourth processing step of the write operation, data are read at the fourth determination level Vj4 and stored in the sense latch SL.

The write data conversion circuit 230 stores results of an OR operation on a corresponding set of bit data as to data contained in the sense latch SL and the data latch DL-1 in the data latch DL1.

Figure 97:
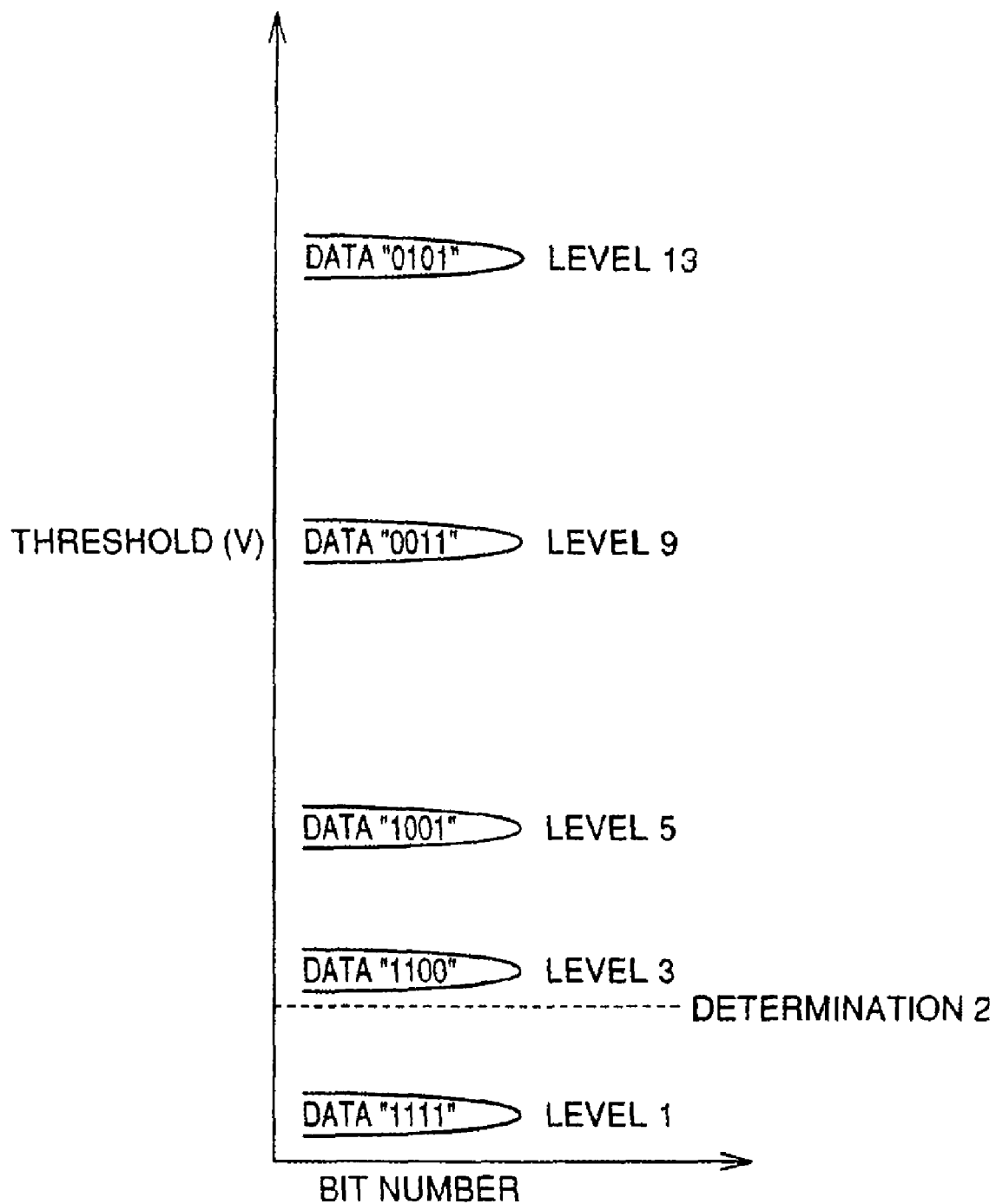
FIG. 97 illustrates thresholds of the memory cells and determination levels in the fifth processing step of the write operation in the sixth embodiment.

FIG. 96 shows data held in the respective latches in the fifth processing step of the write operation, and FIG. 97 shows thresholds of the memory cells and determination levels in the fifth processing step of the write operation.

The write data conversion circuit 230 performs an operation on a corresponding set of bit data as to data contained in the data latch DL-3 and the sense latch SL for zeroing only bit data of the sense latch SL corresponding to such data that bits held in the data latch DL-3 are "1" and bits held in the sense latch SL are "1".

Data are written in the memory cells MC0 to MC15 corresponding to the respective bits of the sense latch SL in level 1 to level 3 of the thresholds on the basis of the data held in the sense latch SL in the aforementioned manner while employing a second determination level Vj2 for a verify voltage.

During writing at the second determination level Vj2, data of the remaining two bytes are stored in the data latch DL-2.

Figure 99:
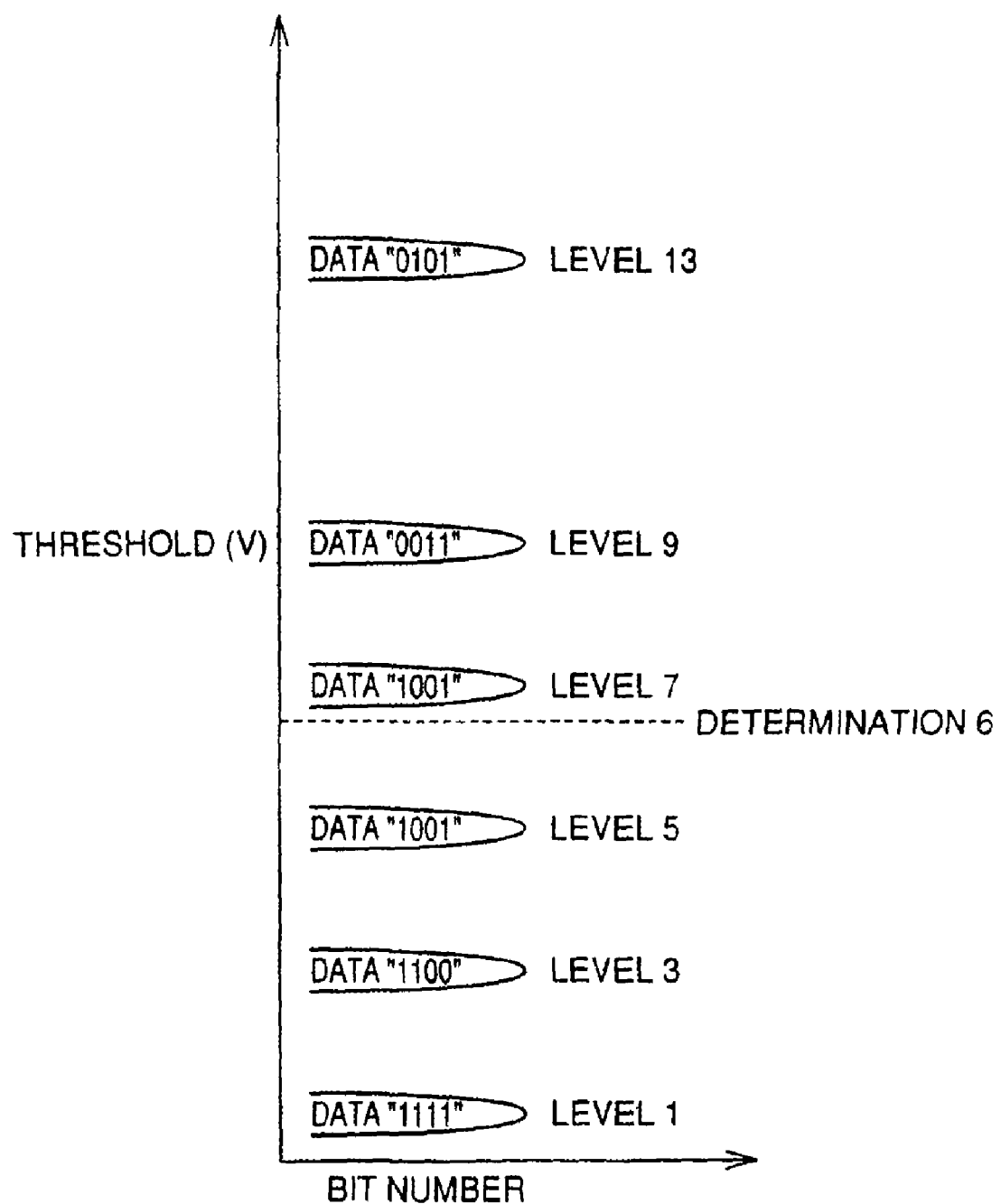
FIG. 99 illustrates thresholds of the memory cells and determination levels in the sixth processing step of the write operation in the sixth embodiment.

FIG. 98 shows data held in the respective latches in the sixth processing step of the write operation, and FIG. 99 shows thresholds of the memory cells and determination levels in the sixth processing step of the write operation.

The write conversion data circuit 230 performs an operation on a corresponding set of bit data as to data contained in the data latches DL-1 and DL-3 for zeroing only bit data of the sense latch SL corresponding to such data that bits held in the data latch DL-1 are "0" and bits held in the data latch DL-3 are "1".

Data are written in the memory cells MC0 to MC15 corresponding to the respective bits of the sense latch SL in level 5 up to level 7 of the thresholds on the basis of the data held in the sense latch SL in the aforementioned manner while employing a determination level Vj6 for the verify voltage.

Figure 101:
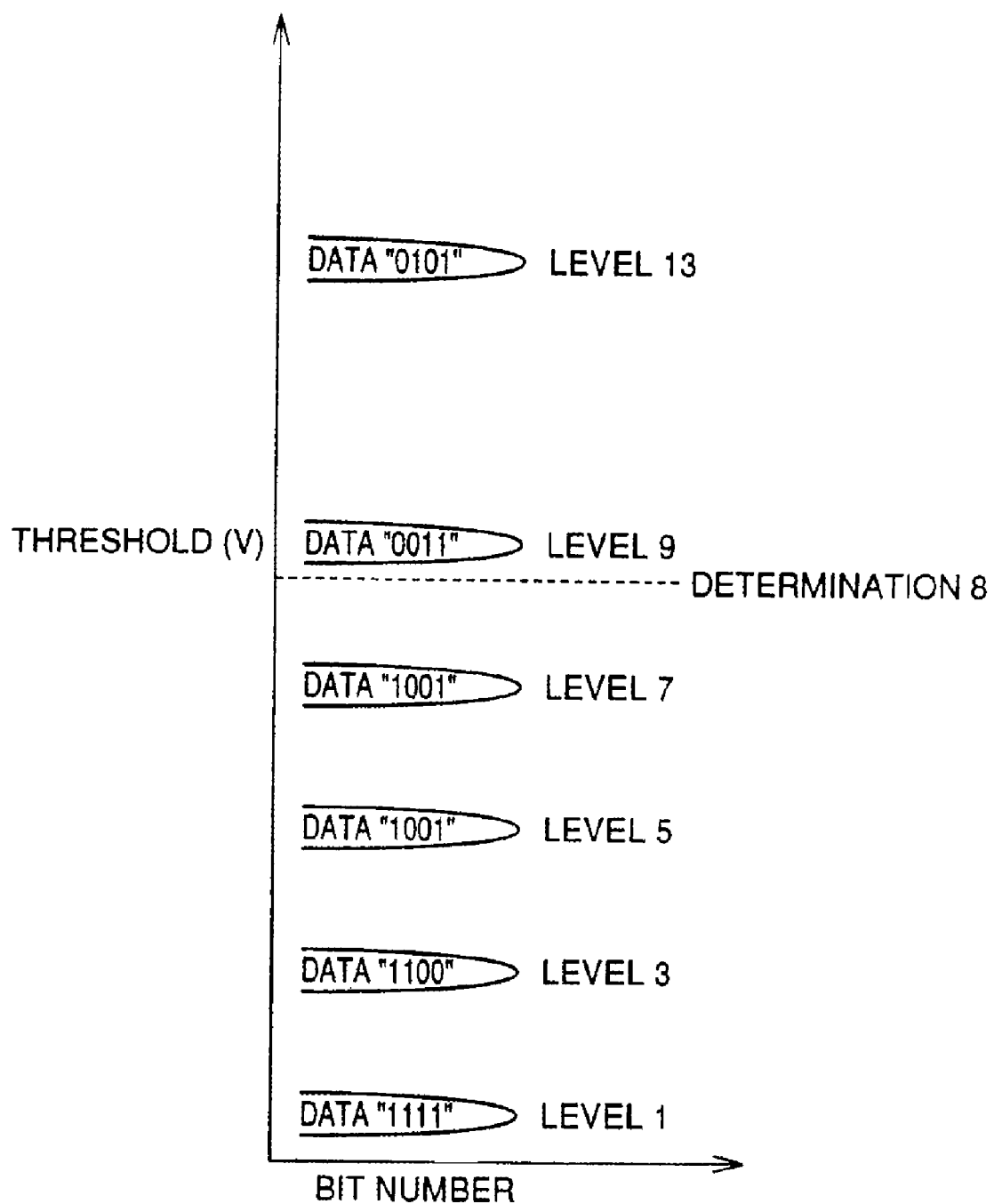
FIG. 101 illustrates thresholds of the memory cells and determination levels in the seventh processing step of the write operation in the sixth embodiment.

FIG. 100 shows data held in the respective latches in the seventh processing step of the write operation, and FIG. 101 shows thresholds of the memory cells and determination levels in the seventh processing step of the write operation.

In the seventh processing step of the write operation, data are read at the eighth determination level Vj8 and stored in the sense latch SL, and thereafter the control circuit 210 transfers data from the sense latch SL to the data latch DL-1.

Figure 103:
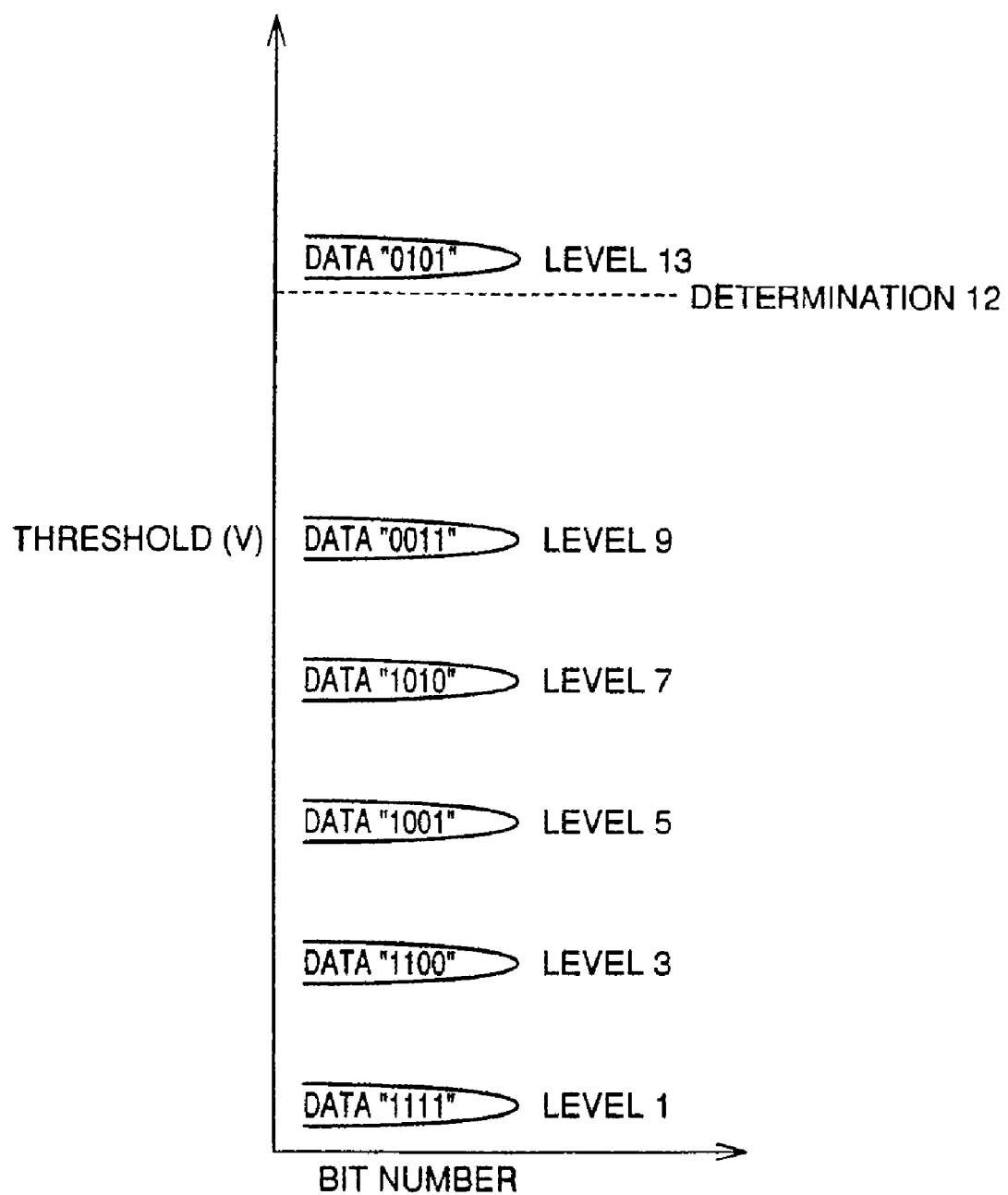
FIG. 103 illustrates thresholds of the memory cells and determination levels in the eighth processing step of the write operation in the sixth embodiment.

FIG. 102 shows data held in the respective latches in the eighth processing step of the write operation, and FIG. 103 shows thresholds of the memory cells and determination levels in the eighth processing step of the write operation.

In the eighth processing step of the write operation, data are read at a twelfth determination level Vj12 and stored in the sense latch SL.

The write data conversion circuit 230 performs an OR operation on a corresponding set of bit data as to inverted data of data held in the sense latch SL and data contained in the data latch DL-1 and stores the results of the operation in the data latch DL-1.

Figure 105:
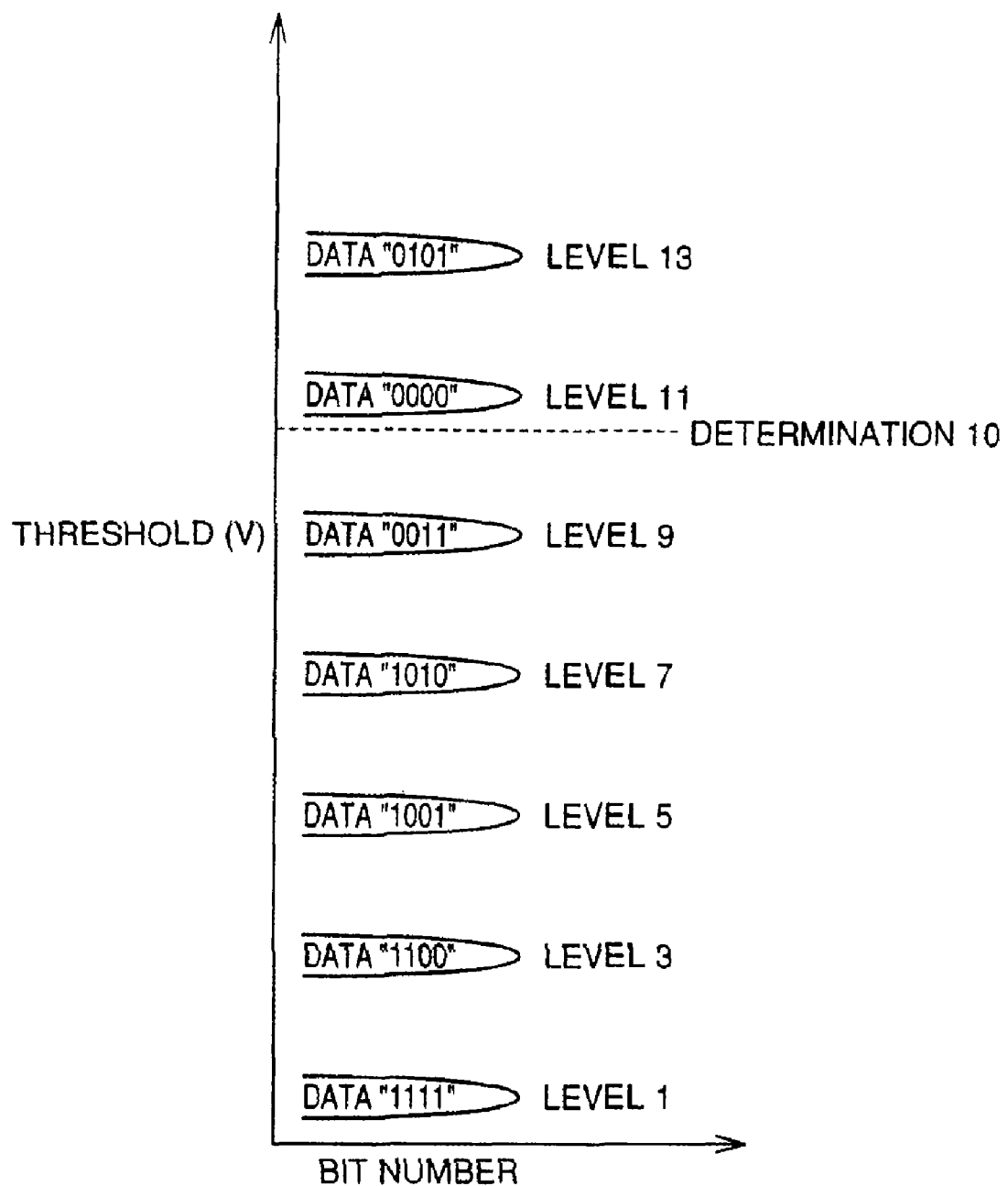
FIG. 105 illustrates thresholds of the memory cells and determination levels in the ninth processing step of the write operation in the sixth embodiment.

FIG. 104 shows data held in the respective latches in the ninth processing step of the write operation, and FIG. 105 shows thresholds of the memory cells and determination levels in the ninth processing step of the write operation.

The write data conversion circuit 230 performs an operation on a corresponding set of bit data as to data contained in the data latches DL-1 and DL-3 for zeroing only bit data of the sense latch SL corresponding to such data that bits held in the data latch DL-1 are "0" and bits held in the data latch DL-3 are "0".

Data are written in the memory cells MC0 to MC15 corresponding to the respective bits of the sense latch SL in level 9 up to level 11 of the thresholds on the basis of the data held in the sense latch SL in the aforementioned manner while employing a determination level Vj10 for the verify voltage.

Figure 107:
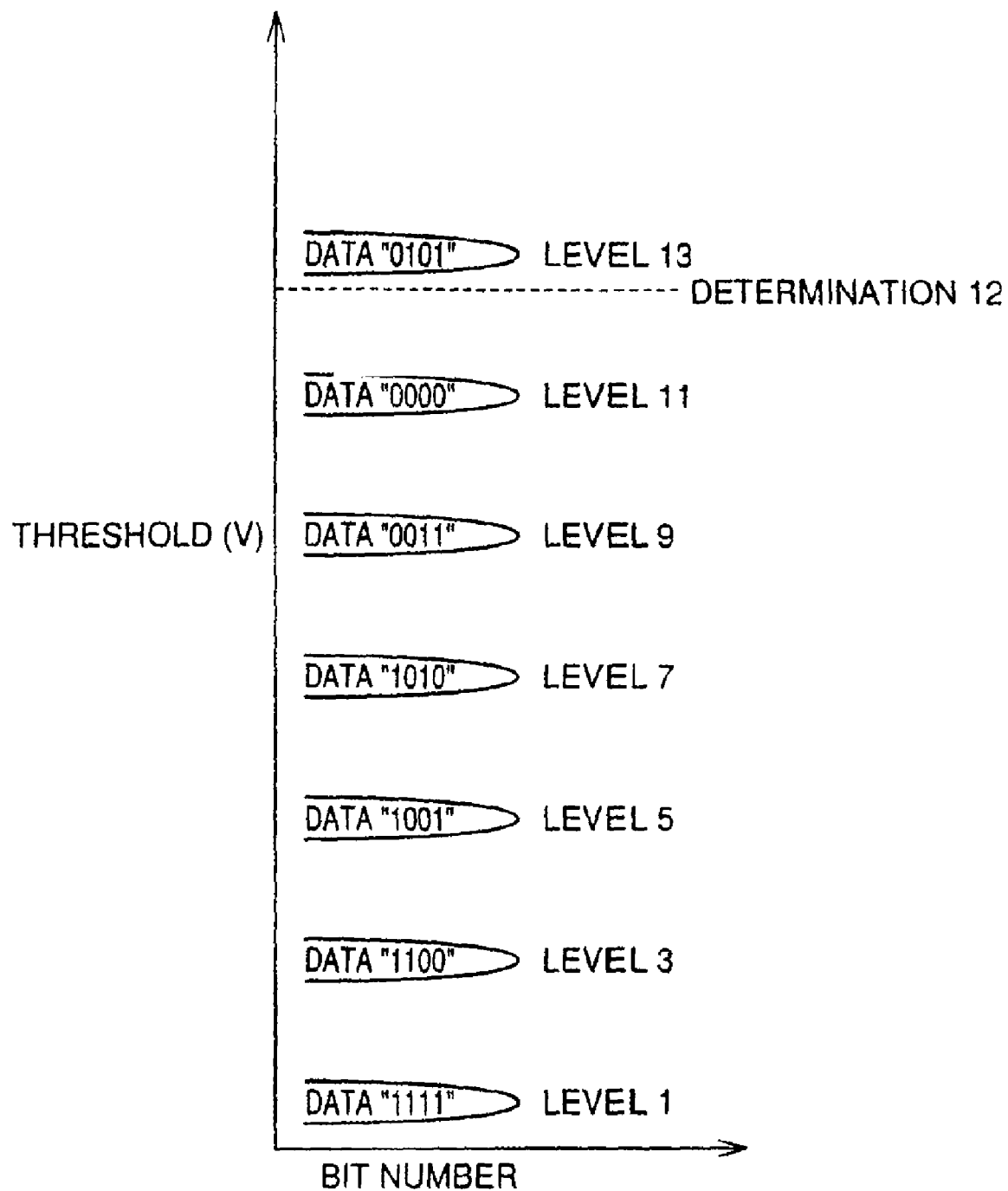
FIG. 107 illustrates thresholds of the memory cells and determination levels in the tenth processing step of the write operation in the sixth embodiment.

FIG. 106 shows data held in the respective latches in the tenth processing step of the write operation, and FIG. 107 shows thresholds of the memory cells and determination levels in the tenth processing step of the write operation.

In the tenth processing step of the write operation, data are read at the twelfth determination level Vj12 and stored in the sense latch SL.

The write data conversion circuit 230 performs an operation on a corresponding set of bit data as to data contained in the sense latch SL and the data latch DL-3 for zeroing only bit data of the sense latch SL corresponding to such data that bits held in the sense latch SL are "0" and bits held in the data latch DL-3 are "1".

Figure 109:
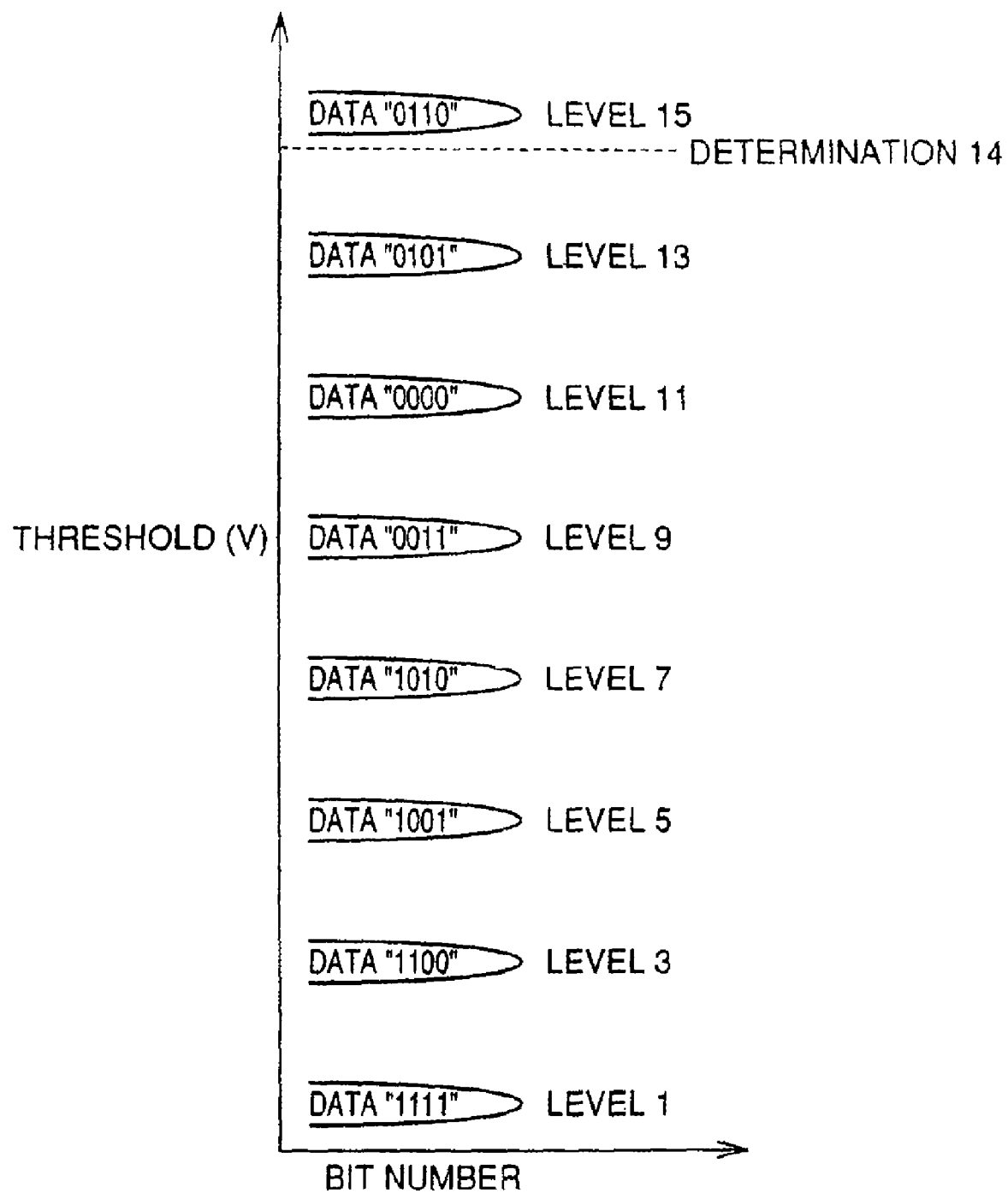
FIG. 109 illustrates thresholds of the memory cells and determination levels in the eleventh processing step of the write operation in the sixth embodiment.

FIG. 108 shows data held in the respective latches in the eleventh processing step of the write operation, and FIG. 109 shows thresholds of the memory cells and determination levels in the eleventh processing step of the write operation.

In the eleventh processing step of the write operation, data are written in the memory cells MC0 to MC15 corresponding to the respective bits of the sense latch SL in level 13 up to level 15 of the thresholds on the basis of the data held in the sense latch SL while employing a determination level Vj14 for the verify voltage.

Figure 111:
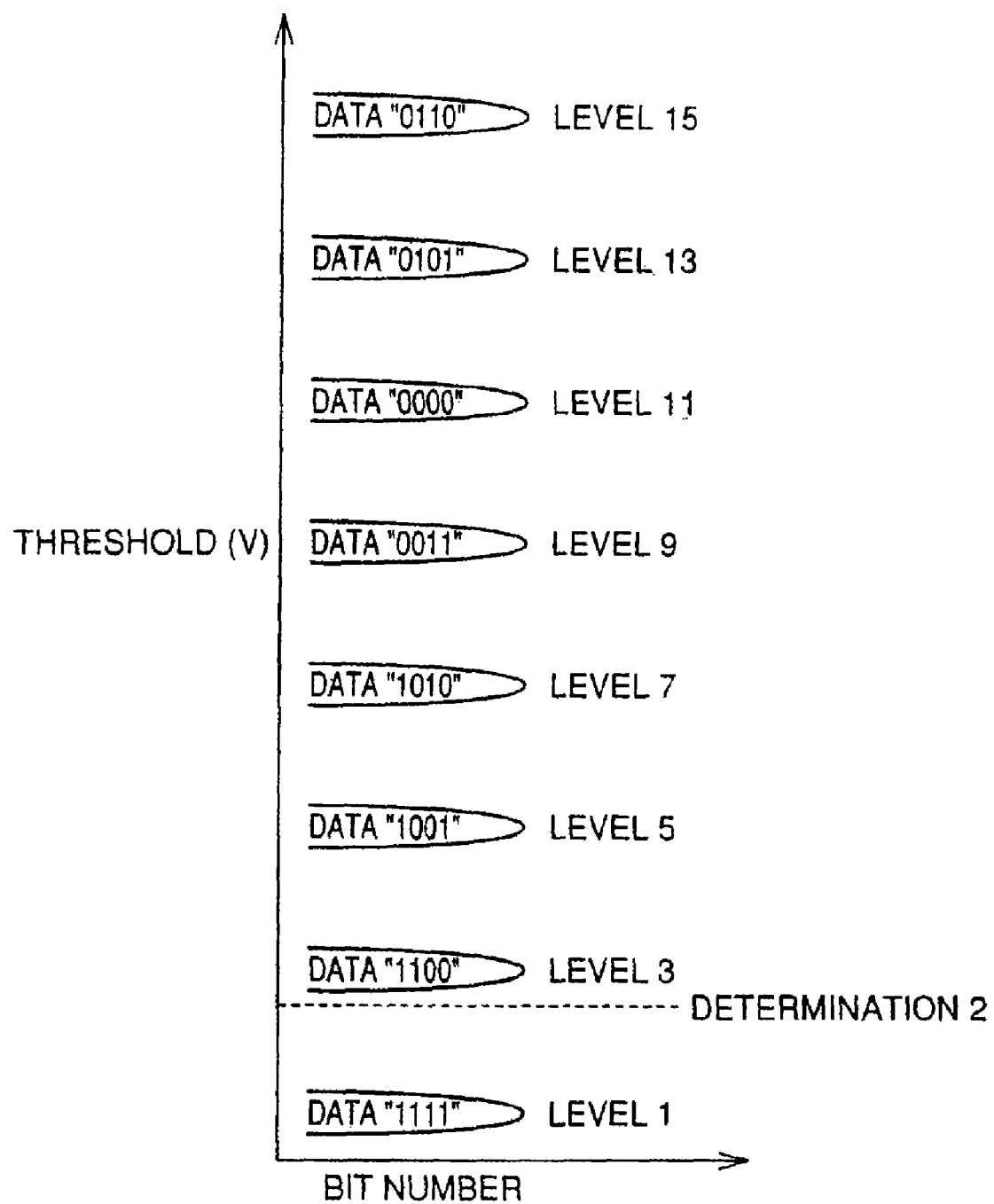
FIG. 111 illustrates thresholds of the memory cells and determination levels in the twelfth processing step of the write operation in the sixth embodiment.

FIG. 110 shows data held in the respective latches in the twelfth processing step of the write operation, and FIG. 111 shows thresholds of the memory cells and determination levels in the twelfth processing step of the write operation.

In the twelfth step of the write operation, data are read at the second determination level Vj2 and stored in the sense latch SL. The control circuit 210 transfers the data of the sense latch SL to the data latch DL1.

The write data conversion circuit 230 performs an operation on a corresponding set of bit data as to data contained in the sense latch SL and the data latch DL-2 for zeroing only bit data of the sense latch SL corresponding to such data that bits held in the sense latch SL are "1" and bits held in the data latch DL-2 are "0".

Figure 113:
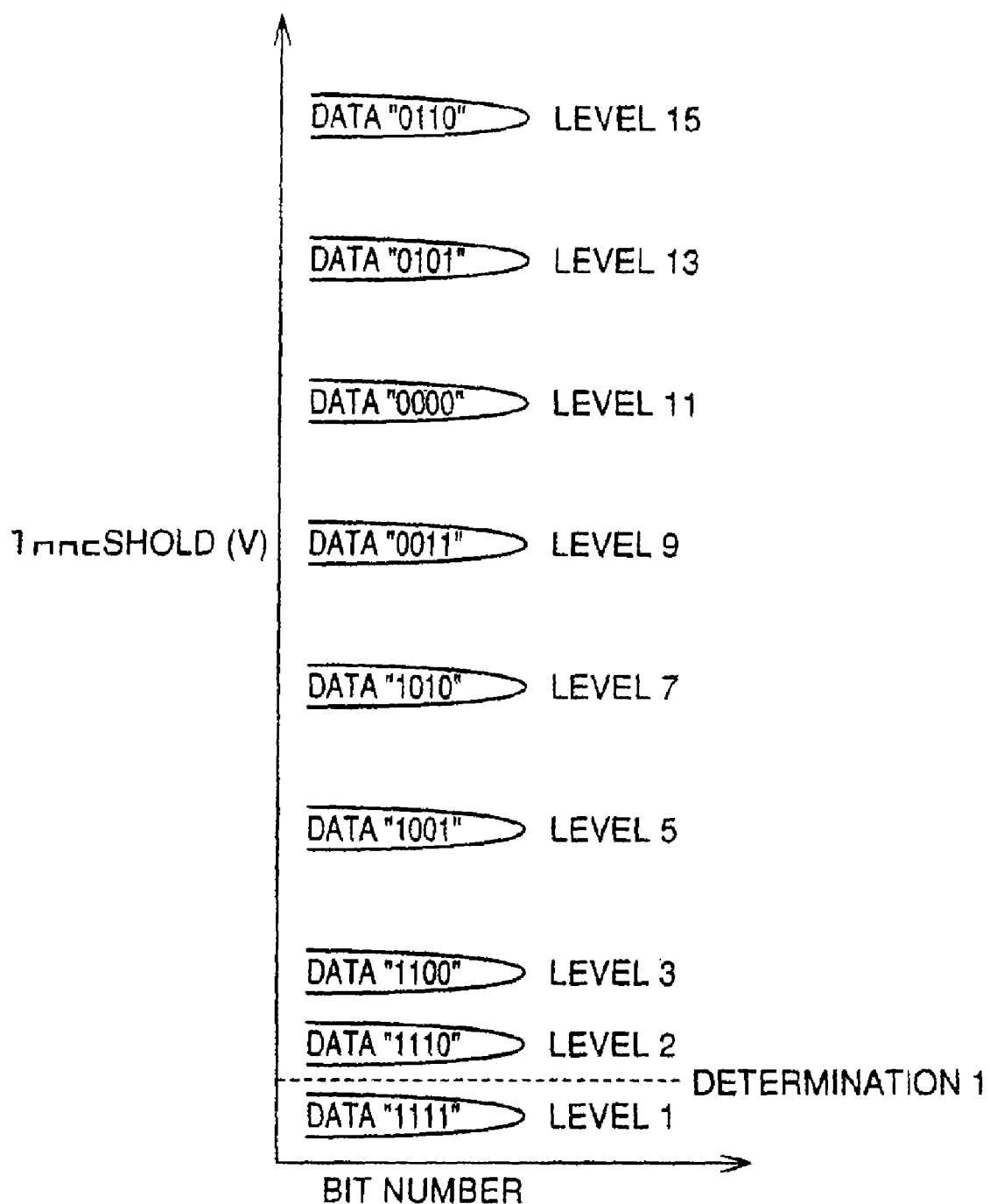
FIG. 113 illustrates thresholds of the memory cells and determination levels in the thirteenth processing step of the write operation in the sixth embodiment.

FIG. 112 shows data held in the respective latches in the thirteenth processing step of the write operation, and FIG. 113 shows thresholds of the memory cells and determination levels in the thirteenth processing step of the write operation.

In the thirteenth processing step of the write operation, data are written in the memory cells MC0 to MC15 corresponding to the respective bits of the sense latch SL from level 1 to level 2 of the thresholds on the basis of the data held in the sense latch SL while employing a determination level Vj1 for the verify voltage.

Figure 115:
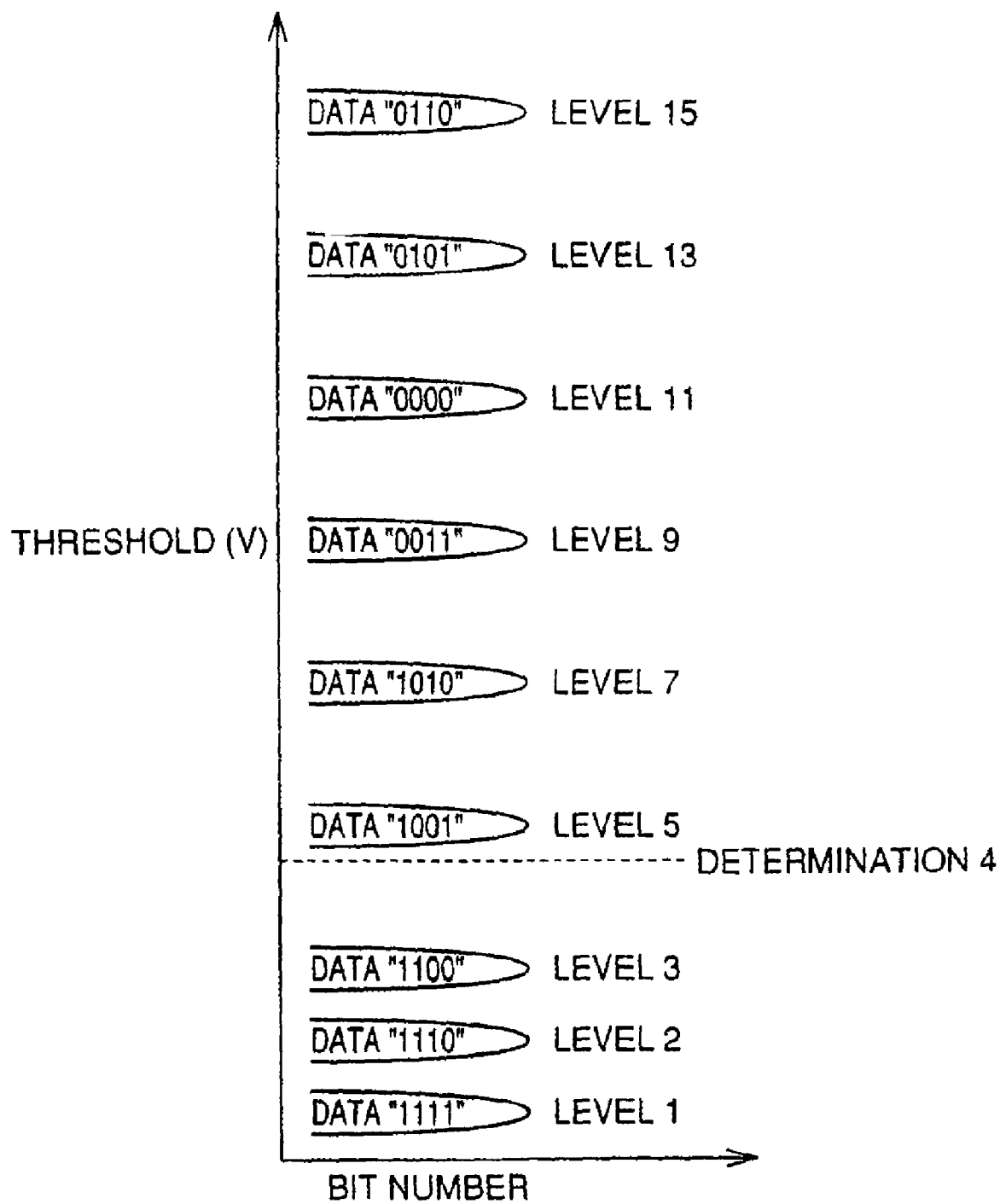
FIG. 115 illustrates thresholds of the memory cells and determination levels in the fourteenth processing step of the write operation in the sixth embodiment.

FIG. 114 shows data held in the respective latches in the fourteenth processing step of the write operation, and FIG. 115 shows thresholds of the memory cells and determination levels in the fourteenth processing step of the write operation.

In the fourteenth step of the write operation, data are read at the fourth determination level Vj4 and stored in the sense latch SL.

The write data conversion circuit 230 performs an OR operation on a corresponding set of bit data as to inverted data of data held in the sense latch SL and data contained in the data latch DL-1 and stores the results of the operation in the data latch DL-1.

Figure 116:
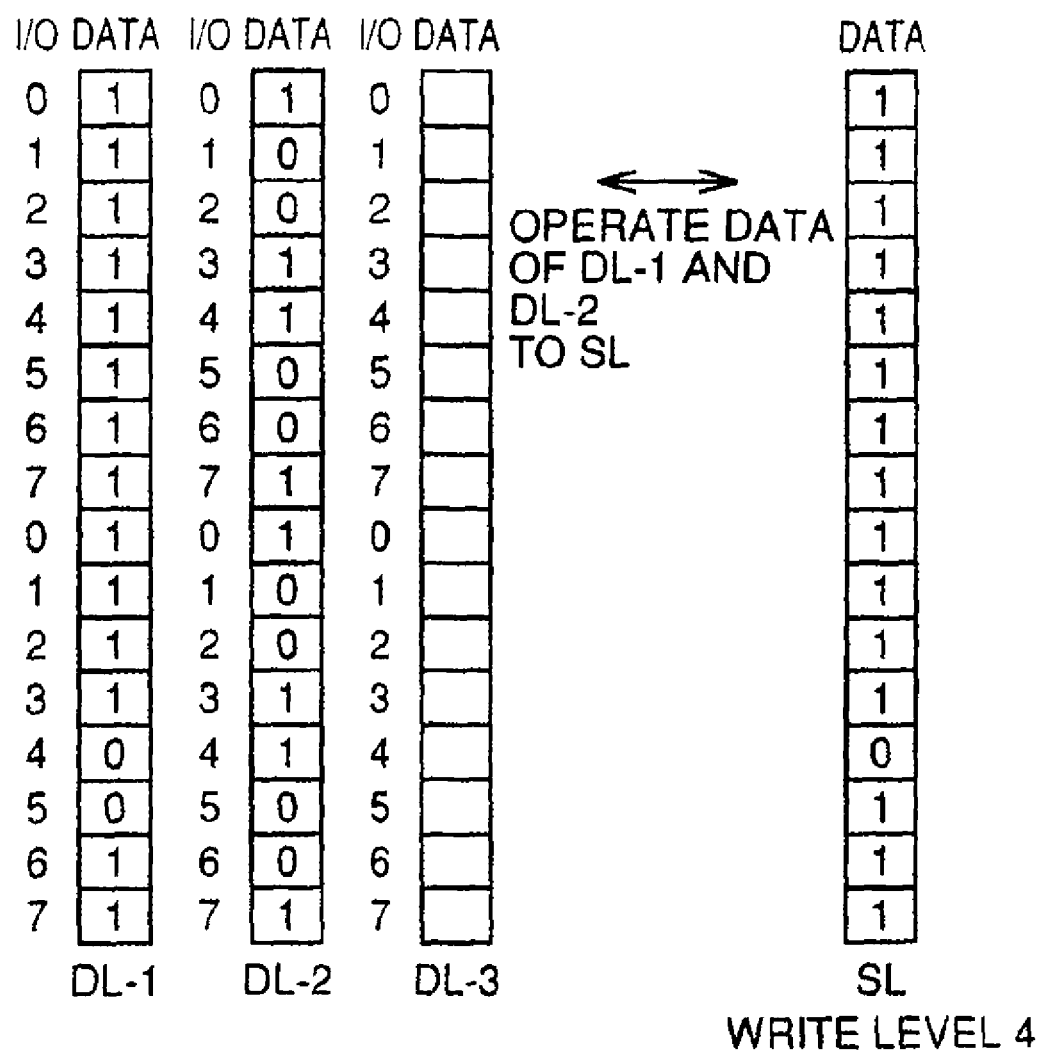
FIG. 116 illustrates data held in the respective latches in a fifteenth processing step of the write operation in the sixth embodiment of the present invention.
Figure 117:
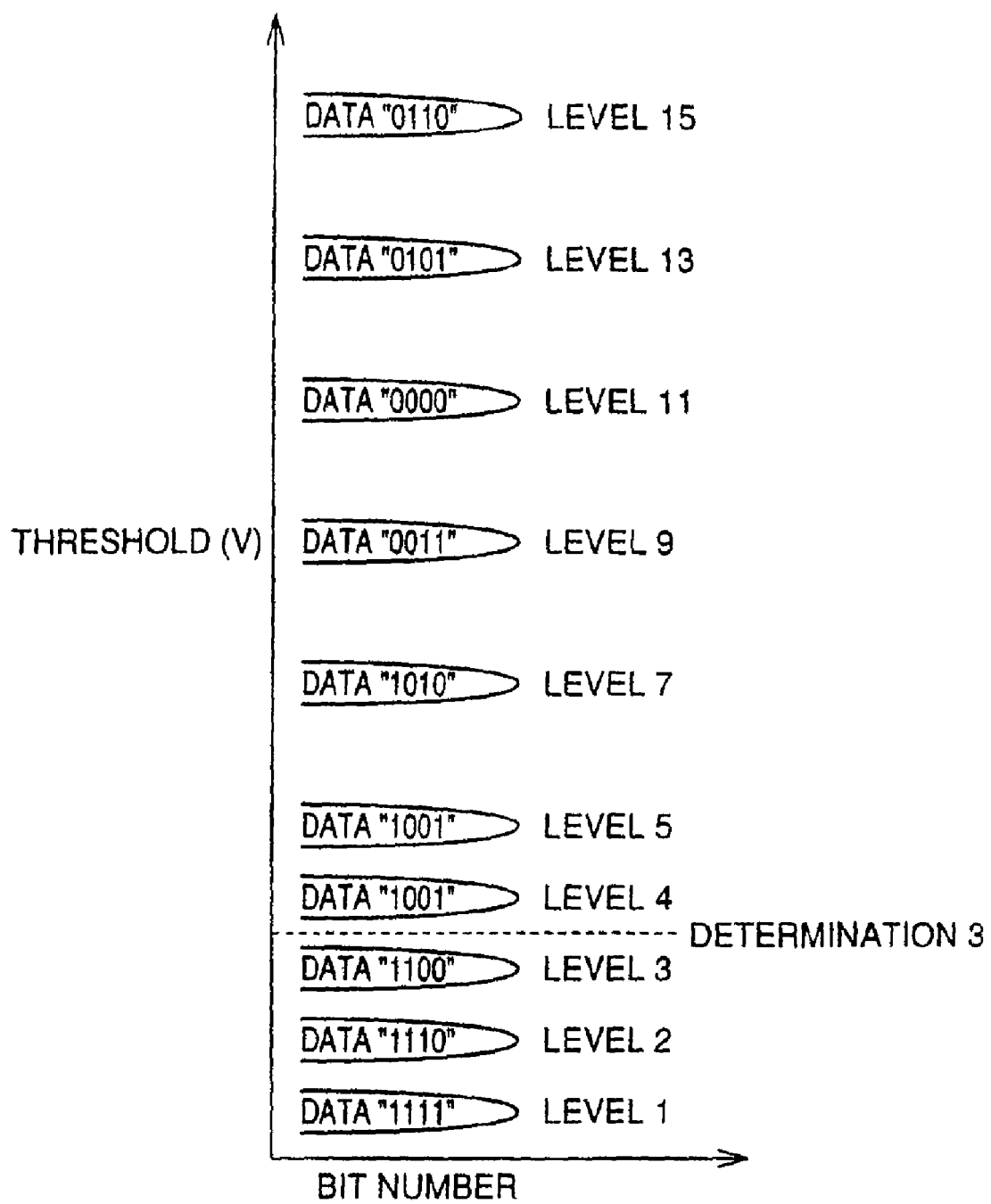
FIG. 117 illustrates thresholds of the memory cells and determination levels in the fifteenth processing step of the write operation in the sixth embodiment.
Figure 118:
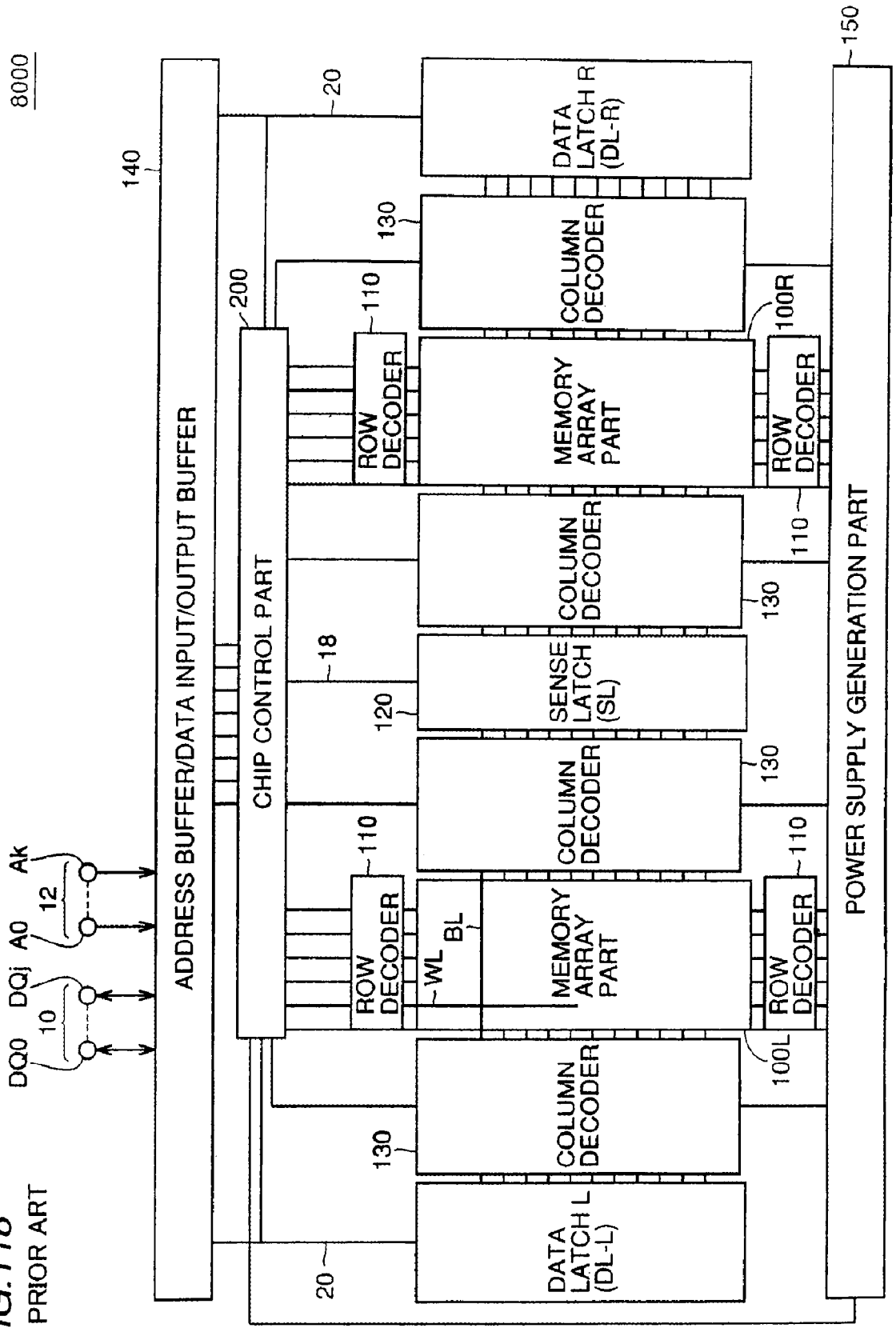
FIG. 118 is a schematic block diagram showing the overall structure of a conventional AND flash memory 8000.
Figure 119:
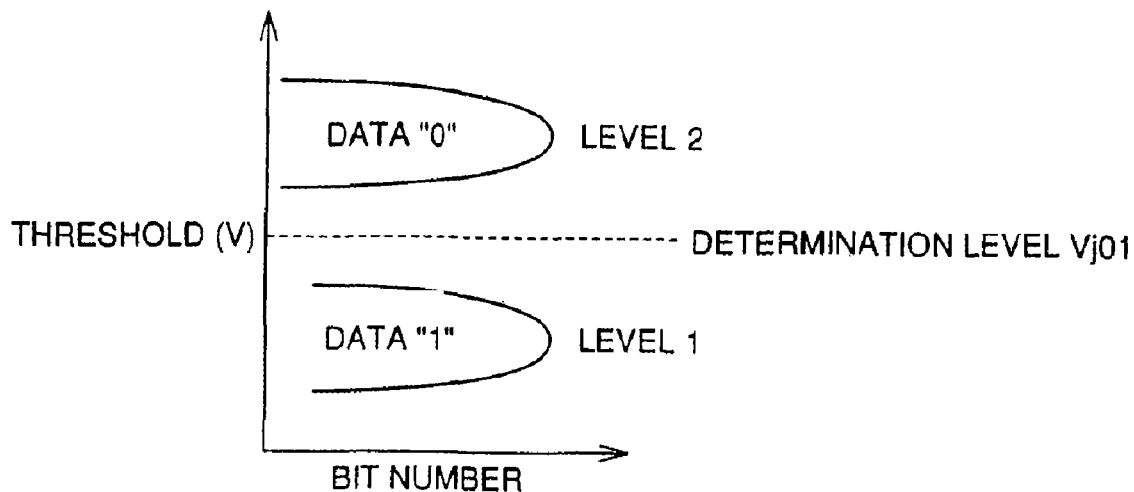
FIG. 119 illustrates the relation between write data and thresholds of memory cell transistors in a conventional two-valued AND flash memory.
Figure 120:
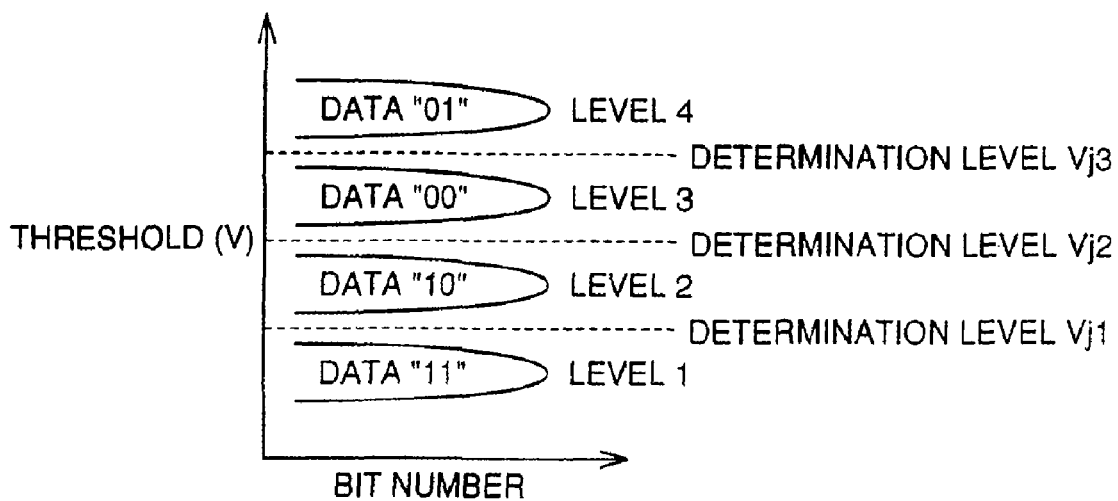
FIG. 120 illustrates the relation between write data and thresholds of memory cell transistors in the conventional four-valued AND flash memory 8000.
Figure 121:
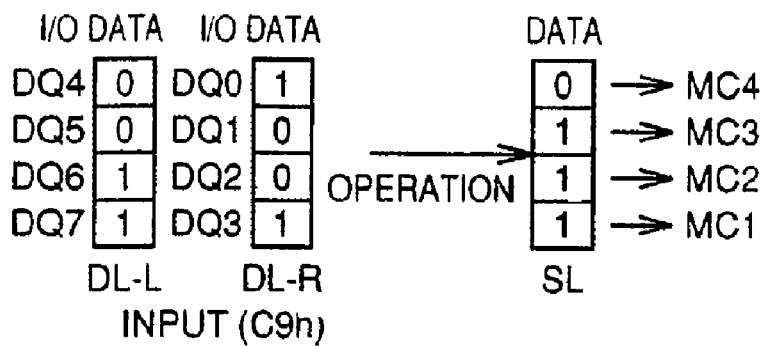
FIG. 121 illustrates data held in respective latches in a first processing step of a conventional write operation.
Figure 122:
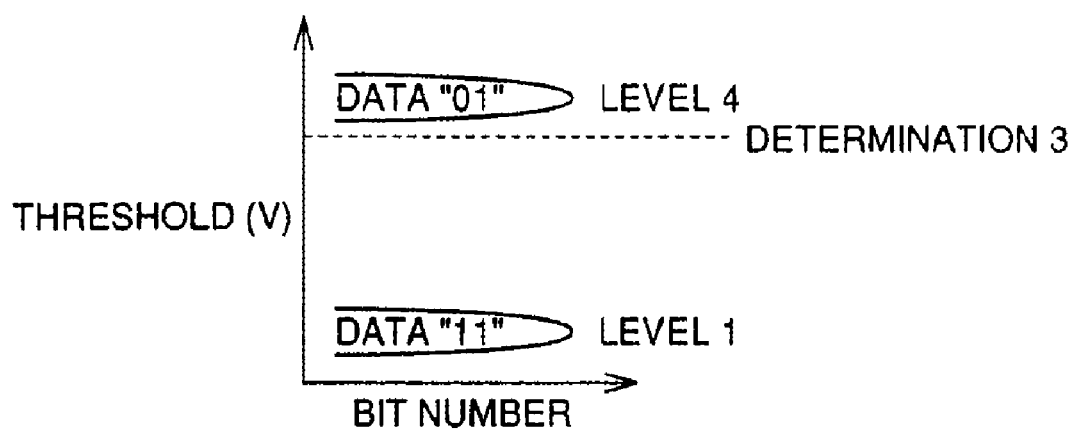
FIG. 122 illustrates thresholds of memory cells in the first processing step of the conventional write operation.
Figure 123:
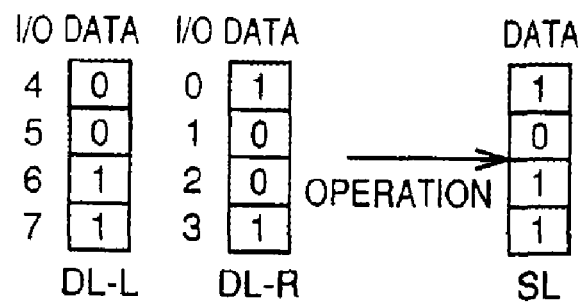
Figure 124:
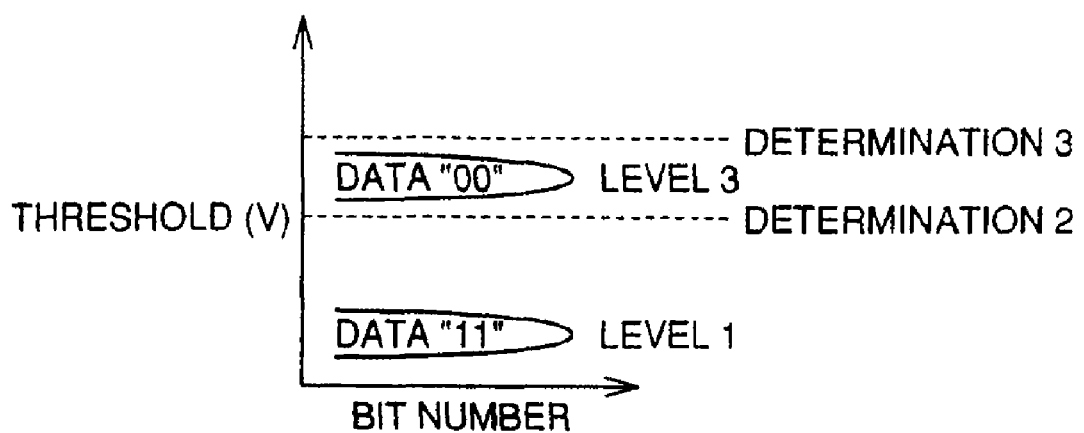
Figures 125, 126:
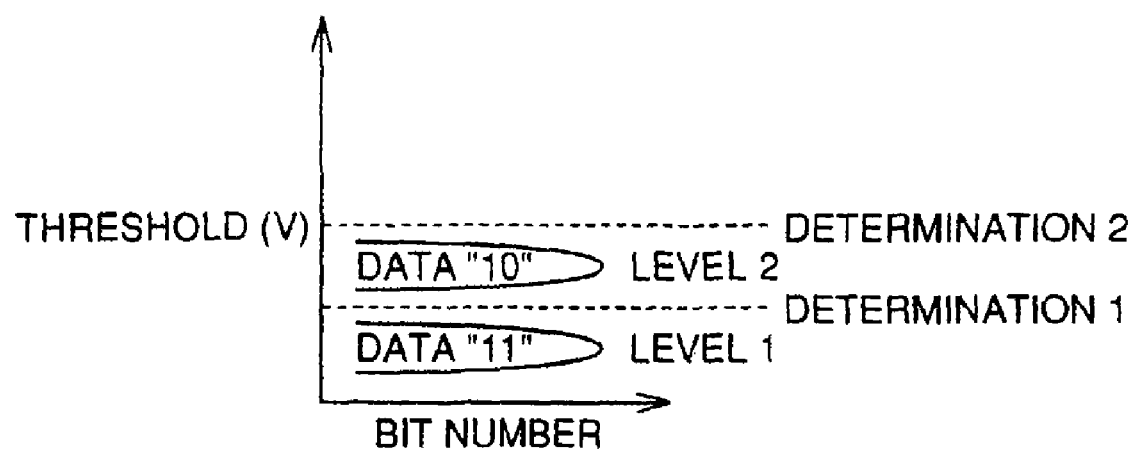
Figure 127:
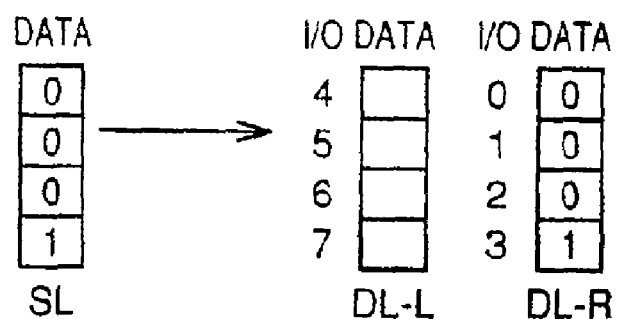
Figure 128:
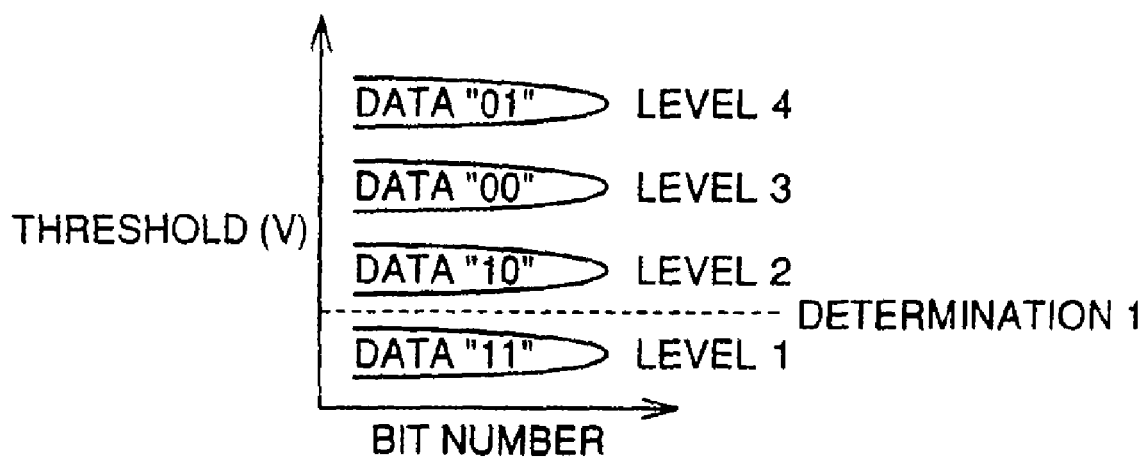
Figure 129:
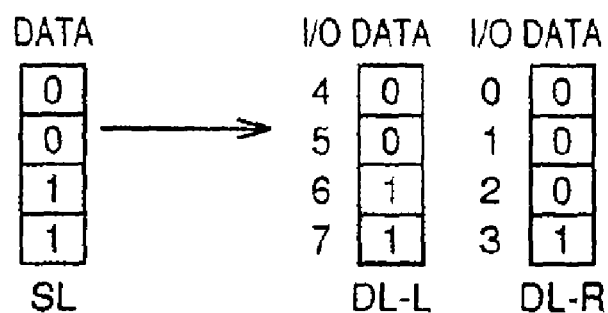
Figure 130:
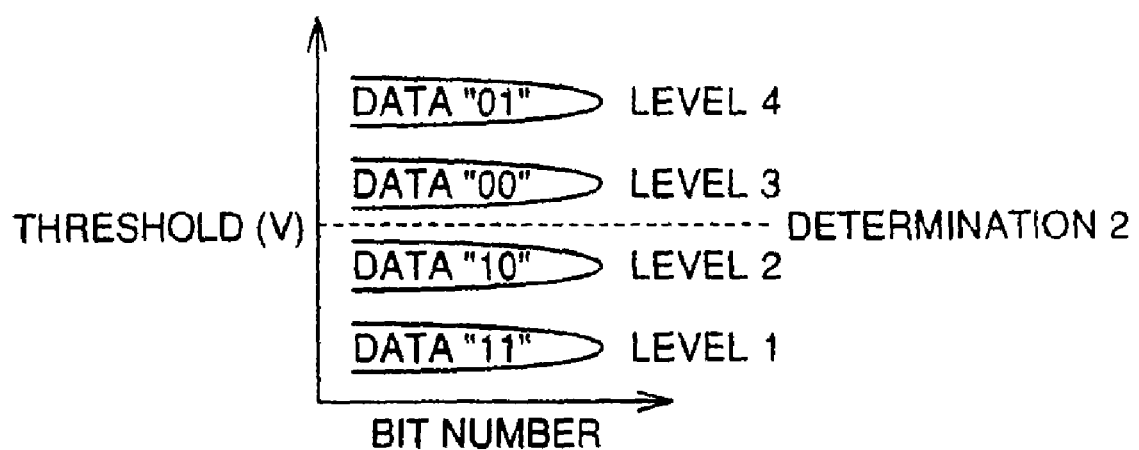
Figures 131, 132:
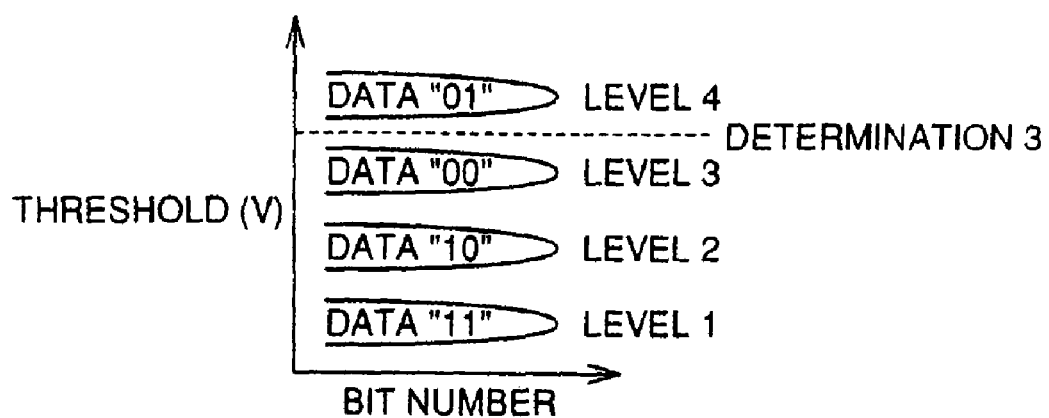

FIG. 116 shows data held in the respective latches in the fifteenth processing step of the write operation, and FIG. 117 shows thresholds of the memory cells and determination levels in the fifteenth processing step of the write operation.

The write data conversion circuit 230 performs an operation on a corresponding set of bit data as to data contained in the data latches DL-1 and DL-2 for zeroing only bit data of the sense latch SL corresponding to such data that bits held in the data latch DL-1 are "0" and bits held in the data latch DL-2 are "1".

Data are written in the memory cells MC0 to MC15 corresponding to the respective bits of the sense latch SL from level 3 to level 4 of the thresholds on the basis of the data held in the sense latch SL in the aforementioned manner while employing a determination level Vj3 for the verify voltage.

Then, writing in levels 6, 8, 10, 12, 14 and 16 is performed in a similar manner to the above.

In other words, writing is performed at a determination level identifiable in two values, and thereafter writing is performed at levels identifiable in four values, eight values, . . . , $2^n$ values in the respective processing steps. In each processing step, reading is performed by selecting two (one on upper or lower end) from determination levels employed for previous writing (when changed from four-valued processing levels to eight-valued processing levels, for example, three determination levels capable of determining four values) and bit data to be subjected to writing at the processing levels are defined for performing writing.

In a 16-valued flash memory according to a sixth embodiment of the present invention, as hereinabove described, data writing from memory cells holding 16-valued data can be performed while reducing the number of data latch circuits.

While data are written from the lower determination level in the above description, data writing may alternatively be performed from the higher determination level.

Similarly to writing in the four-valued memory cells in the fourth embodiment, writing up to level 5 and level 13 of the thresholds, writing up to level 7 and level 15, writing up to level 2 and level 10, writing at the level 4 and up to the level 12, writing up to level 6 and level 14 and writing up to level 8 and level 16 can be simultaneously performed. In such combinations, increased levels of the threshold voltages and level differences (threshold voltage differences) between the respective sets are equal to each other and hence similar sets of drain voltages can be employed.

While the above description has been made with reference to memory cells storing 16-valued data, the present invention is more generally applicable to memory cells storing $2^n$-valued data.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A nonvolatile semiconductor memory device comprising:

a memory cell array including a plurality of memory cells arranged in a plurality of rows and 2m columns, and 2m bit lines associated with said 2m columns, respectively, m being a natural number, wherein each memory cell has a threshold voltage set at any of first to fourth threshold value levels selectively to store any of four different data codes each including first data and second data, said first threshold value level is lower than a first determination level, said second threshold value level is higher than said first determination level and lower than a second determination level, said third threshold value level is higher than said second determination level and lower than a third determination level, and said fourth threshold value level is higher than said third determination level, said first to fourth threshold value levels correspond to said four data codes, respectively, rearranged by a procedure corresponding to i) a first step of dividing and rearranging said four data codes in two groups in accordance with whether each data code has said first data having a first logic or a second logic, and ii) a second step of rearranging two data codes of each of said groups in accordance with whether each data code has said second data having said first or second logic, said data codes corresponding to said first and second threshold value levels, respectively, have said first data of said first logic, and said data codes corresponding said third and fourth threshold value levels, respectively, have said first data of said second logic, in one of said groups of said data codes having said first data of said first logic, one of said data codes having said second data of said first logic corresponds to a threshold value level lower than the other of said data codes having said second data of said second logic does, in the other of said groups of said data codes having said first data of said second logic, one of said data codes having said second data of said first logic corresponds to a threshold value level higher than the other of said data codes having said second data of said second logic does, and said 2m bit lines are previously divided in m bit line groups each of two bit lines;

a cell selection circuit operative in response to an address signal to collectively select 2m of said memory cells of any of said plurality of rows of said memory cell array;

a data read circuit operative in accordance with said first to third determination levels to read 2m data codes from said 2m of said memory cells selected by said cell selection circuit; and a data output circuit outputting said first and second data of said 2m data codes read by said data read circuit externally from the nonvolatile semiconductor memory device through k output nodes by every k bits, k being a natural number, wherein said first and second data of each data code are output at different times, respectively, through a single one of said output nodes, wherein said data read circuit performs:
    a first step of reading in accordance with said second determination level said first data of a memory sell associated with one bit line of each said bit line group;
    a second step of providing said data output circuit with each said first data read in the first step;
    a third step of reading in accordance with said second determination level said first data of a memory sell associated with the other bit line of each said bit line group;
    a fourth step of providing said data output circuit with each said first data read in the third step;
    a fifth step of reading in accordance with said first and third determination levels said second data of a memory sell associated with said one bit line of each said bit line group;
    a sixth step of providing said data output circuit with each said second data read in the fifth step;
    a seventh step of reading in accordance with said first and third determination levels said second data of a memory sell associated with said other bit line of each said bit line group; and
    an eighth step of providing said data output circuit with each said second data read in the seventh step, wherein:
    the second and third steps are performed in parallel;
    the fourth and fifth steps are performed in parallel; and
    the sixth and seventh steps are performed in parallel.

2. A nonvolatile semiconductor memory device comprising:
a memory cell array including a plurality of memory cells arranged in a plurality of rows and 2m columns, and 2m bit lines associated with said 2m columns, respectively, m being a natural number, wherein each memory cell has a threshold voltage set at any of first to fourth threshold value levels selectively to store any of four different data codes each including first data and second data, said first threshold value level is lower than a first determination level, said second threshold value level is higher than said first determination level and lower than a second determination level, said third threshold value level is higher than said second determination level and lower than a third determination level, and said fourth threshold value level is higher than said third determination level, and said 2m bit lines are previously divided in m bit line groups each of two bit lines;

a cell selection circuit operative in response to an address signal to collectively select 2m of said memory cells of any of said plurality of rows of said memory cell array;

a data read circuit operative in accordance with said first to third determination levels to read 2m data codes from said 2m of said memory cells selected by said cell selection circuit; and a data output circuit outputting said first and second data of said 2m data codes read by said data read circuit externally from the nonvolatile semiconductor memory device through k output nodes by every k bits, k being a natural number, wherein said first and second data of each data code are output at different times, respectively, through a single one of said output nodes, wherein said data read circuit performs:
    a first step of reading said first data of each said memory sell associated with one bit line of each said bit line group;
    a second step of providing said data output circuit with each said first data read in the first step;
    a third step of reading said first data of each said memory sell associated with the other bit line of each said bit line group;
    a fourth step of providing said data output circuit with each said first data read in the third step;
    a fifth step of reading said second data of each said memory sell associated with said one bit line of each said bit line group;
    a sixth step of providing said data output circuit with each said second data read in the fifth step;
    a seventh step of reading said second data of each said memory sell associated with said other bit line of each said bit line group; and
    an eighth step of providing said data output circuit with each said second data read in the seventh step, wherein:
    the second and third steps are performed in parallel;
    the fourth and fifth steps are performed in parallel; and
    the sixth and seventh steps are performed in parallel.

* * * * *